(12) United States Patent
Kimura

(10) Patent No.: US 9,257,453 B2
(45) Date of Patent: Feb. 9, 2016

(54) DISPLAY DEVICE INCLUDING FIRST TO SIXTH TRANSISTORS AND LIGHT-EMITTING ELEMENT

(71) Applicant: Semiconductor Energy Laboratory Co., Ltd., Atsugi-shi, Kanagawa-ken (JP)

(72) Inventor: Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/148,239

(22) Filed: Jan. 6, 2014

(65) Prior Publication Data
US 2014/0117365 A1    May 1, 2014

Related U.S. Application Data

(60) Continuation of application No. 12/630,868, filed on Dec. 4, 2009, now Pat. No. 8,629,440, which is a division of application No. 11/341,673, filed on Jan. 30, 2006, now Pat. No. 7,646,019.

(30) Foreign Application Priority Data

Jan. 31, 2005    (JP) ................. 2005-024631

(51) Int. Cl.
*H01L 27/12*    (2006.01)
*G09G 3/32*    (2006.01)

(52) U.S. Cl.
CPC ............ *H01L 27/124* (2013.01); *G09G 3/3225* (2013.01); *G09G 2300/0852* (2013.01); *H01L 2924/0002* (2013.01)

(58) Field of Classification Search
CPC .... H01L 27/12; H01L 27/124; G09G 3/3225; G09G 2300/0852

USPC ................ 257/59, 72, 83, E33.064, E27.131, 257/E27.132
See application file for complete search history.

(56) References Cited

U.S. PATENT DOCUMENTS 4,902,638 A    2/1990  Muto
4,907,861 A    3/1990  Muto
(Continued)

FOREIGN PATENT DOCUMENTS

CN    1300105    6/2001
CN    1338655    3/2002
(Continued)

OTHER PUBLICATIONS

Kimura et al., "Analysis, Detection and Repair of Pixel Shorts in PM-OLEDs," IDW/AD '05, pp. 605-608.
(Continued)

*Primary Examiner* — Selim Ahmed
(74) *Attorney, Agent, or Firm* — Robinson Intellectual Property Law Office; Eric J. Robinson

(57) ABSTRACT

In view of the problem that a reduced thickness of an EL film causes a short circuit between an anode and a cathode and malfunction of a transistor, the invention provides a display device that has a light emitting element including an electrode and an electroluminescent layer, a wire electrically connected to the electrode of the light emitting element, a transistor provided with an active layer including a source, a drain and a channel forming region, and a power supply line electrically connected to one of the source and the drain of the transistor, wherein the wire is electrically connected to the other of the source and the drain of the transistor, and the width of a part of the electrode in the vicinity of a portion where the electrode is electrically connected to the wire is smaller than that of the electrode in the other portion.

10 Claims, 40 Drawing Sheets

(56) References Cited

U.S. PATENT DOCUMENTS

| | | |
|---|---|---|
| 5,102,361 A | 4/1992 | Katayama et al. |
| 5,633,311 A | 5/1997 | Yamamoto et al. |
| 6,437,341 B1 | 8/2002 | Izumi et al. |
| 6,583,576 B2 | 6/2003 | Koyama |
| 6,593,691 B2 | 7/2003 | Nishi et al. |
| 6,680,770 B1 | 1/2004 | Nagase |
| 6,710,825 B2 | 3/2004 | Kubo et al. |
| 6,778,233 B2 | 8/2004 | Matsuura et al. |
| 6,822,701 B1 | 11/2004 | Kasahara et al. |
| 6,828,952 B2 | 12/2004 | Jinno |
| 6,864,508 B2 | 3/2005 | Yamazaki et al. |
| 6,950,160 B2 | 9/2005 | Kubo et al. |
| 6,952,023 B2 | 10/2005 | Yamazaki et al. |
| 6,987,365 B2 | 1/2006 | Koyama |
| 7,129,644 B2 | 10/2006 | Koyama |
| 7,145,624 B2 | 12/2006 | Kubo et al. |
| 7,215,395 B2 | 5/2007 | Kubo et al. |
| 7,223,504 B2 | 5/2007 | Lee et al. |
| 7,265,390 B2 | 9/2007 | Yamazaki et al. |
| 7,330,222 B2 | 2/2008 | Shiraki et al. |
| 7,355,340 B2 | 4/2008 | Shitagaki et al. |
| 7,414,599 B2 * | 8/2008 | Chung et al. .................... 345/76 |
| 7,429,985 B2 | 9/2008 | Kimura et al. |
| 7,450,202 B2 | 11/2008 | Tsuchiya |
| 7,485,896 B2 | 2/2009 | Yamazaki et al. |
| 7,554,260 B2 | 6/2009 | Sakakura et al. |
| 7,566,902 B2 | 7/2009 | Nakashima et al. |
| 7,645,631 B2 | 1/2010 | Matsunaga |
| 8,487,841 B2 | 7/2013 | Kimura et al. |
| 2002/0031874 A1 | 3/2002 | Yamazaki et al. |
| 2002/0036744 A1 | 3/2002 | Kubo et al. |
| 2002/0119590 A1 | 8/2002 | Flewitt |
| 2002/0158576 A1* | 10/2002 | Yamada et al. ............... 313/505 |
| 2003/0025166 A1 | 2/2003 | Yamazaki et al. |
| 2003/0227021 A1 | 12/2003 | Yamazaki et al. |
| 2004/0003939 A1 | 1/2004 | Nishi et al. |
| 2004/0109122 A1* | 6/2004 | Kumagawa et al. .......... 349/143 |
| 2005/0014319 A1* | 1/2005 | Yamazaki et al. ............ 438/197 |
| 2005/0151146 A1 | 7/2005 | Lee et al. |
| 2005/0202602 A1 | 9/2005 | Asami et al. |
| 2005/0212445 A1 | 9/2005 | Lee |
| 2006/0050210 A1 | 3/2006 | Tsuchiya |
| 2006/0278874 A1 | 12/2006 | Kubo et al. |
| 2006/0286889 A1 | 12/2006 | Nishi et al. |
| 2011/0205144 A1 | 8/2011 | Kimura et al. |

FOREIGN PATENT DOCUMENTS

| | | |
|---|---|---|
| CN | 1505167 | 6/2004 |
| EP | 0 200 138 A | 12/1986 |
| EP | 0 380 265 A | 8/1990 |
| EP | 1 109 225 | 6/2001 |
| JP | 61-245136 A | 10/1986 |
| JP | 02-254422 A | 10/1990 |
| JP | 04-211292 A | 8/1992 |
| JP | 05-019294 | 1/1993 |
| JP | 05-100237 | 4/1993 |
| JP | 05-165055 A | 6/1993 |
| JP | 06-102536 A | 4/1994 |
| JP | 07-104311 A | 4/1995 |
| JP | 11-119250 | 4/1999 |
| JP | 2000-081639 A | 3/2000 |
| JP | 2000-081640 A | 3/2000 |
| JP | 2000-231121 | 8/2000 |
| JP | 2001-109396 A | 4/2001 |
| JP | 2001-237082 | 8/2001 |
| JP | 2001-305500 A | 10/2001 |
| JP | 2002-162914 | 6/2002 |
| JP | 2003-140567 A | 5/2003 |
| JP | 2003-223120 | 8/2003 |
| JP | 2003-249353 A | 9/2003 |
| JP | 2003-345307 A | 12/2003 |
| JP | 2004-006339 | 1/2004 |
| JP | 2005-004188 A | 1/2005 |
| JP | 2005-252228 | 9/2005 |
| WO | 2004/043937 | 5/2004 |
| WO | WO 2004/068446 | 8/2004 |

OTHER PUBLICATIONS

Office Action (Application No. 200610067345.4) dated Sep. 5, 2008.

Office Action (Application No. 200610067345.4) dated Feb. 27, 2009.

\* cited by examiner

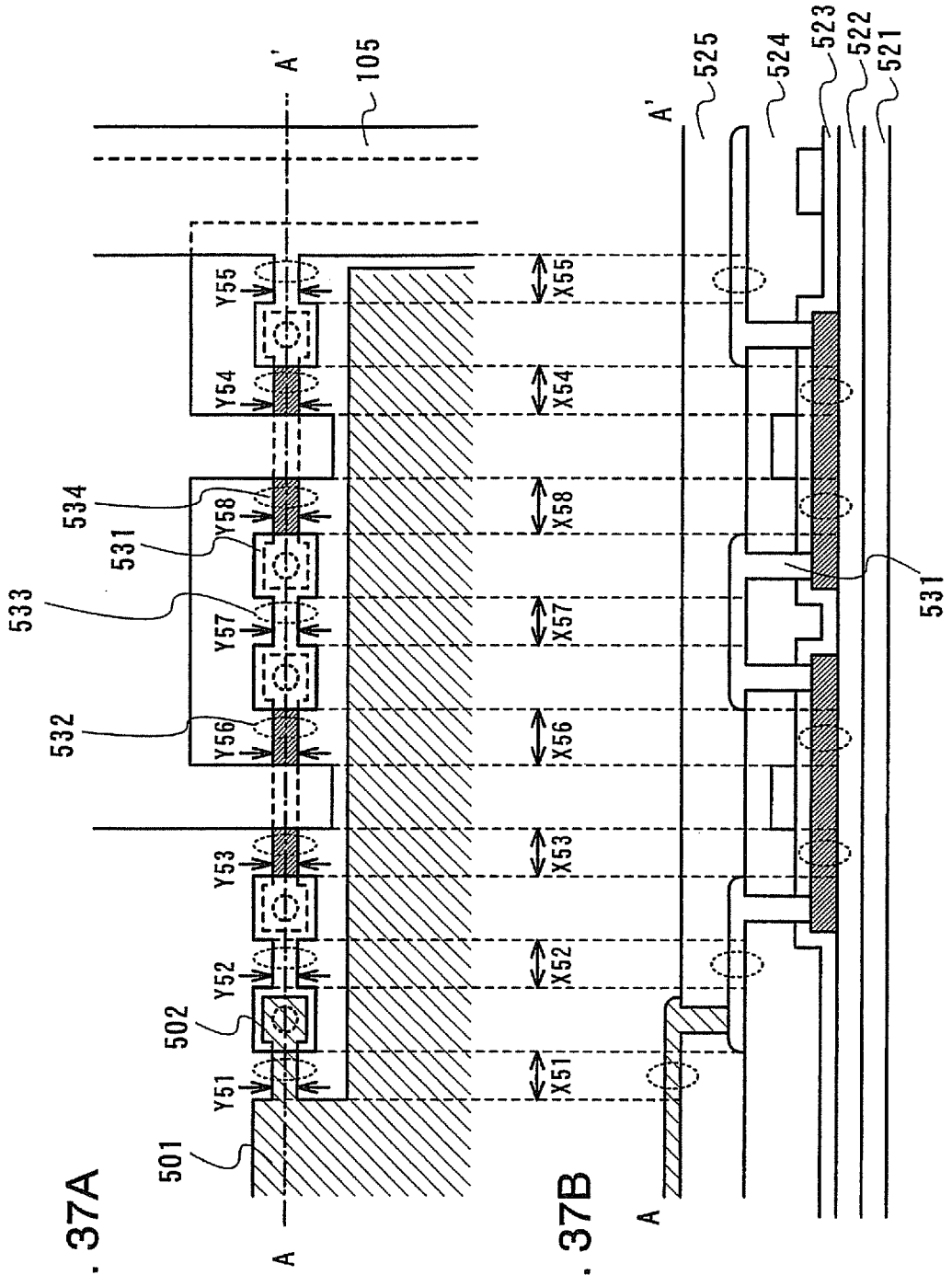

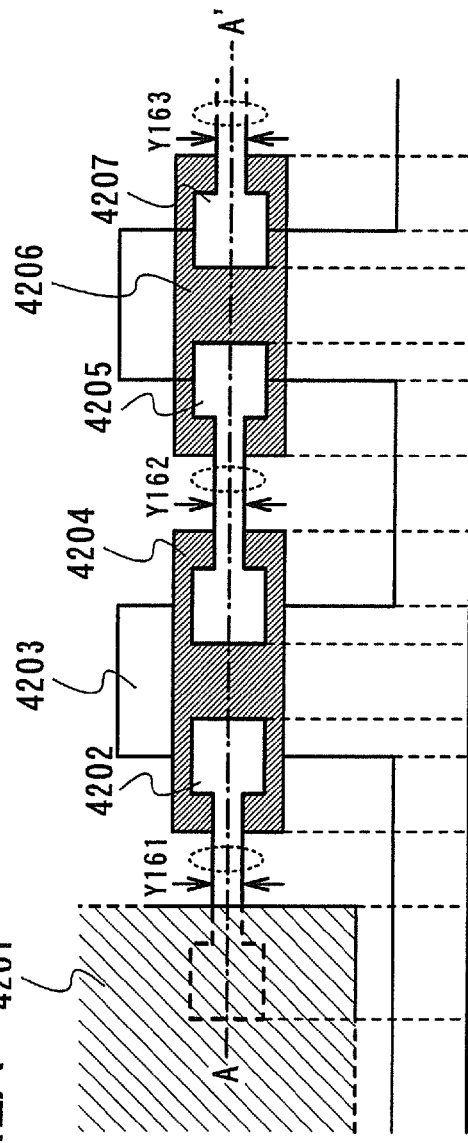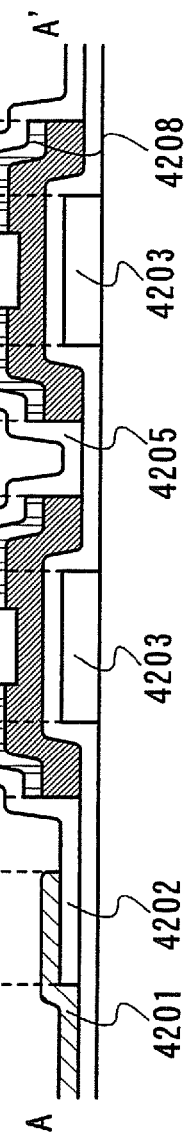
FIG. 42A
FIG. 42B

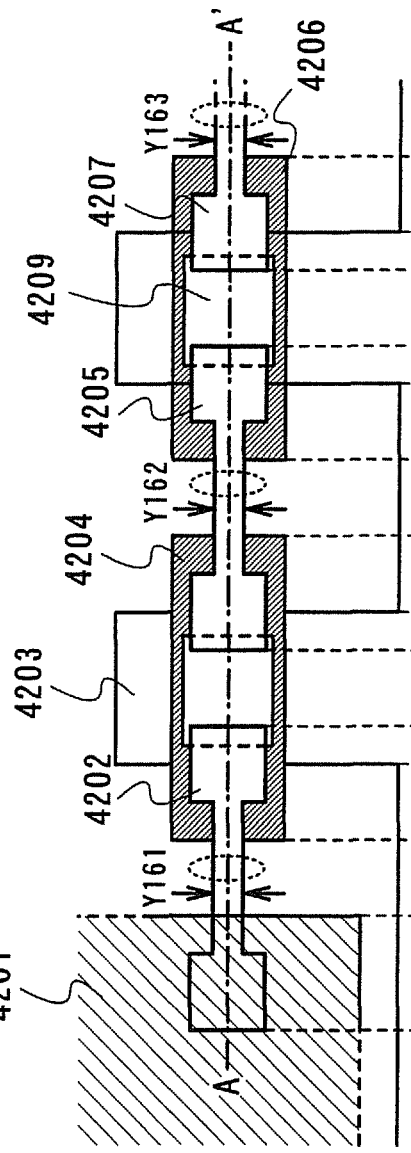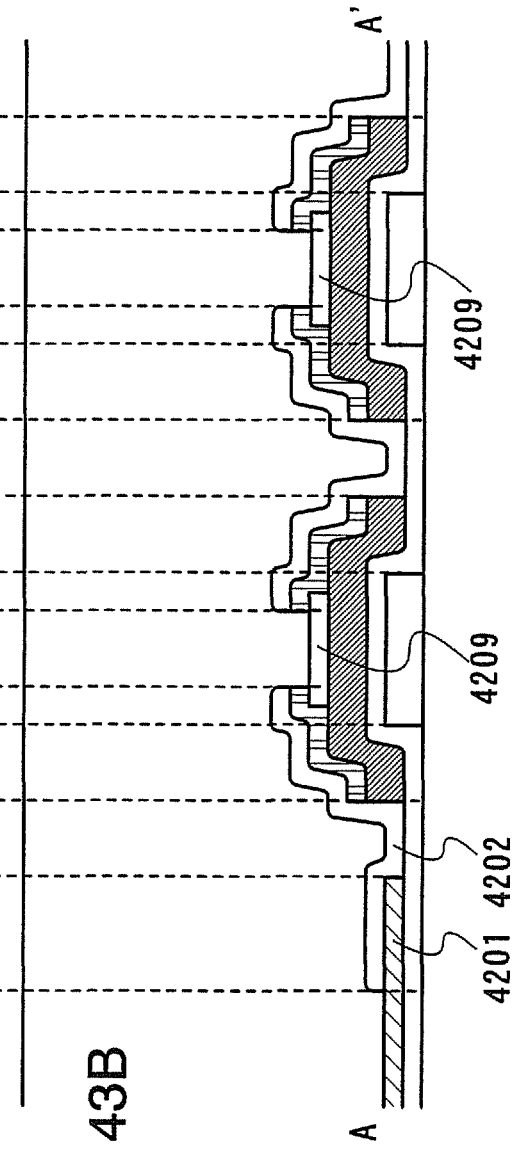
FIG. 43A
FIG. 43B

DISPLAY DEVICE INCLUDING FIRST TO SIXTH TRANSISTORS AND LIGHT-EMITTING ELEMENT

BACKGROUND OF THE INVENTION

1. Field of the Invention

The present invention relates to a method for correcting defective pixels in a display device having a self-light emitting element. In particular, the invention relates to a method for correcting defective pixels in an active matrix display device having an EL (Electroluminescence) element. The invention also relates to a display device having a structure capable of easily correcting defective pixels.

2. Description of the Related Art

In recent years, a light emitting device having a light emitting element typified by an EL element has been actively developed, and it is expected to be widely used by taking advantages of the self-luminous type such as high image quality, wide viewing angle, thin thickness, and lightweight. As a light emitting element used for such a self-light emitting display device, an organic light emitting diode (OLED) (also called an organic EL element), an electroluminescence (EL) element, and the like have been drawing attention and used for an EL display and the like. Since the light emitting element such as an OLED is a self-luminous type, it has advantages such as higher visibility of pixels than that in a liquid crystal display, and fast response without requiring a backlight. The luminance of a light emitting element is controlled by a current value flowing through the light emitting element.

An EL element has an electroluminescent layer (layer containing an organic compound) between a cathode and an anode. The electroluminescent layer (layer containing an organic compound) may be formed of a single layer (only a light emitting layer) or a plurality of stacked layers. If the electroluminescent layer is formed of a plurality of layers, the layers may be stacked in any of the following orders from a semiconductor element side (pixel electrode side): (1) an anode, a hole injection layer, a hole transporting layer, a light emitting layer, an electron transporting layer, and a cathode; (2) an anode, a hole injection layer, a light emitting layer, an electron transporting layer, and a cathode; (3) an anode, a hole injection layer, a hole transporting layer, a light emitting layer, an electron transporting layer, an electron injection layer, and a cathode; (4) an anode, a hole injection layer, a hole transporting layer, a light emitting layer, a hole blocking layer, an electron transporting layer, and a cathode; (5) an anode, a hole injection layer, a hole transporting layer, a light emitting layer, a hole blocking layer, an electron transporting layer, an electron injection layer, and a cathode. Such a structure is called a forward staggered structure, and a pixel electrode functions as an anode. On the other hand, a structure where a cathode is formed first on the semiconductor element side (pixel electrode side) is called an inversely staggered structure, and a pixel electrode functions as a cathode.

An electroluminescent layer is required to emit light and flow current. Current flowing through an electroluminescent layer decreases inversely proportional to the power 3 of the film thickness; therefore, it is necessary to considerably reduce the thickness of the electroluminescent layer.

When the thickness of an electroluminescent layer is considerably reduced, however, the following problems occur: a short circuit between an anode and a cathode (hereinafter referred to as a short circuit between two electrodes) easily occurs. This is caused by the thin thickness of the electroluminescent layer, unevenness of multilayer of an electrode, or fine dust. In addition, due to malfunction of a transistor connected to an EL element, charges are applied in some cases to the EL element during a period when no charge is to be applied, thereby the EL element may emit light. On the contrary, due to malfunction of a transistor connected to an EL element, charges cannot be applied to the EL element in some cases, thereby the EL element would emit no light all the time. Thus, in some cases, an excess current may flow to an electroluminescent layer of an EL element or an EL element may emit light during a period when no light is to be emitted, which results in a significant degradation in quality of a display device. Note that in this specification, among a plurality of pixels each having a light emitting element, a pixel where a light emitting element always emits light or no light or a light emitting element cannot be controlled properly due to a short circuit between two electrodes of the light emitting element, a short circuit between wires, a short circuit between an electrode of the light emitting element and a wire, or malfunction of a transistor connected to the light emitting element, is referred to as a defective pixel.

When a defective pixel is included, a short circuit causes a voltage drop, and it is thus difficult in some cases to apply a sufficient potential to other pixels from a power supply line connected to each pixel. That is to say, a light emitting element that always emits light adversely affects light emitting elements in other pixels as well as the defective pixel.

The case here considered is a liquid crystal display device that has been growing in the display device market in recent years. In the case of a liquid crystal display device, a liquid crystal element operates as a capacitor and holds an applied voltage, and liquid crystal molecules are controlled by an electric field generated by the applied voltage. In other words, current does not keep flowing to a liquid crystal element. Accordingly, even if a pixel electrode of a pixel is short circuited to another wire, other pixels are not adversely affected as current does not keep flowing.

In addition, in the case of a liquid crystal element, power consumption is not increased since current does not keep flowing. Further, in general, only one transistor is provided in each pixel; therefore, one transistor and one pixel electrode are only required to be corrected.

On the other hand, an EL element is a current-driven device, where current keeps flowing from a power supply line during a light emitting period. When a defect occurs in a pixel provided with an EL element having such properties, other normal pixels may be adversely affected and power consumption may be increased. In addition, at least two transistors are provided in a pixel, and a circuit including a portion for holding a signal, a portion for controlling the amount of current and the like has a complex configuration. Thus, it is difficult to determine which portion is corrected and how the portion is corrected.

Such problems do not occur in a liquid crystal display device and are unique to an electroluminescence display device where a power supply line is required and current keeps flowing.

It is a primary object of the invention to provide a display device with improved image quality by correcting a defective pixel, in particular defects in a pixel where a light emitting element always emits light or a light emitting element cannot be controlled properly due to a short circuit between two electrodes of the light emitting element, a short circuit between wires, a short circuit between an electrode of the light emitting element and a wire, or malfunction of a transistor connected to the light emitting element. It is another object of the invention to provide a display device having a structure capable of easily correcting defective pixels.

SUMMARY OF THE INVENTION

In a defective pixel, particularly in a pixel having a light emitting element that is not controlled properly and that always emits light, a potential is not applied to one electrode of the light emitting element all the time. For example, one electrode of the light emitting element is brought into a floating state.

According to a structure of the invention disclosed in this specification, at least a part of a wire between one electrode of a light emitting element and a wire (power supply line) for applying a potential to the one electrode of the light emitting element is cut off. That is to say, connection of a wire is physically cut off so that no current flows therethrough.

According to the aforementioned structure of the invention, the wire is cut off by laser irradiation. As a result, the current path from a power supply line to the light emitting element can be interrupted, thereby preventing the light emitting element from emitting light (preventing bright spots).

According to another structure of the invention disclosed in this specification, a transistor that is provided between a light emitting element and a power supply line for applying a potential to the light emitting element and connected to the light emitting element is kept off. For example, in a normally-off transistor (enhancement transistor), a gate and a source have the same potential. That is to say, electrical connection of a wire is interrupted so that no current flows to an EL element during a display period.

According to another structure of the invention disclosed in this specification, a part of a wire between a light emitting element and a power supply line for applying a potential to the light emitting element has a reduced width. Note that in this specification, "the width of a wire" means a distance in a direction perpendicular to the direction of current flowing through the wire. Similarly, in this specification, "the width of a power supply line" or "the width of an electrode" means a distance in a direction perpendicular to the direction of current flowing through the power supply line (or the electrode).

According to the aforementioned structure of the invention, the width of the part of the wire is reduced to 3 μm or less.

Another structure of the invention disclosed in this specification provides a method for correcting defects in a display device that has a plurality of pixels each including a light emitting element provided with an electrode and an electroluminescent layer and where at least one or more of the plurality of pixels are defective, wherein a wire connected to the electrode of the light emitting element provided in the defective pixel is cut off.

Another structure of the invention disclosed in the invention provides a method for correcting defects in a display device that has a plurality of pixels each including a transistor and a light emitting element provided with an electrode and an electroluminescent layer and where at least one or more of the plurality of pixels are defective, wherein one of a source and a drain of the transistor is connected to the electrode of the light emitting element through a wire, and the wire connected to the electrode of the light emitting element provided in the defective pixel is cut off.

Another structure of the invention disclosed in the invention provides a method for correcting defects in a display device that has a plurality of pixels each including a transistor and a light emitting element provided with an electrode and an electroluminescent layer and where at least one or more of the plurality of pixels are defective, wherein the transistor provided in the defective pixel is always off.

Another structure of the invention disclosed in this specification provides a method for correcting defects in a display device that has a plurality of pixels each including a P-channel transistor and a light emitting element provided with an electrode and an electroluminescent layer and where at least one or more of the plurality of pixels are defective, wherein one of a source and a drain of the transistor is connected to a power supply line, the other is connected to the electrode of the light emitting element through a wire, and a gate thereof is connected to a wire having a higher potential than the power supply line.

According to the aforementioned structure of the invention, the wire connected to the electrode of the light emitting element provided in the defective pixel is cut off by laser irradiation. In addition, according to the aforementioned structure of the invention, the light emitting element is driven by the transistor.

Another structure of the invention disclosed in this specification provides a display device that has a light emitting element including an electrode and an electroluminescent layer, a wire electrically connected to an electrode of the light emitting element, a transistor including an active layer provided with a source, a drain and a channel forming region, and a power supply line electrically connected to one of the source and the drain of the transistor, wherein the wire is electrically connected to the other of the source and the drain of the transistor, and the width of a part of the electrode in the vicinity of a portion where the electrode is electrically connected to the wire is smaller than that of the electrode in the other portion.

According to the aforementioned structure of the invention, the width of the part of the electrode is reduced to 3 μm or less. Further, the width of the part of the electrode is reduced to half or less than that of the electrode in the other portion. In addition, the width of the part of the electrode is smaller than the smallest width of wires used for a signal line driver circuit and a scan line driver circuit.

Another structure of the invention disclosed in this specification provides a display device that has a light emitting element including an electrode and an electroluminescent layer, a wire electrically connected to an electrode of the light emitting element, a transistor including an active layer provided with a source, a drain and a channel forming region, and a power supply line electrically connected to one of the source and the drain of the transistor, wherein the wire is electrically connected to the other of the source and the drain of the transistor, and the width of at least a part of the wire between a portion where the electrode is electrically connected to the wire and a portion where the wire is electrically connected to the other of the source and the drain of the transistor is smaller than that of the wire in the other portion.

According to the aforementioned structure of the invention, the width of the part of the wire is reduced to 3 μm or less. Further, the width of the part of the wire is reduced to half or less than that of the wire in the other portion. In addition, the width of the part of the wire is smaller than the smallest width of wires used for a signal line driver circuit and a scan line driver circuit.

Another structure of the invention disclosed in this specification provides a display device that has a light emitting element including an electrode and an electroluminescent layer, a wire electrically connected to an electrode of the light emitting element, a transistor including an active layer provided with a source, a drain and a channel forming region, and a power supply line electrically connected to one of the source and the drain of the transistor, wherein the wire is electrically connected to the other of the source and the drain of the transistor, and the width of a part of the power supply line in the vicinity of a portion where the power supply line is electrically connected to the one of the source and the drain of the transistor is smaller than that of the power supply line in the other portion.

According to the aforementioned structure of the invention, the width of the part of the power supply line is reduced to 3 μm or less. Further, the width of the part of the power supply line is reduced to half or less than that of the power supply line in the other portion. In addition, the width of the part of the power supply line is smaller than the smallest width of wires used for a signal line driver circuit and a scan line driver circuit.

Another structure of the invention disclosed in this specification provides a display device that has a light emitting element including an electrode and an electroluminescent layer, a wire electrically connected to an electrode of the light emitting element, a transistor including an active layer provided with a source, a drain and a channel forming region, a power supply line electrically connected to one of the source and the drain of the transistor, and a gate wire, wherein the wire is electrically connected to the other of the source and the drain of the transistor, the active layer partially overlaps the wire, the gate wire and the power supply line, and the width of a part of the active layer in a portion where the active layer does not overlap the wire, the gate wire and the power supply line is smaller than that of the active layer in the other portion.

According to the aforementioned structure of the invention, the width of the part of the active layer is reduced to 3 μm or less. Further, the width of the part of the active layer is reduced to half or less than that of the active layer in the other portion. In addition, the width of the part of the active layer is smaller than the smallest width of wires used for a signal line driver circuit and a scan line driver circuit.

According to the aforementioned structure of the invention, the active layer of the transistor is an amorphous semiconductor film or a crystalline semiconductor film. In addition, the transistor is a top gate transistor or a bottom gate transistor.

In this specification, the light emitting element may be any of an organic EL element, an inorganic EL element, and an element containing a mixture of an organic EL and an inorganic EL. Further, it is also possible to adopt a display medium such as an electron emitting element, where a contrast is changed by an electrical or magnetic effect. A display device using an electron emitting element includes a field emission display (FED), a surface-conduction electron-emitter display (SED), and the like.

In this specification, "connection" includes electrical connection. Accordingly, other elements, switches and the like may be disposed therebetween.

In the invention, the type of applicable transistor is not especially limited, and a thin film transistor (hereinafter referred to as a TFT) using a non-single crystalline semiconductor film typified by amorphous silicon and polycrystalline silicon, a MOS transistor using a semiconductor substrate or an SOI substrate, a junction transistor, a bipolar transistor, a transistor using an organic semiconductor or a carbon nanotube, and other transistors may be employed. Further, the type of substrate on which a transistor is disposed is not especially limited, and the transistor may be formed on a single crystalline substrate, an SOI substrate, a glass substrate, a plastic substrate or the like.

In this specification, "switches" may be electrical ones or mechanical ones as long as they can control current flow. The switches may be, for example, transistors, diodes, or logic circuits made of a combination thereof. If a transistor is used as a switch, the polarity (conductivity type) of the transistor is not particularly limited since it operates only as a switch. However, when an off-current is desirably small, it is desirable to use a transistor having a polarity with a small off-current. For example, a transistor having an LDD region, a multi-gate structure or the like has a small off-current. Further, when the potential of a source terminal of a transistor functioning as a switch is close to that of a low potential side power supply (Vss, Vgnd, 0 V and the like), an N-channel transistor is desirably used. On the other hand, when the potential of a source terminal of a transistor functioning as a switch is close to that of a high potential side power supply (Vdd and the like), a P-channel transistor is desirably used. This allows the transistor to operate efficiently as a switch because the absolute value of a gate-source voltage can be increased. In addition, a CMOS switch may be formed using both an N-channel transistor and a P-channel transistor.

As set forth above, any type of transistor may be used in the invention and a transistor may be formed over any type of substrate. Accordingly, all the circuits for driving a pixel may be formed over a glass substrate, a plastic substrate, a single crystalline substrate, an SOI substrate, or other substrates. Alternatively, a part of the circuits for driving a pixel may be formed over a first substrate, and the other part of the circuits may be formed over a second substrate that is different from the first substrate. In other words, not all the circuits for driving a pixel are required to be formed over the same substrate. For example, a pixel array and a gate line driver circuit may be formed over a glass substrate using TFTs, and a signal line driver circuit (or a part of it) may be formed over a single crystalline substrate. Further, the signal line driver circuit (IC chip) formed over a single crystalline substrate may be connected onto the glass substrate by COG (Chip On Glass), or the IC chip may be connected to the glass substrate by TAB (Tape Auto Bonding) or using a printed board.

In this specification, "a semiconductor device" means a device having a semiconductor element such as a transistor and a diode. A display device means a device having a display element such as a liquid crystal element and an EL element. A liquid crystal display device means a display device having a liquid crystal element. A light emitting device means a device having a light emitting element such as an EL element.

The invention may be applied to a display device adopting either a passive matrix driving method or an active matrix driving method.

According to the invention, defective pixels can be corrected properly only by adding a simple process, and it is possible to provide a display device with high display quality, where no bright spots are included and degradation in image quality of the entire screen is reduced. At the same time, the production yield of the display device can be increased, which results in significant reduction in cost.

When the invention is applied to a pixel where the light emitting element always emits light, among a plurality of pixels each including a light emitting element, the pixel displays black all the time. Accordingly, for example, a point defect cannot be corrected even when the invention is applied. However, a defective pixel is less visible when a pixel emits no light during a period when light emitting elements in all pixels are to emit light as compared to when a pixel emits light during a period when light emitting elements in all pixels are to emit no light. Thus, the invention can provide a display device with superior display quality and significantly reduced power consumption. In addition, a defective pixel does not adversely affect a pixel having a light emitting element that operates normally.

In a display device having the aforementioned structures, defective pixels can be easily corrected.

BRIEF DESCRIPTION OF THE DRAWINGS

FIGS. 37A and 37B are diagrams each showing Embodiment Mode 11 of the invention.

FIGS. 42A and 42B are diagrams each showing Embodiment Mode 16 of the invention.

FIGS. 43A and 43B are diagrams each showing Embodiment Mode 17 of the invention.

DETAILED DESCRIPTION OF THE INVENTION

Figure 1:
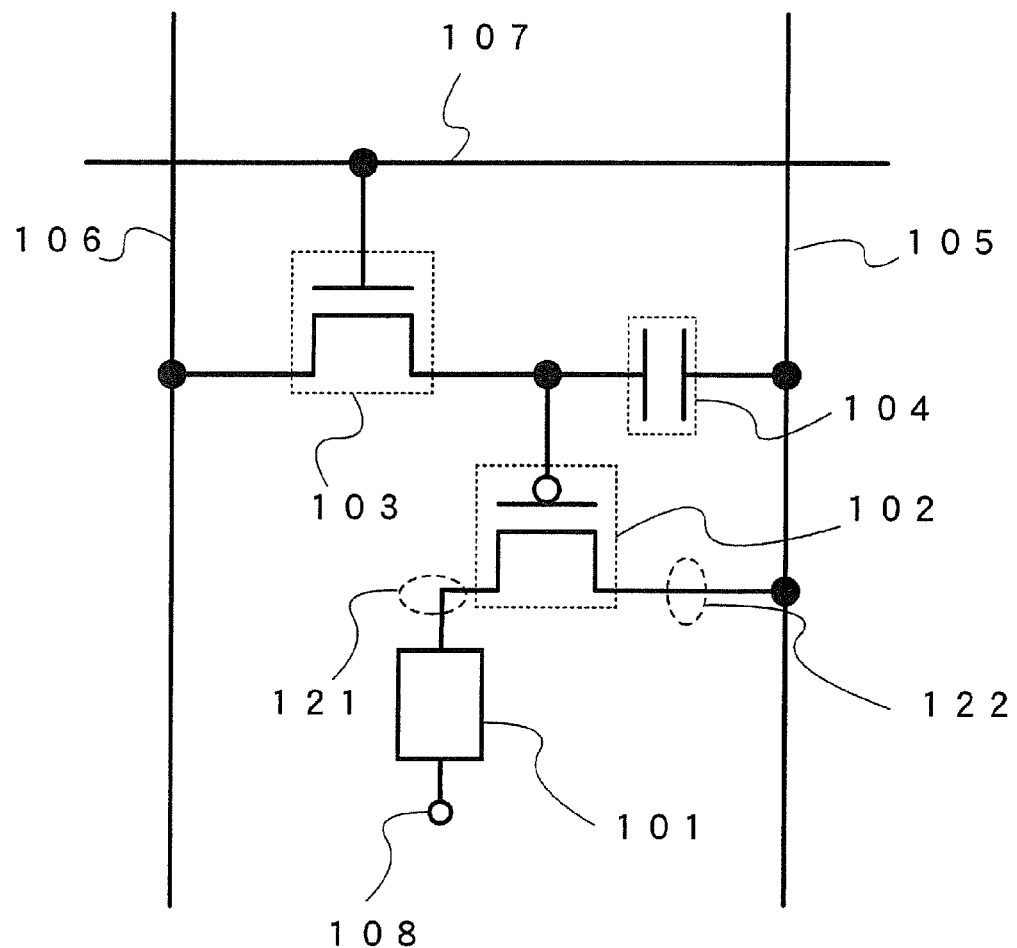
FIG. 1 is a diagram showing Embodiment Mode 1 of the invention.

Although the invention will be described by way of Embodiment Modes and Embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings for illustrating the invention, the identical portions or portions having the identical function are denoted by the identical reference numerals, and description thereof is omitted.

Embodiment Mode 1

In this embodiment mode, a method for cutting off at least a part of a wire between one electrode of a light emitting element and a power supply line for applying a potential to the one electrode of the light emitting element is described with reference to drawings.

Figure 11:
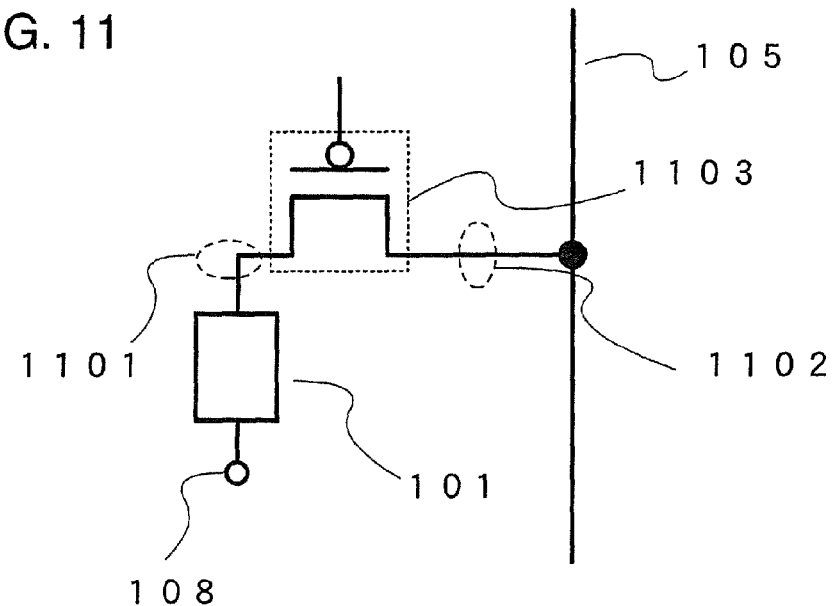
FIG. 11 is a diagram showing Embodiment Modes 1 and 4 of the invention.

Description is made with reference to FIG. 11. Each pixel has a light emitting element 101 and a transistor 1103. One of a source and a drain of the transistor 1103 is connected to a power supply line 105, and the other is connected to one electrode of the light emitting element 101.

A method for correcting defective pixels is described. If the power supply line 105 is connected to one electrode of the light emitting element 101 through the transistor 1103, a wire is cut off between the power supply line 105 and one of the source and the drain of the transistor 1103, or between the other of the source and the drain and one electrode of the light emitting element 101. For example, a portion 1101 or a portion 1102 shown as an ellipse in FIG. 11 is cut off. Note that although one portion is only required to be cut off, two or more portions may be cut off to increase reliability.

In this manner, in the case of a short circuit between two electrodes of the light emitting element, a short circuit between wires, a short circuit between an electrode of the light emitting element and a wire, or malfunction of the transistor connected to the light emitting element, the current path from the power supply line 105 to the other electrode 108 of the light emitting element 101 through the transistor 1103 and the light emitting element 101 can be interrupted by cutting off the portion 1101 or the portion 1102. As a result, the light emitting element 101 can be prevented from emitting light (bright spots can be prevented).

Although the transistor 1103 in FIG. 11 is a P-channel transistor, the invention is not limited to this. Even when the transistor 1103 is an N-channel transistor, the current path from the power supply line 105 to the other electrode 108 of the light emitting element 101 through the transistor 1103 and the light emitting element 101 can be interrupted by cutting off the portion 1101 or the portion 1102. Thus, the light emitting element 101 can be prevented from emitting light (bright spots can be prevented). Further, FIG. 11 shows a structure where the transistor 1103 is provided between the power supply line 105 and the light emitting element 101; however, another element may be provided instead of the transistor 1103. In addition, the invention can be implemented even when another element is provided between the power supply line 105 and the light emitting element 101 in addition to the transistor 1103.

Figure 12:
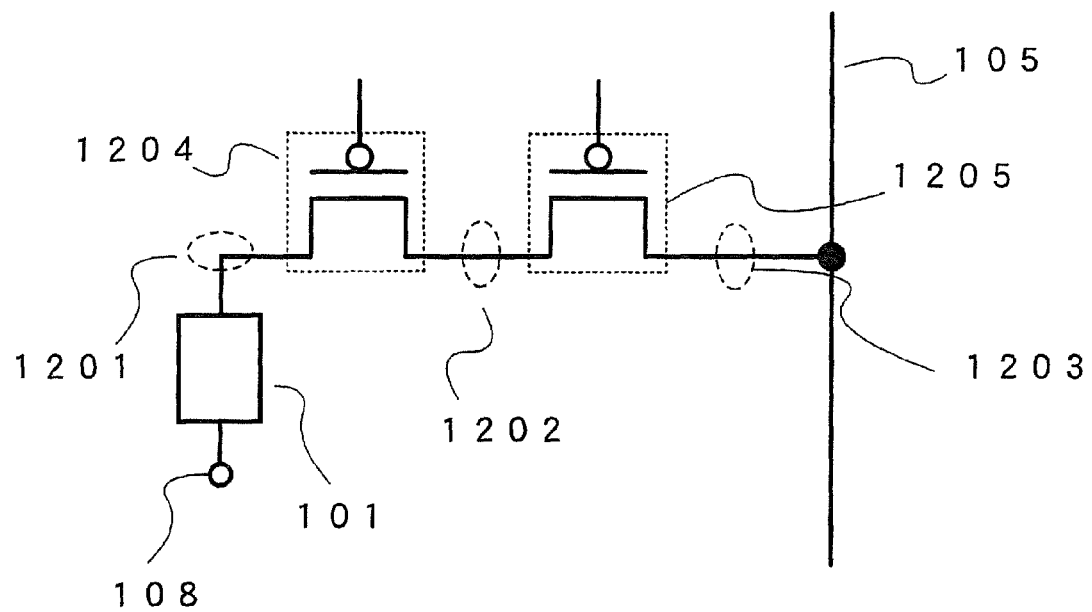
FIG. 12 is a diagram showing Embodiment Modes 1 and 4 of the invention.

Next, description is made with reference to FIG. 12. Each pixel has the light emitting element 101, a first transistor 1204 and a second transistor 1205. One of a source and a drain of the second transistor 1205 is connected to the power supply line 105 and the other is connected to one of a source and a drain of the first transistor 1204. The other of the source and the drain of the first transistor 1204 is connected to one electrode of the light emitting element 101. In other words, the power supply line 105 is connected to one electrode of the light emitting element 101 through the first transistor 1204 and the second transistor 1205 that are connected in series to each other.

A method for correcting defective pixels is described. A wire is cut off between the power supply line 105 and one of the source and the drain of the second transistor 1205, between the other of the source and the drain of the second transistor 1205 and one of the source and the drain of the first transistor 1204, or between the other of the source and the drain of the first transistor 1204 and one electrode of the light emitting element 101. For example, a portion 1201, a portion 1202, or a portion 1203 shown as an ellipse in FIG. 12 is cut off. Note that although one portion is only required to be cut off, two or more portions may be cut off to increase reliability.

In this manner, in the case of a short circuit between two electrodes of the light emitting element, a short circuit between wires, a short circuit between an electrode of the light emitting element and a wire, or malfunction of the transistor connected to the light emitting element, the current path from the power supply line 105 to the other electrode 108 of the light emitting element 101 through the second transistor 1205, the first transistor 1204 and the light emitting element 101 can be interrupted by cutting off the portion 1201, the portion 1202 or the portion 1203. As a result, the light emitting element 101 can be prevented from emitting light (bright spots can be prevented).

Although each of the first transistor 1204 and the second transistor 1205 in FIG. 12 is a P-channel transistor, the invention is not limited to this. Even when one or both of the first transistor 1204 and the second transistor 1205 are N-channel transistors, the current path from the power supply line 105 to the other electrode 108 of the light emitting element 101 through the second transistor 1205, the first transistor 1204 and the light emitting element 101 can be interrupted by cutting off the portion 1201, the portion 1202 or the portion 1203. Thus, the light emitting element 101 can be prevented from emitting light (bright spots can be prevented). That is to say, both of the first transistor 1204 and the second transistor 1205 may be P-channel transistors or N-channel transistors, or one of the two transistors may be a P-channel transistor while the other may be an N-channel transistor. Note that the two transistors are connected in series to each other in FIG. 12; however, the invention is not limited to this. Three or more transistors may be connected. In that case also, a wire may be cut off similarly to FIG. 12. Further, the invention can be implemented even when another element is provided between the power supply line 105 and the light emitting element 101 in addition to the first transistor 1204 and the second transistor 1205.

Figure 13:
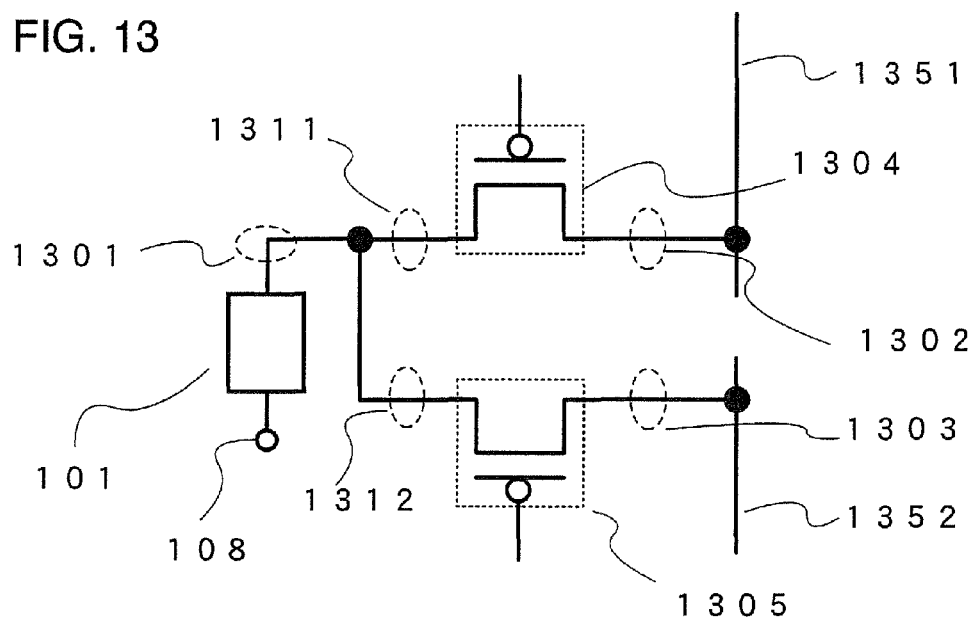
FIG. 13 is a diagram showing Embodiment Modes 1 and 4 of the invention.

Next, description is made with reference to FIG. 13. Each pixel has the light emitting element 101, a first transistor 1304 and a second transistor 1305. One of a source and a drain of the first transistor 1304 is connected to a wire 1351 and the other is connected to one electrode of the light emitting element 101. One of a source and a drain of the second transistor 1305 is connected to a wire 1352 and the other is connected to the one electrode of the light emitting element 101. Note that the wire 1351 and the wire 1352 may be connected to the same power supply or different power supplies.

A method for correcting defective pixels is described. A wire is cut off both between the wire 1351 and one of the source and the drain of the first transistor 1304 and between the wire 1352 and one of the source and the drain of the second transistor 1305. Alternatively, a wire is cut off between one electrode of the light emitting element 101 and a connecting portion between the other of the source and the drain of the first transistor 1304 and the other of the source and the drain of the second transistor 1305. For example, a portion 1301 shown as an ellipse in FIG. 13 is cut off, or one of portions 1302 and 1311 and one of portions 1303 and 1312 each shown as an ellipse in FIG. 13 are both cut off.

In this manner, in the case of a short circuit between the two electrodes of the light emitting element, a short circuit between wires, a short circuit between an electrode of the light emitting element and a wire, or malfunction of the transistor connected to the light emitting element, the current path from the wire 1351 and the wire 1352 to the other electrode 108 of the light emitting element 101 through each transistor and the light emitting element 101 can be interrupted by cutting off the portion 1301, or both of the portion 1302 and the portion 1303. As a result, the light emitting element 101 can be prevented from emitting light (bright spots can be prevented).

Although each of the first transistor 1304 and the second transistor 1305 in FIG. 13 is a P-channel transistor, the invention is not limited to this. Even when each of the first transistor 1304 and the second transistor 1305 is an N-channel transistor, the current path from the power supply line 105 to the other electrode 108 of the light emitting element 101 through each transistor and the light emitting element 101 can be interrupted by cutting off the portion 1301, or both of the portion 1302 and the portion 1303. Thus, the light emitting element 101 can be prevented from emitting light (bright spots can be prevented). That is to say, both of the first transistor 1304 and the second transistor 1305 may be P-channel transistors or N-channel transistors, or one of the two transistors may be a P-channel transistor while the other may be an N-channel transistor. Note that the two transistors are connected in parallel to each other in FIG. 13; however, the invention is not limited to this. Three or more transistors may be connected in parallel. In that case also, a wire may be cut off similarly to FIG. 13.

The wire 1351 and the wire 1352 may be connected to any element, for example, a power supply line, a circuit, a transistor, or a capacitor. Further, the wire 1351 and the wire 1352 may be connected to different elements or the same element. Instead, the wire 1351 and the wire 1352 may be an identical wire functioning as a power supply line.

Figure 15:
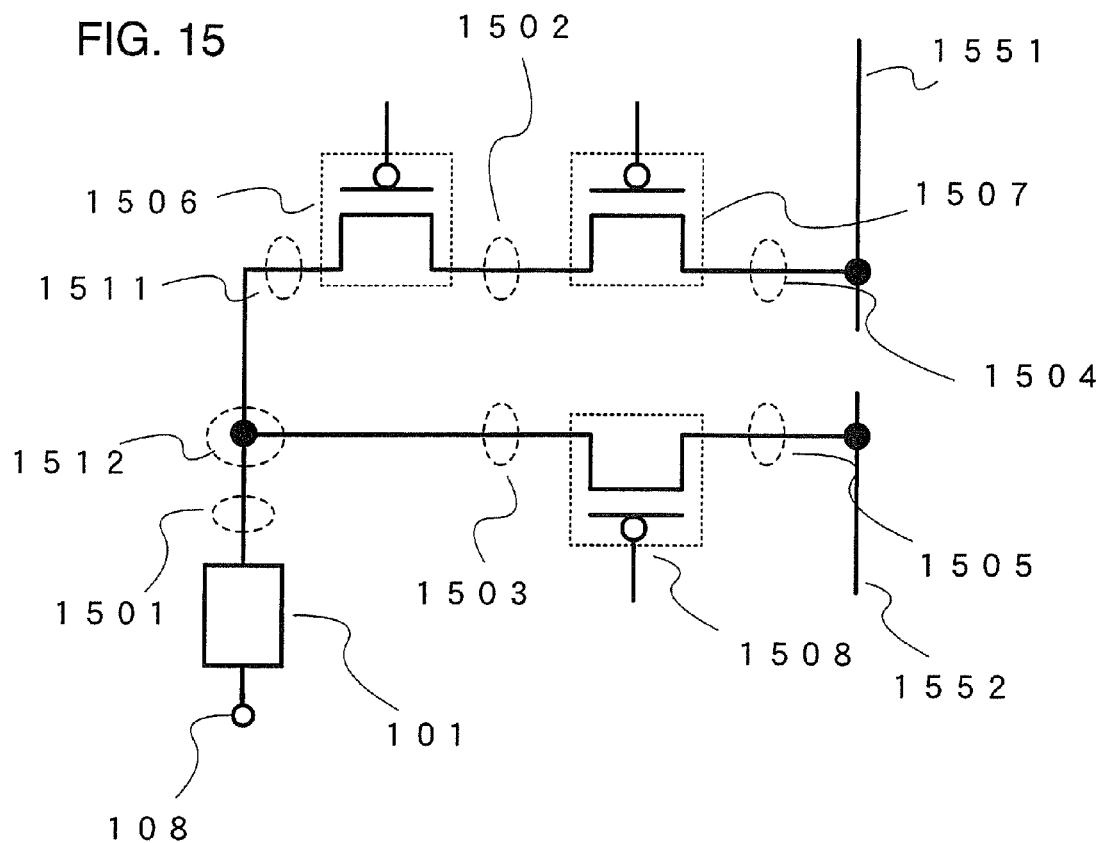
FIG. 15 is a diagram showing Embodiment Modes 1 and 4 of the invention.

The first transistor 1304 is not limited to one. For example, as shown in FIG. 15, another element such as a transistor may be connected in series to the first transistor 1304. Similarly, another element such as a transistor may be connected in series to the second transistor 1305.

Description is made with reference to FIG. 15. Each pixel has the light emitting element 101, a first transistor 1506, a second transistor 1507, and a third transistor 1508. One of a source and a drain of the second transistor 1507 is connected to a wire 1551, and the other is connected to one of a source and a drain of the first transistor 1506. One of a source and a drain of a third transistor 1508 is connected to a wire 1552, and the other is connected to one electrode of the light emitting element 101. The other of the source and the drain of the first transistor 1506 is connected to one electrode of the light emitting element 101. Note that the wire 1551 and the wire 1552 may be connected to the same power supply or different power supplies.

A method for correcting defective pixels is described. The current path from the wire 1551 to the other electrode 108 of the light emitting element 101 can be interrupted by cutting off at least one of a wire between a connecting portion between the wire 1551 and one of the source and the drain of the second transistor 1507 and the one of the source and the drain of the second transistor 1507, a wire between the other of the source and the drain of the second transistor 1507 and one of the source and the drain of the first transistor 1506, and a wire between a connecting portion between the other of the source and the drain of the first transistor 1506 and one electrode of the light emitting element 101 and the other of the source and the drain of the first transistor 1506. Further, the current path from the wire 1552 to the other electrode 108 of the light emitting element 101 can be interrupted by cutting off at least one of a wire between a connecting portion between the wire 1552 and one of the source and the drain of the third transistor 1508 and the one of the source and the drain of the third transistor 1508, and a wire between a connecting portion between the other of the source and the drain of the third transistor 1508 and one electrode of the light emitting element 101 and the other of the source and the drain of the third transistor 1508. For example, between the wires 1551 and 1552 and the one electrode of the light emitting element 101, a portion 1501 or a portion 1512 shown as an ellipse in FIG. 15 is cut off, or one of portions 1502, 1504 and 1511 and one of portions 1503 and 1505 each shown as an ellipse in FIG. 15 are both cut off.

In this manner, in the case of a short circuit between the two electrodes of the light emitting element, a short circuit between wires, a short circuit between an electrode of the light emitting element and a wire, or malfunction of the transistor connected to the light emitting element, the current path from the wire 1551 and the wire 1552 to the other electrode 108 of the light emitting element 101 through each transistor and the light emitting element 101 can be interrupted by cutting off the portion 1501, or both one of the portions 1502 and 1504 and one of the portions 1503 and 1505. As a result, the light emitting element 101 can be prevented from emitting light (bright spots can be prevented).

Although each of the first to third transistors 1506 to 1508 in FIG. 15 is a P-channel transistor, the invention is not limited to this. That is to say, regardless of the conductivity of the first to third transistors 1506 to 1508, the current path from the wire 1551 and the wire 1552 to the other electrode 108 of the light emitting element 101 through each transistor and the light emitting element 101 can be interrupted by cutting off the portion 1501, or both one of the portions 1502 and 1504 and one of the portions 1503 and 1505. As a result, the light emitting element 101 can be prevented from emitting light (bright spots can be prevented).

Figure 14:
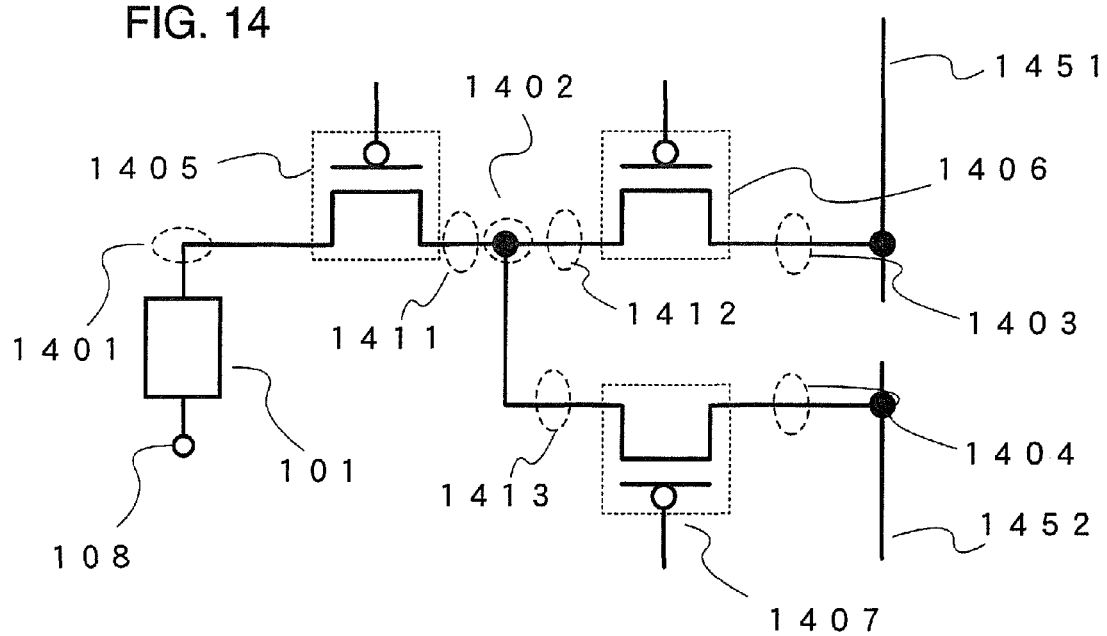
FIG. 14 is a diagram showing Embodiment Modes 1 and 4 of the invention.

Next, description is made with reference to FIG. 14. Each pixel has the light emitting element 101, a first transistor 1405, a second transistor 1406, and a third transistor 1407. One of a source and a drain of the second transistor 1406 is connected to a wire 1451, and the other is connected to one of a source and a drain of the first transistor 1405. One of a source and a drain of the third transistor 1407 is connected to a wire 1452, and the other is connected to one of the source and the drain of the first transistor 1405. The other of the source and the drain of the first transistor 1405 is connected to one electrode of the light emitting element 101. Note that the wire 1451 and the wire 1452 may be connected to the same power supply or different power supplies. Further, the wire 1451 and the wire 1452 may be an identical wire functioning as a power supply line.

A method for correcting defective pixels is described. A wire is cut off between one electrode of the light emitting element 101 and the other of the source and the drain of the first transistor 1405. Alternatively, a wire is cut off between one of the source and the drain of the first transistor 1405 and a connecting portion between the other of the source and the drain of the second transistor 1406 and the other of the source and the drain of the third transistor 1407. Further alternatively, a wire is cut off both between one of the source and the drain of the second transistor 1406 and the wire 1451 and between one of the source and the drain of the third transistor 1407 and the wire 1452. For example, between the wires 1451 and 1452 and one electrode of the light emitting element 101, a portion 1401, 1402 or 1411 shown as an ellipse in FIG. 14 is cut off, or one of portions 1403 and 1412 and one of portions 1404 and 1413 each shown as an ellipse in FIG. 14 are both cut off.

In this manner, in the case of a short circuit between the two electrodes of the light emitting element, a short circuit between wires, a short circuit between an electrode of the light emitting element and a wire, or malfunction of the transistor connected to the light emitting element, the current path from the wire 1451 and the wire 1452 to the other electrode 108 of the light emitting element 101 through each transistor and the light emitting element 101 can be interrupted by cutting off the portion 1401 or 1402, or both of the portion 1403 and the portion 1404. As a result, the light emitting element 101 can be prevented from emitting light (bright spots can be prevented).

Although each of the first to third transistors 1405 to 1407 in FIG. 14 is a P-channel transistor, the invention is not limited to this. That is to say, regardless of the conductivity of the first to third transistors 1405 to 1407, the current path from the wire 1451 and the wire 1452 to the other electrode 108 of the light emitting element 101 through each transistor and the light emitting element 101 can be interrupted by cutting off the portion 1401 or 1402, or both of the portion 1403 and the portion 1404. As a result, the light emitting element 101 can be prevented from emitting light (bright spots can be prevented). Note that another element such as a transistor may be connected in series between the wire 1451 and the first transistor 1405 in addition to the second transistor 1406, and another element such as a transistor may be connected in series between the wire 1452 and the first transistor 1405 in addition to the third transistor 1407. Further, another element such as a transistor may be connected in parallel to the second transistor 1406 and the third transistor 1407.

Embodiment Mode 2

Described in this embodiment mode is a method for cutting off a wire in at least one portion between one electrode of a light emitting element and a power supply line for applying a potential to the one electrode of the light emitting element.

FIG. 1 shows a structure example of a pixel in a pixel portion where pixels each having an EL element are arranged in matrix.

Each pixel has the light emitting element 101, a driving transistor 102, a switching transistor 103, and a capacitor 104. A gate electrode of the switching transistor 103 is connected to a gate signal line (scan line) 107, and one of a source and a drain of the switching transistor 103 is connected to a source signal line (data line) 106 while the other is connected to a gate electrode of the driving transistor 102 and one electrode of the capacitor 104.

The capacitor 104 is provided to hold a gate voltage of the driving transistor 102 (potential difference between the gate electrode and the source) when the switching transistor 103 is not selected (off state). Note that this embodiment mode shows a structure including the capacitor 104; however, the invention is not limited to this structure and the capacitor 104 is not necessarily provided. That is to say, the gate capacitance of the driving transistor 102 may be used instead of the capacitor 104. The gate capacitance of the driving transistor 102 may be formed in a portion where the gate electrode overlaps the source, the drain, an LDD region and the like, or between a channel forming region and the gate electrode.

One of the source and the drain of the driving transistor 102 is connected to the power supply line 105, and the other is connected to one electrode of the light emitting element 101. In this embodiment mode, the switching transistor 103 is a P-channel transistor, and the power supply line 105 has a higher potential than the other electrode 108 of the light emitting element 101. Accordingly, the source of the driving transistor 102 is connected to the power supply line 105 and the drain thereof is connected to one electrode of the light emitting element 101.

The power supply line 105 is connected to the other electrode of the capacitor 104. However, the invention is not limited to this structure, and for example, the other electrode of the capacitor 104 may be connected to a dedicated wire or a gate signal line of another pixel.

The light emitting element 101 includes a layer containing an organic compound, which is provided between an anode and a cathode. If the anode is connected to the source or the drain of the driving transistor 102, the anode functions as a pixel electrode while the cathode functions as an opposite electrode. Meanwhile, if the cathode is connected to the source or the drain of the driving transistor 102, the cathode functions as a pixel electrode while the anode functions as an opposite electrode. In this embodiment mode, it is assumed that the anode functions as a pixel electrode.

A layer containing an organic compound is formed by vapor deposition using a deposition mask, or ink jet printing. A metal complex belonging to group 4 of the periodic table of elements is used for a part of the layer containing an organic compound. Instead, a low molecular weight material or a high molecular weight material may be used in combination. As a layer containing an organic compound, a single layer or stacked layers are formed using an organic compound in many cases; however, an inorganic compound may be used for a part of a layer containing an organic compound. Further, a known triplet material as well as a singlet material may be used.

A low power supply potential (VSS) is applied to the other electrode 108 (opposite electrode (cathode)) of the light emitting element 101. Meanwhile, a high power supply potential (VDD) is applied to the power supply line. In this specification, a high power supply potential (VDD) has a relatively higher potential than a low power supply potential (VSS). A high power supply potential and a low power supply potential are applied by a power supply provided in a display device using an external IC or the like.

A method for correcting defective pixels is described.

At least one portion of a wire is cut off between the power supply line 105 and the anode of the light emitting element 101. For example, at least one of portions 121 and 122 (wire portions) each shown as an ellipse in FIG. 1 is cut off. For example, an active layer of the driving transistor 102 is cut off in the channel width direction. Accordingly, in the case of a short circuit between the two electrodes of the light emitting element, a short circuit between wires, a short circuit between an electrode of the light emitting element and a wire, or malfunction of the transistor connected to the light emitting element, the current path from the power supply line 105 to the other electrode 108 (cathode) of the light emitting element 101 through the driving transistor 102 and the light emitting element 101 can be interrupted by cutting off the portion 121 or 122. As a result, the light emitting element 101 can be prevented from emitting light (bright spots can be prevented).

The wire or the active layer may be cut off by a known method. For example, an interlayer insulating film on the wire or the active layer is removed by being irradiated with a laser beam with an appropriate wavelength. Then, the exposed wire or active layer is cut off by being irradiated with a laser beam with an appropriate wavelength. Note that irradiation conditions of laser such as the kind of laser, frequency, beam profile, energy density (or power density), and pulse width are not particularly limited. Further, either a pulsed laser beam or a continuous wave laser beam may be adopted. In addition, the side on which the light emitting element is provided (top of the substrate) may be irradiated with a laser beam or the opposite side (bottom of the substrate) may be irradiated with a laser beam. If the top of the substrate is irradiated with a laser beam, however, it is necessary that the laser beam transmits the other electrode 108 (cathode) of the light emitting element 101. Thus, the bottom of the substrate is desirably irradiated with a laser beam.

An ultraviolet (UV) laser is used in this embodiment mode; however, the kind of laser used in the invention is not particularly limited. A laser is constituted by a laser medium, an excitation source and a resonator. A laser is classified according to medium into a gas laser, a liquid laser and a solid laser, and classified according to the type of oscillation into a free electron laser, a semiconductor laser and an X-ray laser. Any type of laser may be adopted in the invention. A gas laser or a solid laser is preferably used, and more preferably, a solid laser is used.

A gas laser includes a helium-neon laser, a carbon dioxide laser, an excimer laser, and an argon ion laser. An excimer laser includes a rare gas excimer laser and a rare gas halide excimer laser. A rare gas excimer laser oscillates using any of three kinds of excited molecules: argon, krypton and xenon. An argon ion laser includes a rare gas ion laser and a metal vapor ion laser.

A liquid laser includes an inorganic liquid laser, an organic chelate laser and a pigment laser. In an inorganic liquid laser and an organic chelate laser, rare-earth ions such as neodymium, which are utilized for a solid laser, are used as a laser medium.

A laser medium used in a solid laser is a solid base doped with active species functioning as a laser. The solid base is crystal or glass. The crystal is YAG (yttrium aluminum garnet crystal), YLF, $YVO_4$, $YAlO_3$, sapphire, ruby, or alexandrite. The active species functioning as a laser are, for example, trivalent ions ($Cr^{3++}$, $Nd^{3+}$, $Yb^{3+}$, $Tm^{3+}$, $Ho^{3+}$, $Er^{3+}$, and $Ti^{3+}$).

If ceramic (polycrystal) is used as a medium, a medium with a desired shape can be formed in a short time and at low cost. The size of a medium using ceramic (polycrystal) can be larger than that of a medium using single crystal that is generally formed into a cylinder with a diameter of a few millimeters and a length of a few tens of millimeters. The concentration of dopant such as Nd and Yb in a medium, which directly contributes to light emission, cannot be changed much in both single crystal and polycrystal. Therefore, the output power of the laser is not increased much even though the concentration is increased. If using ceramic as a medium, however, the output power can be expected to be dramatically increased since the size of the medium can be made much larger than that using single crystal. Further, if using ceramic as a medium, a parallelepiped or rectangular parallelepiped medium can be easily obtained. When oscillating light zig-zags inside a medium having such a shape, the length of the oscillating light path can be increased. As a result, the amplification is increased and oscillation with large output power is achieved.

Although the driving transistor 102 is a P-channel transistor and the switching transistor 103 is an N-channel transistor in this embodiment mode, the invention is not limited to this and both of the driving transistor 102 and the switching transistor 103 may be either an N-channel transistor or a P-channel transistor. If the pixel electrode functions as the anode of the light emitting element 101 as shown in this embodiment mode, however, the driving transistor 102 is desirably a P-channel transistor. If the pixel electrode functions as the cathode of the light emitting element 101, the driving transistor 102 is desirably an N-channel transistor since a source potential of the driving transistor 102 does not change and the driving transistor 102 easily operates.

Each of the driving transistor 102 and the switching transistor 103 may have an active layer formed of an amorphous semiconductor film (typically, amorphous silicon), a polycrystalline semiconductor film (typically, polysilicon), or a single crystalline semiconductor film. If the driving transistor 102 is a P-channel transistor as in this embodiment mode, the active layer is desirably formed of a polycrystalline semiconductor film in view of the mobility. Meanwhile, if the driving transistor 102 is an N-channel transistor, the active layer is desirably formed of an amorphous semiconductor film.

Each of the driving transistor 102 and the switching transistor 103 may have either a forward staggered structure or an inversely staggered structure, and either a top gate structure or a bottom gate structure. Further, a gate electrode may be provided over or under a channel forming region.

Each of the driving transistor 102 and the switching transistor 103 may have either a single gate structure or a multi-gate structure. Further, each of the driving transistor 102 and the switching transistor 103 may have either an LDD structure or a GOLD structure.

This embodiment mode shows a structure where other transistors or elements are not provided between the driving transistor 102 and the power supply line 105. However, similarly to the structures of FIGS. 12 to 15 described in Embodiment Mode 1, the invention may be applied to a pixel structure where another transistor is provided between the power supply line and the anode in addition to the driving transistor 102. That is to say, by interrupting the current path between the anode and the power supply line drawn into a pixel, current supply to the light emitting element can be prevented so that the light emitting element emits no light, and a predetermined potential can be applied to other pixels.

Embodiment Mode 3

Described in this embodiment mode is another method for cutting off at least one portion of a wire between one electrode of a light emitting element and a power supply line for applying a potential to the one electrode of the light emitting element.

Figure 2:
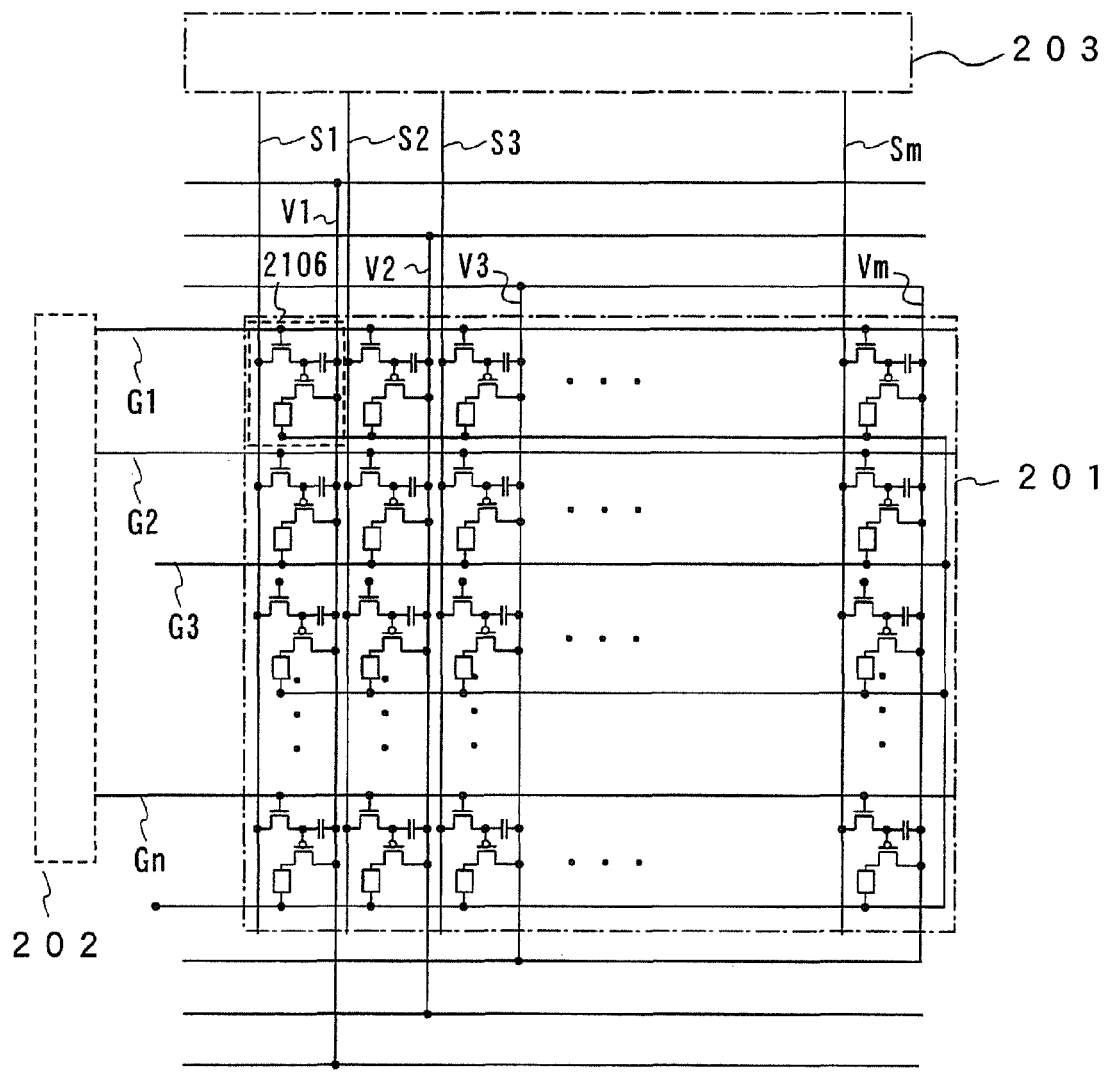
FIG. 2 is a diagram showing Embodiment Mode 3 of the invention.

FIG. 2 shows an example of a display device. Reference numeral 201 denotes a pixel portion, 202 denotes a scan line driver circuit (gate driver), and 203 denotes a signal line driver circuit (source driver). The scan line driver circuit 202 sequentially scans each row of the pixel portion 201 through scan lines G1 to Gn (n: positive integer). The signal line driver circuit 203 transmits a data signal to each column of the pixel portion 201 through signal lines S1 to Sm (m: positive integer). Power supply lines V1 to Vn for applying a potential to one electrode of a light emitting element in each pixel have a structure capable of applying a potential to each pixel from both the top and bottom sides. Note that the invention is not limited to the pixel structure shown in FIG. 2, and it is needless to say that pixel structures described in other embodiment modes may be adopted.

Figure 3:
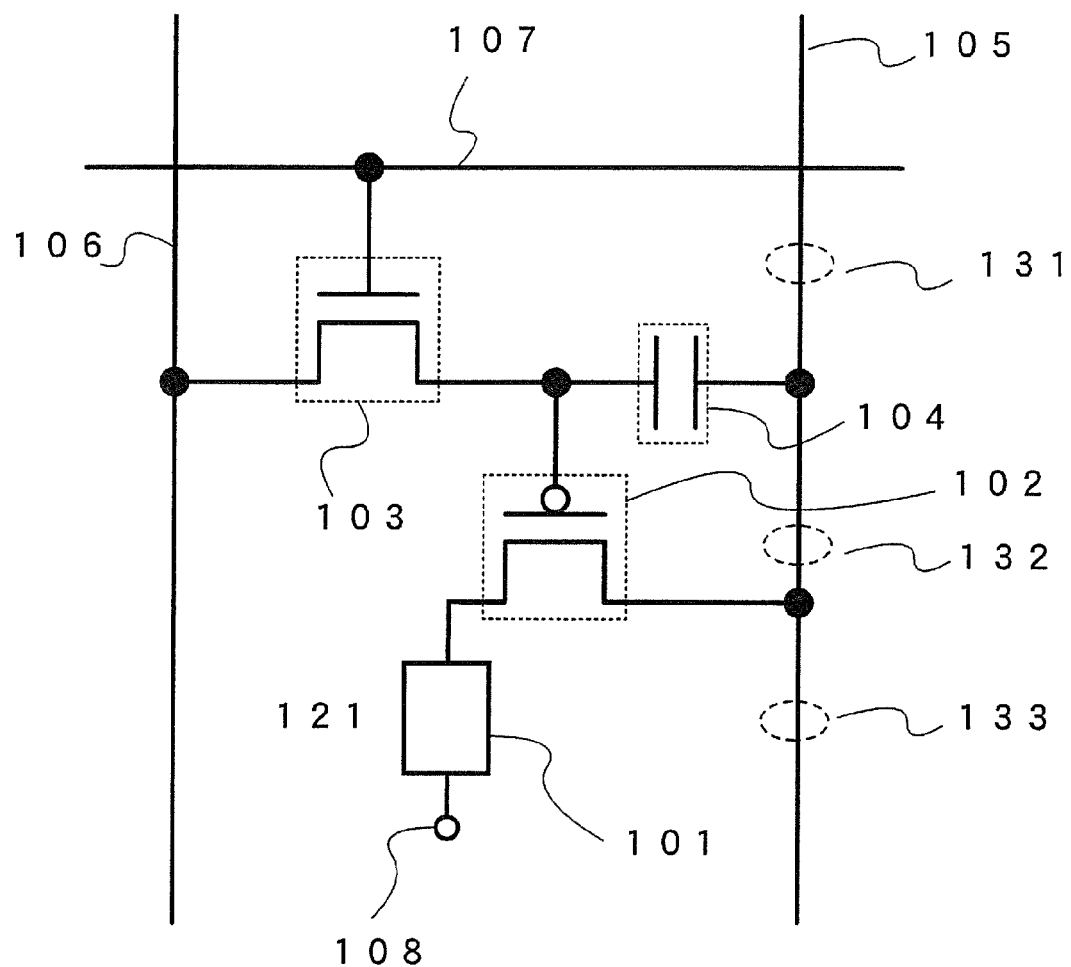
FIG. 3 is a diagram showing Embodiment Mode 3 of the invention.

A method for correcting defective pixels is described with reference to FIG. 3. The pixel shown in FIG. 3 has exactly the same structure as that shown in FIG. 1, and thus description of the connection relation and the like is omitted.

In order not to apply a potential from the power supply line to a defective pixel, two (or three) portions (at least one of portions 131 and 132 and a portion 133 in FIG. 3) of a path for applying a potential to the pixel are cut off.

After the defective pixel is corrected, a potential can be applied from the bottom side through the power supply line to pixels of rows below the row having the defective pixel, while a potential can be applied from the top side through the power supply line to pixels of rows above the row having the defective pixel. Thus, other pixels can operate normally.

The invention is not limited to the pixel structure shown in FIG. 2, and can be implemented regardless of the internal structure of pixel. That is to say, the invention can be applied to any pixel structure as long as a potential can be applied to each pixel from both the top and bottom sides through the power supply line 105.

Embodiment Mode 4

Described in this embodiment mode is a method for keeping a transistor off, which is provided between a light emitting element and a power supply line for applying a potential to the light emitting element and which is connected to the light emitting element.

In order to keep a transistor connected to a light emitting element off, a gate-source voltage Vgs of the transistor is controlled so that Vgs<Vth is satisfied in the case of an N-channel transistor while Vgs>Vth is satisfied in the case of a P-channel transistor. For example, when Vth>0 is satisfied in the case of an N-channel transistor or Vth<0 is satisfied in the case of a P-channel transistor, a gate and a source of the transistor are set at the same potential.

First, description is made on the case where the light emitting element 101 is connected to the power supply line 105 in the manner shown in FIG. 11. Reference numeral 1103 denotes a P-channel transistor.

In order to keep the P-channel transistor 1103 connected to the light emitting element off, a gate-source voltage Vgs of the P-channel transistor 1103 is controlled so that Vgs>Vth is satisfied. For example, when Vth<0 is satisfied, the gate and the source of the transistor are set at the same potential.

If one electrode of the light emitting element connected to the power supply line is an anode, the source is connected to the power supply line while the drain is connected to the anode. Accordingly, the gate and the source of the P-channel transistor 1103 can be set at the same potential when the power supply line 105 is short circuited to a gate wire of the P-channel transistor 1103. As a result, even when the two electrodes of the light emitting element 101 are short circuited, no current flows to the light emitting element 101 and a predetermined potential can be applied to other pixels.

As another example, a higher potential than the source may be applied to the gate of the P-channel transistor 1103 in order to keep the transistor connected to the light emitting element off. In other words, the gate wire of the P-channel transistor 1103 may be short circuited to a wire for applying a higher potential than the power supply line 105 that is connected to a high potential power supply.

If one electrode of the light emitting element connected to the power supply line is a cathode, the drain is connected to the power supply line while the source is connected to the cathode. Accordingly, the gate and the source of the P-channel transistor 1103 can be set at the same potential when the cathode of the light emitting element is short circuited to the gate wire of the P-channel transistor 1103. As a result, even when the two electrodes of the light emitting element 101 are short circuited, no current flows to the light emitting element 101 and a predetermined potential can be applied to other pixels.

As another example, a higher potential than the source may be applied to the gate of the P-channel transistor 1103 in order to keep the transistor connected to the light emitting element off. In other words, the gate wire of the P-channel transistor 1103 may be short circuited to a wire for applying a higher potential than the anode of the light emitting element that is connected to a high potential power supply.

FIG. 11 shows an example where the transistor 1103 is a P-channel transistor. The invention can be applied to the case where the transistor 1103 is an N-channel transistor, which is specifically described below.

If one electrode of the light emitting element connected to the power supply line is an anode, the source is connected to the one electrode of the light emitting element while the drain is connected to the power supply line. Accordingly, the gate and the source of the N-channel transistor 1103 can be set at the same potential when the one electrode of the light emitting element is short circuited to the gate wire of the N-channel transistor 1103. As a result, even when the two electrodes of the light emitting element 101 are short circuited, no current flows to the light emitting element 101 and a predetermined potential can be applied to other pixels.

As another example, a lower potential than the source may be applied to the gate of the N-channel transistor 1103 in order to keep the transistor connected to the light emitting element off. In other words, the gate wire of the N-channel transistor 1103 may be short circuited to a wire for applying a lower potential than the anode of the light emitting element.

If one electrode of the light emitting element connected to the power supply line is a cathode, the drain is connected to the cathode while the source is connected to the power supply line. Accordingly, the gate and the source of the N-channel transistor 1103 can be set at the same potential when the power supply line 105 is short circuited to the gate wire of the N-channel transistor 1103. As a result, even when the two electrodes of the light emitting element 101 are short circuited, no current flows to the light emitting element 101 and a predetermined potential can be applied to other pixels.

As another example, a lower potential than the source may be applied to the gate of the N-channel transistor 1103 in order to keep the transistor connected to the light emitting element off. In other words, the gate wire of the N-channel transistor 1103 may be short circuited to a wire for applying a lower potential than the power supply line that is connected to a low potential power supply.

Next, description is made on the case where the light emitting element 101 is connected to the power supply line 105 in the manner shown in FIG. 12. Each of reference numerals 1204 and 1205 denotes a P-channel transistor. Since the P-channel transistors 1204 and 1205 are connected in series, one of them is only required to be turned off. However, both of the P-channel transistors 1204 and 1205 may be turned off to increase reliability.

If one electrode of the light emitting element connected to the power supply line is an anode, the source is connected to the power supply line while the drain is connected to the anode. Accordingly, the first P-channel transistor 1204 or the second P-channel transistor 1205 can be turned off when the power supply line 105 is short circuited to a gate wire of the first P-channel transistor 1204 or to a gate wire of the second P-channel transistor 1205. Alternatively, a gate and a source of the first P-channel transistor 1204 may be short circuited so that the first P-channel transistor 1204 is turned off. As a result, no current flows to the light emitting element 101 even when the two electrodes of the light emitting element 101 are short circuited, thereby a predetermined potential can be applied to other pixels.

As another example, a higher potential than the source may be applied to the gate of the first P-channel transistor 1204 or the second P-channel transistor 1205 in order to keep the transistor connected to the light emitting element off. In other words, the gate wire of the first P-channel transistor 1204 or the second P-channel transistor 1205 may be short circuited to a wire for applying a higher potential than the power supply line 105 that is connected to a high potential power supply.

If one electrode of the light emitting element connected to the power supply line is a cathode, the drain is connected to the power supply line while the source is connected to the cathode. Accordingly, the first P-channel transistor 1204 or the second P-channel transistor 1205 can be turned off when the cathode of the light emitting element is short circuited to the gate wire of the first P-channel transistor 1204 or the second P-channel transistor 1205. Alternatively, the gate and the source of the second P-channel transistor 1205 may be short circuited so that the second P-channel transistor 1205 is turned off. As a result, even when the two electrodes of the light emitting element 101 are short circuited, no current flows to the light emitting element 101 and a predetermined potential can be applied to other pixels.

As another example, a higher potential than the source may be applied to the gate of the P-channel transistor in order to keep the transistor connected to the light emitting element off. In other words, the gate wire of the first P-channel transistor 1204 or the second P-channel transistor 1205 may be short circuited to a wire for applying a higher potential than the anode of the light emitting element that is connected to a high potential power supply.

Although FIG. 12 shows an example where each of the first transistor 1204 and the second transistor 1205 is a P-channel transistor, the invention is not limited to this. The invention can be applied to the case where each of the first transistor 1204 and the second transistor 1205 is an N-channel transistor, or only one of them is an N-channel transistor, which is specifically described below.

Description is made on the case where each of the first transistor 1204 and the second transistor 1205 is an N-channel transistor. Since the N-channel transistors 1204 and 1205 are connected in series, one of them is only required to be turned off. However, both of the N-channel transistors 1204 and 1205 may be turned off to increase reliability.

If one electrode of the light emitting element connected to the power supply line is an anode, the source is connected to the anode while the drain is connected to the power supply line. Accordingly, the first N-channel transistor 1204 or the second N-channel transistor 1205 can be turned off when the anode is short circuited to the gate wire of the first N-channel transistor 1204 or the second N-channel transistor 1205. Alternatively, the gate and the source of the second N-channel transistor 1205 may be short circuited so that the second N-channel transistor 1205 is turned off. As a result, even when the two electrodes of the light emitting element 101 are short circuited, no current flows to the light emitting element 101 and a predetermined potential can be applied to other pixels.

As another example, a lower potential than the source may be applied to the gate of the first N-channel transistor 1204 or the second N-channel transistor 1205 in order to keep the transistor connected to the light emitting element off. In other words, the gate wire of the first N-channel transistor 1204 or the second N-channel transistor 1205 may be short circuited to a wire for applying a lower potential than the anode.

If one electrode of the light emitting element connected to the power supply line is a cathode, the drain is connected to the cathode while the source is connected to the power supply line. Accordingly, the first N-channel transistor 1204 or the second N-channel transistor 1205 can be turned off when the power supply line is short circuited to the gate wire of the first N-channel transistor 1204 or the second N-channel transistor 1205. Alternatively, the gate and the source of the first N-channel transistor 1205 may be short circuited so that the first N-channel transistor 1205 is turned off. As a result, even when the two electrodes of the light emitting element 101 are short circuited, no current flows to the light emitting element 101 and a predetermined potential can be applied to other pixels.

As another example, a lower potential than the source may be applied to the gate of the N-channel transistor in order to keep the transistor connected to the light emitting element off. In other words, the gate wire of the first N-channel transistor 1204 or the second N-channel transistor 1205 may be short circuited to a wire for applying a lower potential than the power supply line that is connected to a low potential power supply.

Next, description is made on the case where one of the first transistor 1204 and the second transistor 1205 is an N-channel transistor.

Since a transistor connected to a light emitting element is required to be kept off as set forth above, at least one of the first transistor 1204 and the second transistor 1205 may be kept off in FIG. 12. The method for keeping a transistor off in the case where the first transistor 1204 is a P-channel transistor or an N-channel transistor is described above, and thus description thereof is omitted here. Similarly, the method for keeping a transistor off in the case where the second transistor 1205 is a P-channel transistor or an N-channel transistor is described above, and thus description thereof is omitted here.

Description is made on the case where the light emitting element 101 is connected to the power supply line in the manner shown in FIG. 13. Each of reference numerals 1304 and 1305 denotes a P-channel transistor.

If the potential of the other electrode 108 of the light emitting element is lower than those of a wire 1351 and a wire 1352 and one electrode of the light emitting element connected to a power supply line is an anode, a source is connected to the power supply line while a drain is connected to the anode. Accordingly, a gate and the source of the first P-channel transistor 1304, and a gate and the source of the second P-channel transistor 1305 can be set at the same potential when the wire 1351 is short circuited to a gate wire of the first P-channel transistor 1304 and the wire 1352 is short circuited to a gate wire of the second P-channel transistor 1305. As a result, even when the two electrodes of the light emitting element 101 are short circuited, no current flows to the light emitting element 101 and a predetermined potential can be applied to other pixels.

As another example, a higher potential than the source may be applied to the gate of the first P-channel transistor 1304 and the gate of the second P-channel transistor 1305 in order to keep the transistors connected to the light emitting element off. In other words, the gate wire of the first P-channel transistor 1304 may be short circuited to a wire for applying a higher potential than the wire 1351 that is connected to a high potential power supply, and the gate wire of the second P-channel transistor 1305 may be short circuited to a wire for applying a higher potential than the wire 1352 that is connected to a high potential power supply.

If one electrode of the light emitting element connected to the power supply line is a cathode, the drain is connected to the power supply line while the source is connected to the cathode. Accordingly, the gate and the source of the first and second P-channel transistors can be set at the same potential when the cathode of the light emitting element is short circuited to the gate wires of the first P-channel transistor 1304 and the second P-channel transistor 1305. As a result, even when the two electrodes of the light emitting element 101 are short circuited, no current flows to the light emitting element 101 and a predetermined potential can be applied to other pixels.

As another example, a higher potential than the source may be applied to the gate of the first P-channel transistor 1304 and the gate of the second P-channel transistor 1305 in order to keep the transistors connected to the light emitting element off. In other words, the gate wires of the first P-channel transistor 1304 and the second P-channel transistor 1305 may be short circuited to a wire for applying a higher potential than the anode of the light emitting element that is connected to a high potential power supply.

Although FIG. 13 shows the case where each of the first transistor 1304 and the second transistor 1305 is a P-channel transistor, the invention is not limited to this. The invention can be applied to the case where each of the first transistor 1304 and the second transistor 1305 is an N-channel transistor, or only one of them is an N-channel transistor.

Next, description is made on the case where the light emitting element 101 is connected to the power supply line in the manner shown in FIG. 14. Each of reference numerals 1405, 1406 and 1407 denotes a P-channel transistor.

If the potential of the other electrode 108 of the light emitting element is lower than those of a wire 1451 and a wire 1452 and one electrode of the light emitting element connected to the power supply line is an anode, a source is connected to the power supply line while a drain is connected to the anode. Accordingly, a gate and the source of the second P-channel transistor 1406, and a gate and the source of the third P-channel transistor 1407 can be set at the same potential when the wire 1451 is short circuited to a gate wire of the second P-channel transistor 1406 and the wire 1452 is short circuited to a gate wire of the third P-channel transistor 1407. Further, a gate and the source of the first P-channel transistor 1405 can be set at the same potential when a gate wire of the first P-channel transistor 1405 is short circuited to a wire for connecting the first P-channel transistor 1405 to the second and third P-channel transistors 1406 and 1407. Alternatively, the gate wire of the first P-channel transistor 1405 may be short circuited to the wire 1451 or the wire 1452. As a result, even when the two electrodes of the light emitting element 101 are short circuited, no current flows to the light emitting element 101 and a predetermined potential can be applied to other pixels.

As another example, a higher potential than the source may be applied to the gate of the second P-channel transistor 1406 and the gate of the third P-channel transistor 1407 in order to keep the transistors connected to the light emitting element off. In other words, the gate wire of the second P-channel transistor 1406 may be short circuited to a wire for applying a higher potential than the wire 1451 that is connected to a high potential power supply, and the gate wire of the third P-channel transistor 1407 may be short circuited to a wire for applying a higher potential than the wire 1452 that is connected to a high potential power supply. For example, if the potential of the wire 1452 is higher than that of the wire 1451, the wire 1452 may be short circuited to the gate wire of the second P-channel transistor 1406. Instead, a higher potential than the source may be applied to the gate of the first P-channel transistor 1405.

If one electrode of the light emitting element connected to the power supply line is a cathode, a drain is connected to the power supply line while a source is connected to the cathode. Accordingly, the gate and the source of the first P-channel transistor 1405 can be set at the same potential when the cathode of the light emitting element is short circuited to the gate wire of the first P-channel transistor 1405. Further, the gate and the source of the second P-channel transistor 1406 and the gate and the source of the third P-channel transistor 1407 can be set at the same potential when both the gate wire of the second P-channel transistor 1406 and the gate wire of the third P-channel transistor 1407 are short circuited to a wire for connecting the first P-channel transistor 1405 to the second and third P-channel transistors 1406 and 1407. Alternatively, the gate of the first P-channel transistor 1405 may be short circuited to the wire 1451 or the wire 1452 so that the first P-channel transistor 1405 is turned off. As a result, even when the two electrodes of the light emitting element 101 are short circuited, no current flows to the light emitting element 101 and a predetermined potential can be applied to other pixels.

As another example, a higher potential than the source may be applied to the gate of the second P-channel transistor 1406 and the gate of the third P-channel transistor 1407 in order to keep the transistors connected to the light emitting element off. Instead, a higher potential than the source may be applied to the gate of the first P-channel transistor 1405.

Although FIG. 14 shows the case where each of the first to third transistors 1405 to 1407 is a P-channel transistor, the invention is not limited to this. The invention can be applied to the case where each of the first to third transistors 1405 to 1407 is an N-channel transistor, or one or two of them are N-channel transistors.

Next, description is made on the case where the light emitting element 101 is connected to the power supply line in the manner shown in FIG. 15. Each of reference numerals 1506, 1507 and 1508 denotes a P-channel transistor.

If the potential of the other electrode 108 of the light emitting element is lower than those of a wire 1551 and a wire 1552 and one electrode of the light emitting element connected to the power supply line is an anode, a source is connected to the power supply line while a drain is connected to the anode. Accordingly, a gate and the source of the second P-channel transistor 1507, and a gate and the source of the third P-channel transistor 1508 can be set at the same potential when the wire 1551 is short circuited to a gate wire of the second P-channel transistor 1507 and the wire 1552 is short circuited to a gate wire of the third P-channel transistor 1508. Further, a gate and the source of the first P-channel transistor 1506 can be set at the same potential when a gate wire of the first P-channel transistor 1506 is short circuited to the wire 1551 or a wire for connecting the first P-channel transistor 1506 to the second P-channel transistor 1507. As a result, even when the two electrodes of the light emitting element 101 are short circuited, no current flows to the light emitting element 101 and a predetermined potential can be applied to other pixels.

As another example, a higher potential than the source may be applied to the gate of the first P-channel transistor 1506 or the second P-channel transistor 1507 and the gate of the third P-channel transistor 1508 in order to keep the transistors connected to the light emitting element off. In other words, the gate wire of the first P-channel transistor 1506 or the second P-channel transistor 1507 may be short circuited to a wire for applying a higher potential than the wire 1551 that is connected to a high potential power supply, and the gate wire of the third P-channel transistor 1508 may be short circuited to a wire for applying a higher potential than the wire 1552 that is connected to a high potential power supply.

If one electrode of the light emitting element connected to the power supply line is a cathode, a drain is connected to the power supply line while a source is connected to the cathode. Accordingly, the current path between the wire 1551 and the anode of the light emitting element 101 can be interrupted when the cathode of the light emitting element is short circuited to the gate wire of the first P-channel transistor 1506, or the gate wire of the second P-channel transistor 1507 is short circuited to a wire for connecting the first P-channel transistor 1506 to the second P-channel transistor 1507. Further, the current path between the wire 1552 and the anode of the light emitting element 101 can be interrupted when the cathode of the light emitting element is short circuited to the gate wire of the third P-channel transistor 1508. As a result, even when the two electrodes of the light emitting element 101 are short circuited, no current flows to the light emitting element 101 and a predetermined potential can be applied to other pixels.

As another example, a higher potential than the source may be applied to the gate of the first P-channel transistor 1506 or the gate of the second P-channel transistor 1507 and a higher potential than the source may be applied to the gate of the third P-channel transistor 1508, so that the transistors connected to the light emitting element are kept off.

Although FIG. 15 shows the case where each of the first to third transistors 1506 to 1508 is a P-channel transistor, the invention is not limited to this. The invention can be applied to the case where each of the first to third transistors 1506 to 1508 is an N-channel transistor, or one or two of them are N-channel transistors.

Described in this embodiment mode is a method for keeping a transistor connected to a light emitting element off. If there are a plurality of current paths for applying a potential to a light emitting element, the method described in this embodiment mode can be combined with the methods described in Embodiment Modes 1 and 2. For example, in FIG. 15, the current path connected to the wire 1551 may be interrupted by cutting off a portion 1502 or a portion 1504 by laser irradiation, while the current path connected to the wire 1552 may be interrupted by keeping the third transistor 1508 off by setting the gate and the source of the third transistor 1508 at the same potential.

Embodiment Mode 5

Figure 4:
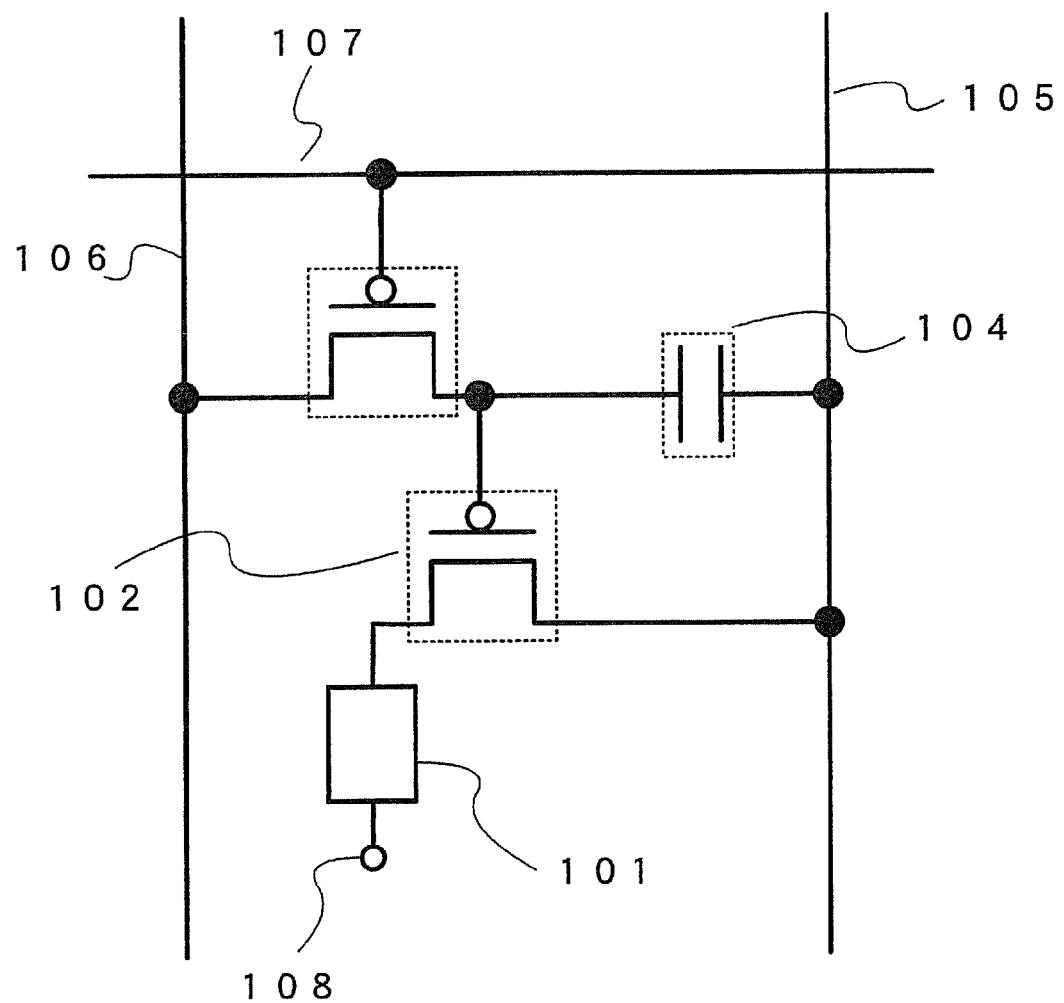
FIG. 4 is a diagram showing Embodiment Mode 5 of the invention.

Described in this embodiment mode is a method for keeping a transistor off, which is provided between a light emitting element and a power supply line for applying a potential to the light emitting element and which is connected to the light emitting element. Description is made with reference to FIG. 4 that is the same as FIG. 1, except in that the switching transistor 103 is a P-channel transistor. Thus, description of the connection relation and the like is omitted here.

As described in Embodiment Mode 1, the driving transistor 102 is a P-channel transistor, and one electrode of the light emitting element connected to the power supply line is an anode. That is to say, a source is connected to the power supply line while a drain is connected to the anode. Accordingly, more specifically, the gate and the source of the driving transistor 102 can be set at the same potential when the power supply line 105 is short circuited to the gate wire of the driving transistor 102. As a result, even when the two electrodes of the light emitting element 101 are short circuited, no current flows to the light emitting element 101 and a predetermined potential can be applied to other pixels. Note that the driving transistor 102 having the gate and the source that are at the same potential is desirably an enhancement transistor.

As another example, a higher potential than the source may be applied to the gate of the P-channel driving transistor 102 in order to keep the transistor connected to the light emitting element off. In other words, the gate wire of the driving transistor 102 may be short circuited to a wire for applying a higher potential than the power supply line 105 that is connected to a high potential power supply. This method is specifically described below.

Since the switching transistor 103 is a P-channel transistor in this embodiment mode, a Hi (High) signal is normally inputted to the gate signal line 107 connected to the gate of the switching transistor 103, so that the switching transistor 103 is turned off. Accordingly, the driving transistor 102 can be forcibly turned off when a higher potential than the power supply line 105 is applied to the gate signal line 107 and the gate signal line 107 is short circuited to the gate wire of the driving transistor 102.

The gate signal line 107 and the gate wire of the driving transistor 102 may be short circuited by a known method. For example, a portion where the gate signal line 107 overlaps the gate wire of the driving transistor 102 with an insulating film interposed therebetween is irradiated with a laser beam having an appropriate wavelength. The insulating film in this portion is destroyed by laser irradiation, thereby the gate signal line 107 can be connected to the gate wire of the driving transistor 102 in the vicinity of the portion irradiated with the laser beam. Note that irradiation conditions of laser such as the kind of laser, energy density and pulse width are not particularly limited. Further, either a pulsed laser beam or a continuous wave laser beam may be adopted. In addition, the side on which the light emitting element is provided (top of the substrate) may be irradiated with a laser beam or the opposite side (bottom of the substrate) may be irradiated with a laser beam. If the top of the substrate is irradiated with a laser beam, however, it is necessary that the laser beam transmits the cathode 108; therefore, the bottom of the substrate is desirably irradiated with a laser beam.

As described in Embodiment Mode 1 with reference to FIGS. 12 to 15, another transistor may be provided between the power supply line and the anode in addition to the driving transistor 102. In that case also, at least one of the transistors connected between the power supply line and the anode is kept off using the method shown in this embodiment mode, so that no current flows to one electrode of the light emitting element.

Although the driving transistor 102 is a P-channel transistor in this embodiment mode, this method can be applied to the case where the driving transistor 102 is an N-channel transistor.

Although the switching transistor 103 is a P-channel transistor in this embodiment mode, this method can be applied to the case where the switching transistor 103 is an N-channel transistor.

Embodiment Mode 6

Described in this embodiment mode is a structure of a pixel portion of a display device where defective pixels can be easily corrected.

Figure 5A:
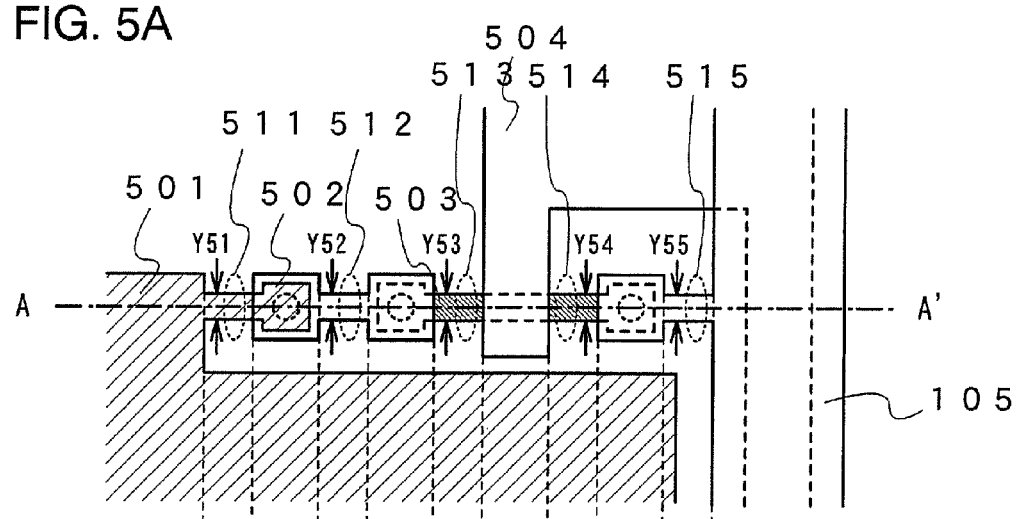
FIGS. 5A and 5B are diagrams each showing Embodiment Mode 6 of the invention.
Figure 5B:
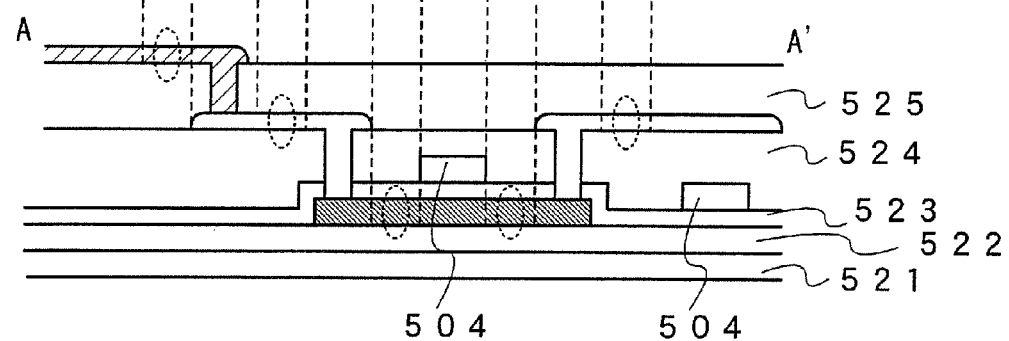
Figure 17:
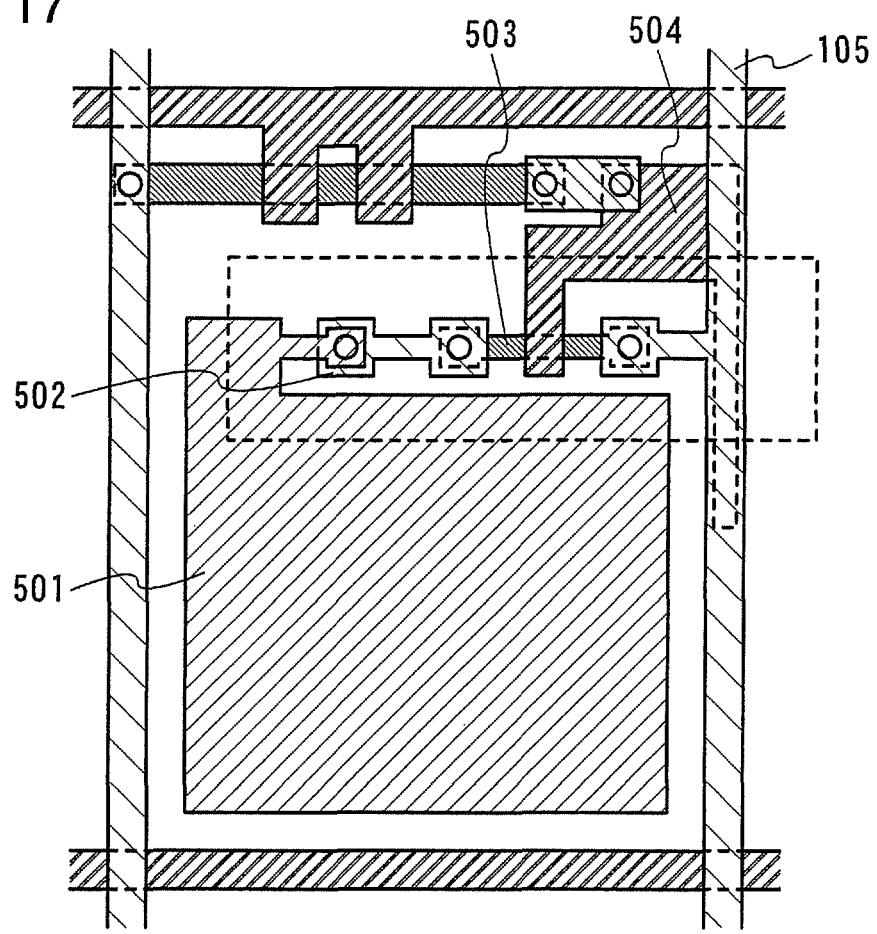
FIG. 17 is a diagram showing Embodiment Mode 5 of the invention.

FIG. 17 shows a layout example of one pixel. A magnified view of a portion surrounded by a dotted line in FIG. 17 is shown in FIG. 5A. FIG. 5B is a cross sectional view along a line A-A' of FIG. 5A. Note that an equivalent circuit of this pixel corresponds to FIG. 1.

In FIGS. 5A and 5B, reference numeral 501 denotes one electrode (anode) of a light emitting element, 502 denotes a wire, 503 denotes an active layer of the driving transistor 102, 504 denotes a gate wire also functioning as a gate electrode of the driving transistor 102, 521 denotes a substrate, 522 denotes a base film, 523 denotes a gate insulating film of the driving transistor 102, 524 denotes an interlayer insulating film, and 525 denotes an interlayer insulating film. These elements may be formed of known materials. Although the materials are specifically shown below, the invention is not limited to these.

The substrate 521 may be a glass substrate such as barium borosilicate glass and alumino borosilicate glass, a quartz substrate, a ceramic substrate, a substrate formed of a flexible synthetic resin such as plastic, or the like.

The base film 522 may have a single layer structure using any one of a silicon oxide film, a silicon nitride film, a silicon oxynitride film, and a silicon nitride oxide film, or a stacked layer structure of any of them. For example, as the base film 522, a silicon nitride oxide film and a silicon oxynitride film may be stacked in this order over the substrate 521. In that case, the base film 522 may be transparent and can transmit a laser beam. Accordingly, only a wire or a semiconductor layer formed over the base film can be cut off or wires can be short circuited. Note that in this specification, silicon oxynitride means a substance where the composition ratio of oxygen is higher than that of nitrogen, which can also be referred to as silicon oxide containing nitrogen. Meanwhile, in this specification, silicon nitride oxide means a substance where the composition ratio of nitrogen is higher than that of oxygen, which can also be referred to as silicon nitride containing oxygen.

The active layer 503 may be formed of an amorphous semiconductor film, a microcrystalline semiconductor film, a crystalline semiconductor film or the like. The material of the semiconductor film is not limited; however, silicon or silicon germanium (SiGe) is preferably used. The active layer 503 of the driving transistor 102 has at least a source, a drain and a channel forming region, and each of the source and the drain contains an impurity that imparts P-type conductivity. The active layer 503 may have a structure where a gate electrode overlaps an LDD region, a structure where a gate electrode does not overlap an LDD region, or an offset structure. For example, the driving transistor 102 preferably has a structure where a gate electrode overlaps an LDD region in each case of an N-channel transistor and a P-channel transistor. Meanwhile, the switching transistor 103 preferably has a structure where a gate electrode does not overlap an LDD region in each case of an N-channel transistor and a P-channel transistor.

The gate insulating film 523 may have a single layer structure using any one of a silicon oxide film, a silicon nitride film, a silicon oxynitride film, and a silicon nitride oxide film, or a stacked layer structure of any of them. For example, the gate insulating film 523 may have a single layer structure using a silicon oxide film, or a staked layer structure where a silicon oxynitride film and a silicon nitride oxide film are stacked in this order.

The gate wire 504 may be formed of a metal such as Al, Mo, Ti, Nd, and W, an alloy thereof, or a metal nitride thereof. The gate wire 504 may have a signal layer structure using any of these metals, or a stacked layer structure of any of them. In addition, a polysilicon film may be formed as a conductive film.

The interlayer insulating film 524 may have a single layer structure using any one of a silicon oxide film, a silicon nitride film, a silicon oxynitride film, and a silicon nitride oxide film, or a stacked layer structure of any of them. If the gate wire 504 is formed of molybdenum (Mo), a silicon nitride film is preferably used for the interlayer insulating film 524 that is in contact with the gate wire 504.

The wire 502 and the power supply line 105 are formed of a metal such as Ag, Au, Cu, Ni, Pt, Pd, Ir, Rh, W, Al, Ta, Mo, Cd, Zn, Fe, Ti, Zr, Ba, and Nd, an alloy thereof, or a metal nitride thereof. Alternatively, a semiconductor material such as Si and Ge may be employed. Each of the wire 502 and the power supply line 105 may have a stacked layer structure of these materials. Note that a metal material with a low melting point is suitable for the wire 502 and the power supply line 105 in the invention, since the wire 502 and the power supply line 105 can be easily cut off by laser irradiation in subsequent steps.

Figure 16A:
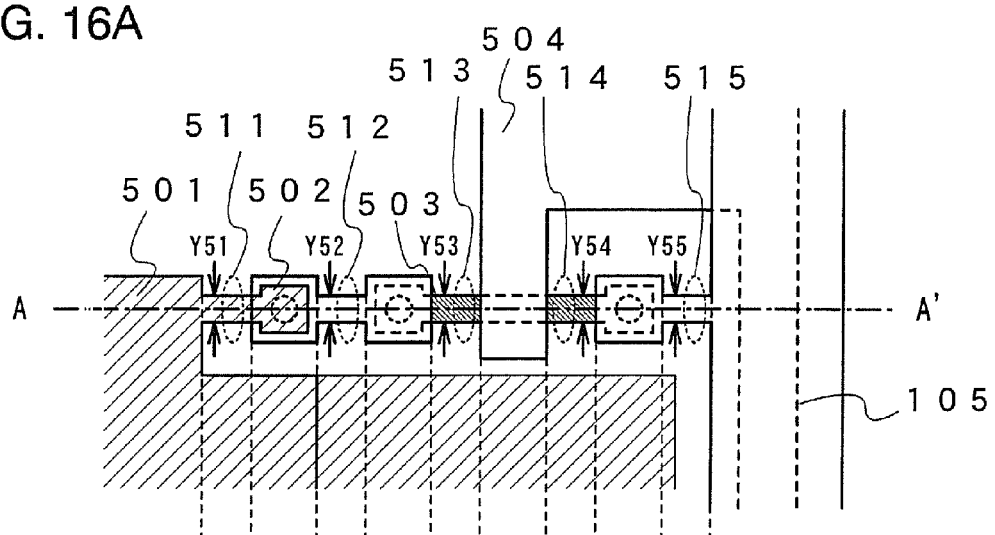
FIGS. 16A and 16B are diagrams each showing Embodiment Mode 5 of the invention.
Figure 16B:
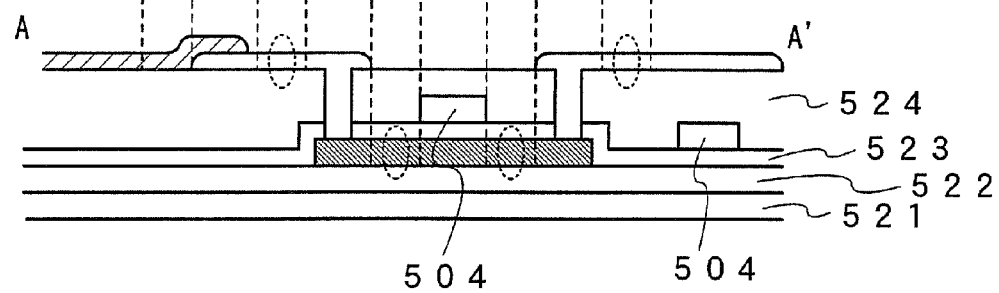

The interlayer insulating film 525 may be formed of an inorganic insulating material such as silicon oxide, silicon nitride, silicon oxynitride, aluminum oxide, aluminum nitride, and aluminum oxynitride; acrylic acid, methacrylic acid, and a derivative thereof; a heat resistance polymer such as polyimide, aromatic polyamide, and polybenzimidazole; inorganic siloxane including a Si—O—Si bond, among compounds formed of silicon, oxygen and hydrogen using a siloxane-based material as a start material; or an organic siloxane-based insulating material in which hydrogen bonded to silicon is substituted by an organic group such as a methyl group and a phenyl group. The interlayer insulating film 525 may also be formed of a photosensitive or non-photosensitive material such as acrylic and polyimide, or formed by stacking these materials. It is also possible to adopt a structure shown in FIG. 16, where the interlayer insulating film 525 is not provided and the one electrode 501 of the light emitting element is connected directly to the wire 502 without through a contact hole.

A structure of a display device in this embodiment mode is described.

Since the power supply line 105 is connected to the driving transistor 102 through a contact hole, a part of the power supply line 105 has a projecting portion for each pixel (row). In the portion where a part of the power supply line projects, the width of a part of the power supply line is reduced (portion 515 in FIG. 5). In that case, the longitudinal width (Y55) of the power supply line 105 in the portion 515 is preferably 3 µm or less. In addition, the horizontal width (X55) of the power supply line 105 in the portion 515 is preferably 4 µm or more. As a result, only a portion required for correcting defects can be cut off in view of the size and shape of a cross sectional surface (spot) of a laser shot, and thus the power supply line 105 itself can be prevented from being broken and adversely affecting other pixels. Further, other wires can also be prevented from being short circuited and adversely affecting other circuits.

When the power supply line 105 is formed into such a shape, the power supply line 105 can be easily cut off when the portion 515 is irradiated with a laser beam. In other words, in any defective pixel, only a defect can be easily corrected without adversely affecting other pixels.

The active layer 503 of the driving transistor 102 has portions 513 and 514 that are not covered with the wire 502, the gate wire 504 and the power supply line 105. The active layer 503 may be cut off by reducing the length of the portions 513 and 514 in a direction parallel to the channel width of the driving transistor 102 and irradiating the portion 513 or 514 with a laser beam. In that case, the lengths (Y53 and Y54) of the portions in a direction parallel to the channel width of the driving transistor 102 are preferably 3 µm or less. In addition, the lengths (X53 and X54) of the portions in a direction parallel to the channel length of the driving transistor 102 are preferably 4 µm or more.

The width of a part of the wire 502 for connecting the active layer 503 to the one electrode (anode) 501 of the light emitting element may be reduced between a contact hole for connecting the wire 502 to the active layer 503 and a contact hole for connecting the wire 502 to the one electrode (anode) 501 of the light emitting element. In that case, the longitudinal width (Y52) of a part of the wire 502 is preferably 3 µm or less. In addition, the horizontal width (X52) of a part of the wire 502 is preferably 4 µm or more.

When the wire 502 is formed into such a shape, the wire 502 can be easily cut off when a portion 512 is irradiated with a laser beam. In other words, in any defective pixel, only a defect can be easily corrected without adversely affecting other pixels.

The width of a part of the one electrode (anode) 501 of the light emitting element can be reduced in a portion adjacent to the portion where the one electrode 501 of the light emitting element overlaps the wire 502. In that case, the longitudinal width (Y51) of a part of the one electrode (anode) 501 of the light emitting element is preferably 3 µm or less. In addition, the horizontal width (X51) of a part of the one electrode (anode) 501 of the light emitting element is preferably 4 µm or more.

When the one electrode (anode) 501 of the light emitting element is formed into such a shape, the one electrode (anode) 501 of the light emitting element can be easily cut off by irradiating a portion 511 with a laser beam. In other words, in any defective pixel, only a defect can be easily corrected without adversely affecting other pixels.

Figure 9A:
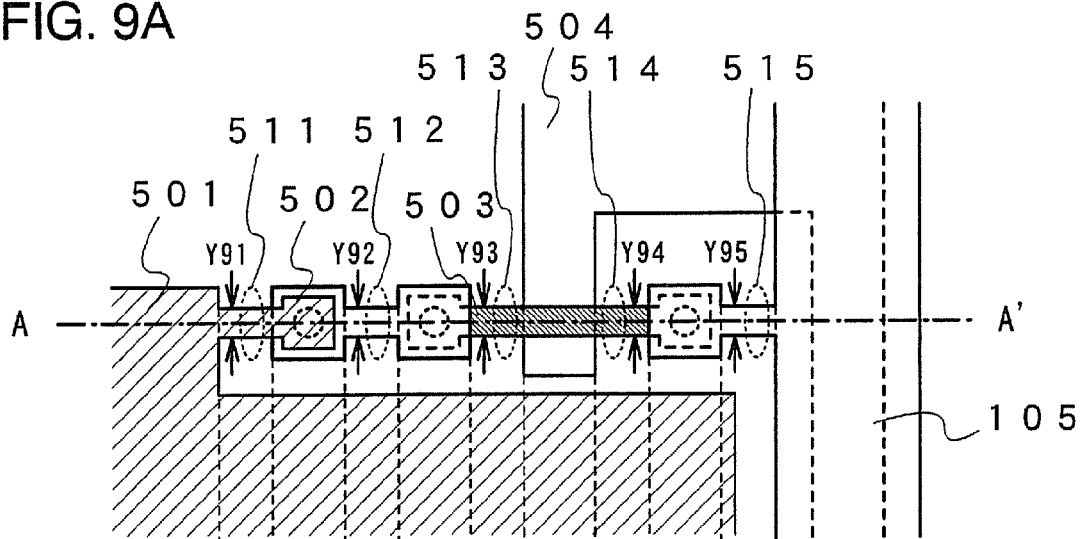
FIGS. 9A and 9B are diagrams each showing Embodiment Mode 6 of the invention.
Figure 9B:
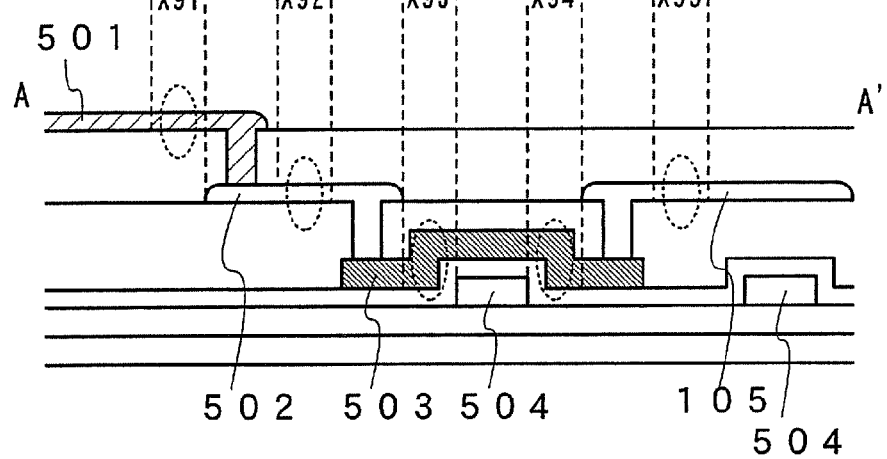

Although FIG. 5 shows a structure where the gate electrode is provided over the semiconductor active layer (top gate structure), at least one of the portions 511 to 515 can be easily cut off by laser irradiation even when adopting a structure where the gate electrode is provided under the semiconductor active layer as shown in FIG. 9.

Figure 19A:
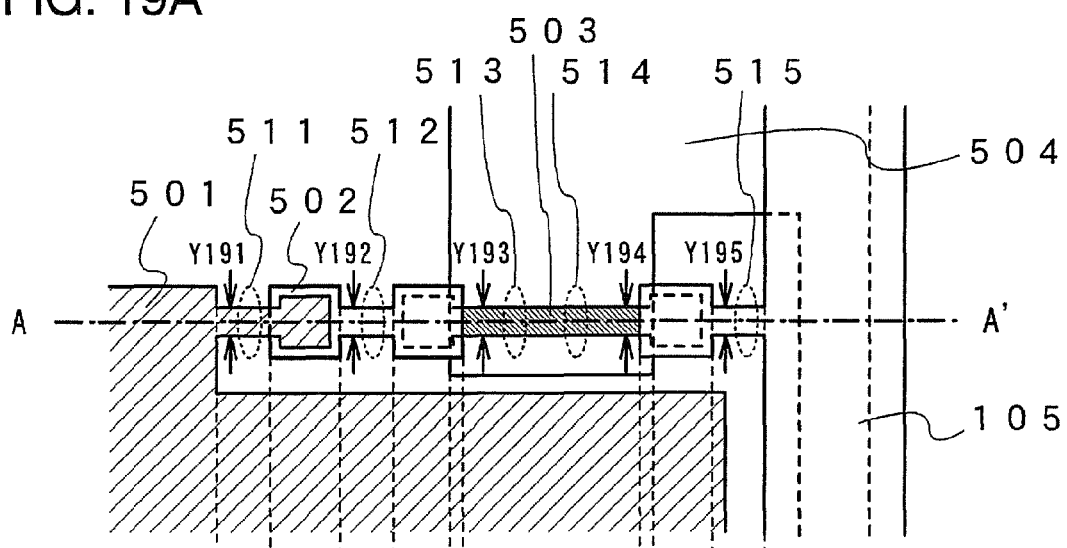
FIGS. 19A and 19B are diagrams each showing Embodiment Mode 6 of the invention.
Figure 19B:
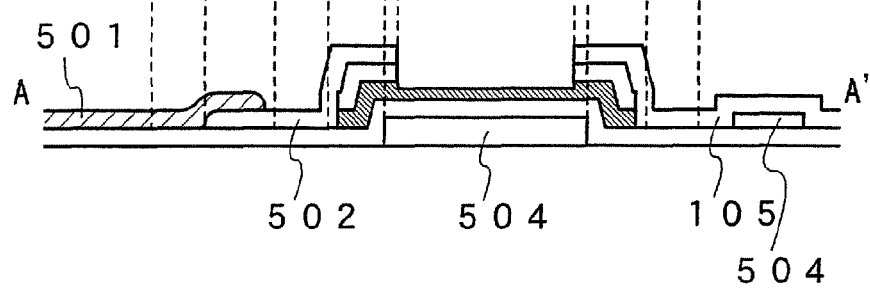
Figure 20A:
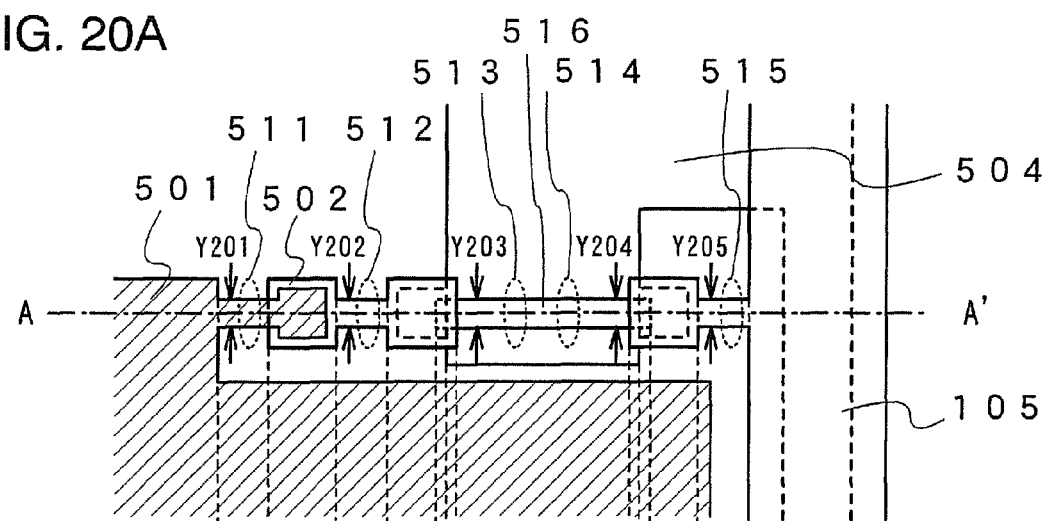
FIGS. 20A and 20B are diagrams each showing Embodiment Mode 6 of the invention.
Figure 20B:
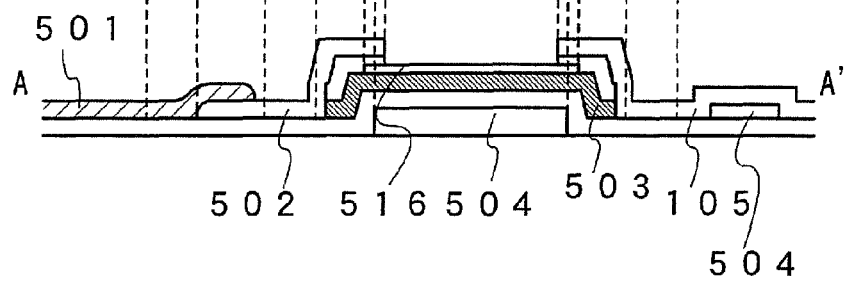

The invention can also be applied to the case of adopting a bottom gate transistor where amorphous silicon is used for a semiconductor layer. At least one of the portions 511 to 515 can be easily cut off by laser irradiation even when adopting, for example, an inversely staggered channel etched transistor as shown in FIG. 19, or a channel protective transistor as shown in FIG. 20. Note that in FIG. 20, an insulating film 516 functions as a film for protecting a channel.

Embodiment Mode 7

Described in this embodiment mode is another structure of a pixel portion of a display device where defective pixels can be easily corrected.

Figure 6:
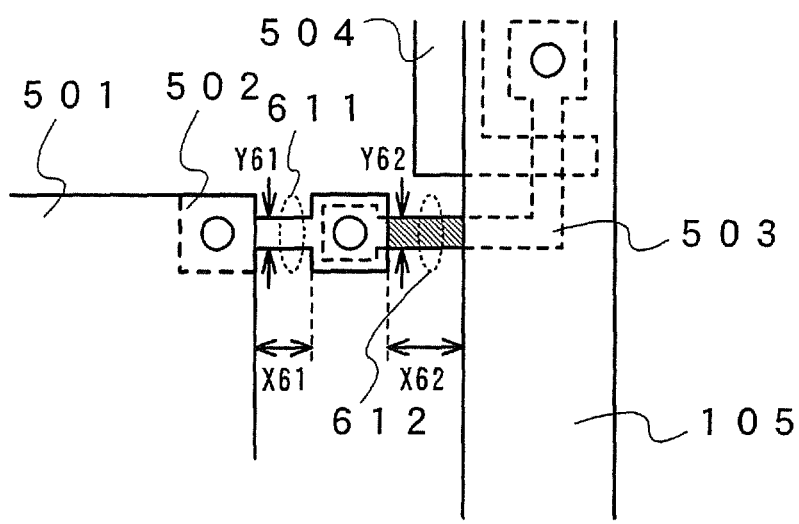
FIG. 6 is a diagram showing Embodiment Mode 7 of the invention.

FIG. 6 is a top plan view of a layout of one pixel. Note that an equivalent circuit of this pixel structure corresponds to FIG. 1.

The active layer 503 of the driving transistor 102 has a portion 612 that is not covered with the wire 502 and the power supply line 105. The active layer 503 may be cut off by reducing the length of the portion 612 in a direction parallel to the power supply line 105 and irradiating the portion 612 with a laser beam. In that case, the length (Y62) of the portion in a direction parallel to the power supply line 105 is preferably 3 μm or less. In addition, the length (X62) of the portion in a direction perpendicular to the power supply line 105 is preferably 4 μm or more. As a result, only a portion required for correcting defects can be cut off in view of the size and shape of a cross sectional surface (spot) of a laser shot, and thus the power supply line 105 itself can be prevented from being broken and adversely affecting other pixels. Further, other wires can be prevented from being short circuited and adversely affecting other pixels.

The width of a part of the wire 502 for connecting the active layer 503 to the one electrode (anode) 501 of the light emitting element may be reduced between a contact hole for connecting the wire 502 to the active layer 503 and a contact hole for connecting the wire 502 to the one electrode (anode) 501 of the light emitting element. In that case, the longitudinal width (Y61) of a part of the wire 502 is preferably 3 μm or less. In addition, the horizontal width (X61) of a part of the wire 502 is preferably 4 μm or more.

When the wire 502 is formed into such a shape, the wire 502 can be easily cut off by irradiating a portion 611 with a laser beam. In other words, in any defective pixel, only a defect can be easily corrected without adversely affecting other pixels.

Embodiment Mode 8

Described in this embodiment mode is another structure of a pixel portion of a display device where defective pixels can be easily corrected.

Figure 7:
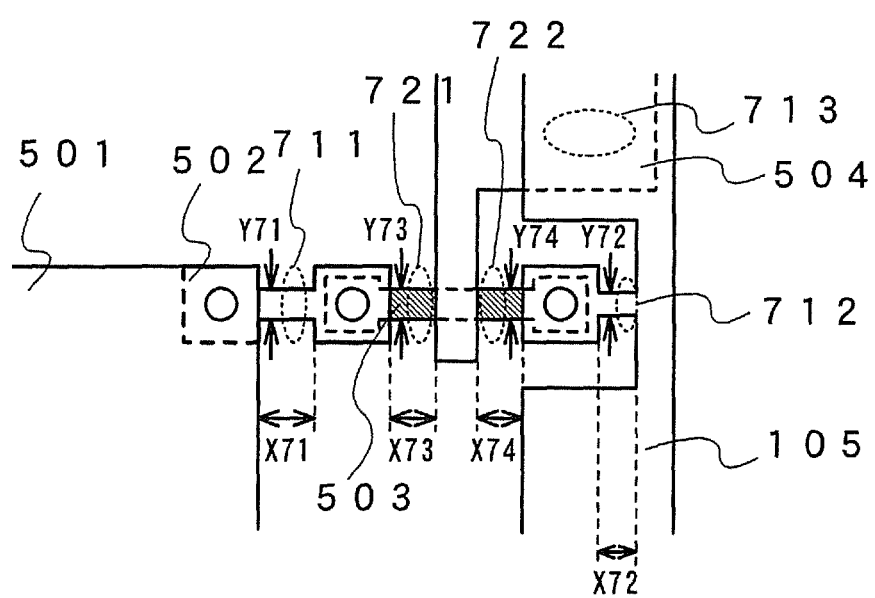
FIG. 7 is a diagram showing Embodiment Mode 8 of the invention.

FIG. 7 is a top plan view of a layout of one pixel. Note that an equivalent circuit of this pixel structure corresponds to FIG. 1, and the driving transistor 102 is a P-channel transistor. It is assumed that the source of the driving transistor 102 is connected to the power supply line 105 and the drain thereof is connected to the one electrode (anode) 501 of the light emitting element.

The power supply line 105 has a substantially linear shape, but has a depressed portion for each pixel (row). Further, a part of the depressed portion projects to be connected to the active layer 503, and the width of a part of the projection portion is reduced. In that case, the longitudinal width (Y72) of the power supply line 105 in a portion 712 is preferably 3 μm or less. In addition, the horizontal width (X72) of the power supply line 105 in the portion 712 is preferably 4 μm or more.

When the power supply line 105 is formed into such a shape, the power supply line 105 can be easily cut off by irradiating the portion 712 with a laser beam. In other words, in any defective pixel, only a defect can be easily corrected without adversely affecting other pixels. In the structure shown in FIG. 5, a layout area is increased as a part of the power supply line 105 projects, which leads to reduced aperture ratio. Meanwhile, in the structure shown in FIG. 7 where the power supply line has the depressed portion, the wire 502 can be easily cut off without reducing aperture ratio.

The gate wire 504 overlaps the power supply line 105 with an interlayer insulating film interposed therebetween. The gate wire 504 may be short circuited to the power supply line 105 by irradiating a part of the overlapping area, for example a portion 713, with a laser beam. That is to say, the gate and the source of the driving transistor 102 have the same potential when the gate wire 504 is short circuited to the power supply line 105; therefore, the driving transistor 102 is turned off, no current flows even when the light emitting element is short circuited, and a defective pixel can be easily corrected.

The active layer 503 of the driving transistor 102 has portions 721 and 722 that are not covered with the wire 502, the gate wire 504 and the power supply line 105. The active layer 503 may be cut off by reducing the length of the portions 721 and 722 in a direction parallel to the channel width of the driving transistor 102 and irradiating the portion 721 or 722 with a laser beam. In that case, the lengths (Y73 and Y74) of the portion in a direction parallel to the channel width of the driving transistor 102 are preferably 3 μm or less. In addition, the lengths (X73 and X74) of the portion in a direction parallel to the channel width of the driving transistor 102 are preferably 4 μm or more.

The width of a part of the wire 502 for connecting the active layer 503 to the one electrode (anode) 501 of the light emitting element may be reduced between a contact hole for connecting the wire 502 to the active layer 503 and a contact hole for connecting the wire 502 to the one electrode (anode) 501 of the light emitting element. In that case, the longitudinal width (Y71) of a part of the wire 502 is preferably 3 μm or less. In addition, the horizontal width (X71) of a part of the wire 502 is preferably 4 μm or more.

When the wire 502 is formed into such a shape, the wire 502 can be easily cut off by irradiating the portion 711 with a laser beam. In other words, in any defective pixel, only a defect can be easily corrected without adversely affecting other pixels.

Embodiment Mode 9

Described in this embodiment mode is another structure of a pixel portion of a display device where defective pixels can be easily corrected.

Figure 18:
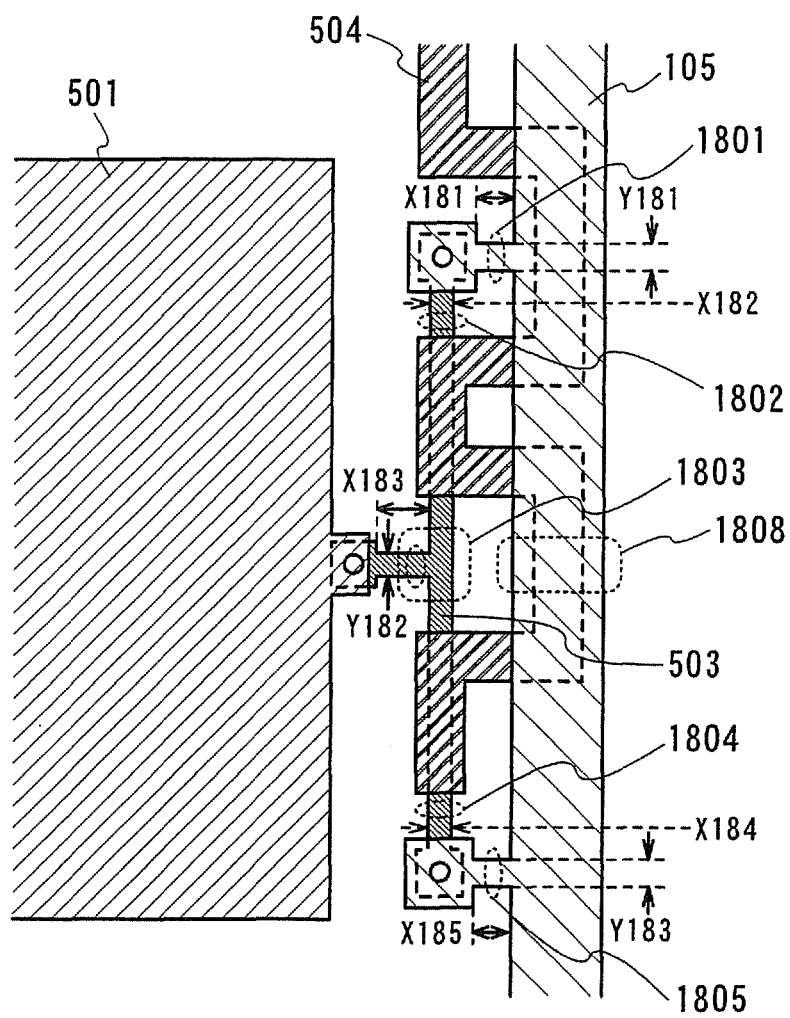
FIG. 18 is a diagram showing Embodiment Mode 9 of the invention.

FIG. 18 is a top plan view of a layout of one pixel. Note that an equivalent circuit of this pixel structure corresponds to FIG. 13 in the case where the wire 1351 and the wire 1352 are connected to the same power supply. The one electrode 501 of the light emitting element is connected to the power supply line 105 through a first transistor and a second transistor that are connected in parallel to each other.

The power supply line 105 has a substantially linear shape, but has two projecting portions for each pixel (row). Further, the width of a part of the projecting portions is reduced. In that case, the longitudinal width (Y) of the power supply line 105 in a portion 1801 and a portion 1805 is preferably 3 μm or less. In addition, the horizontal width (X) of the power supply line 105 in the portion 712 is preferably 4 μm or more.

When the power supply line 105 is formed into such a shape, the power supply line 105 can be easily cut off by irradiating the portion 1801 and the portion 1805 with a laser beam. In other words, in any defective pixel, only a defect can be easily corrected without adversely affecting other pixels.

The gate wire 504 overlaps the power supply line 105 with an interlayer insulating film interposed therebetween. Accordingly, if each of the first transistor and the second transistor is a P-channel transistor and the one electrode 501 of the light emitting element is an anode, or if each of the first transistor and the second transistor is an N-channel transistor and the one electrode 501 of the light emitting element is a cathode, the gate wire 504 may be short circuited to the power supply line 105 by irradiating a part of an area where the gate wire 504 overlaps the power supply line 105, for example a portion 1808, with a laser beam. That is to say, the gate and the source of each of the first transistor and the second transistor have the same potential when the gate wire 504 is short circuited to the power supply line 105; therefore, each of the transistors is turned off, no current flows even when the light emitting element is short circuited, and a defective pixel can be easily corrected.

The active layer 503 of the first and second transistors may be cut off by irradiating both a portion 1802 and a portion 1804 with a laser beam. Since one portion is only required to be irradiated with a laser beam, a portion 1803 is preferably irradiated with a laser beam to increase yield. Note that the horizontal width (X) of the portion 1802 and the portion 1804 is preferably 3 μm or less, and the longitudinal width (Y) thereof is preferably 4 μm or more.

When the active layer 503 is formed into such a shape, the active layer 503 can be easily cut off by irradiating both of the portion 1802 and the portion 1804, or the portion 1803 with a laser beam. In other words, in any defective pixel, only a defect can be easily corrected without adversely affecting other pixels.

Figure 35:
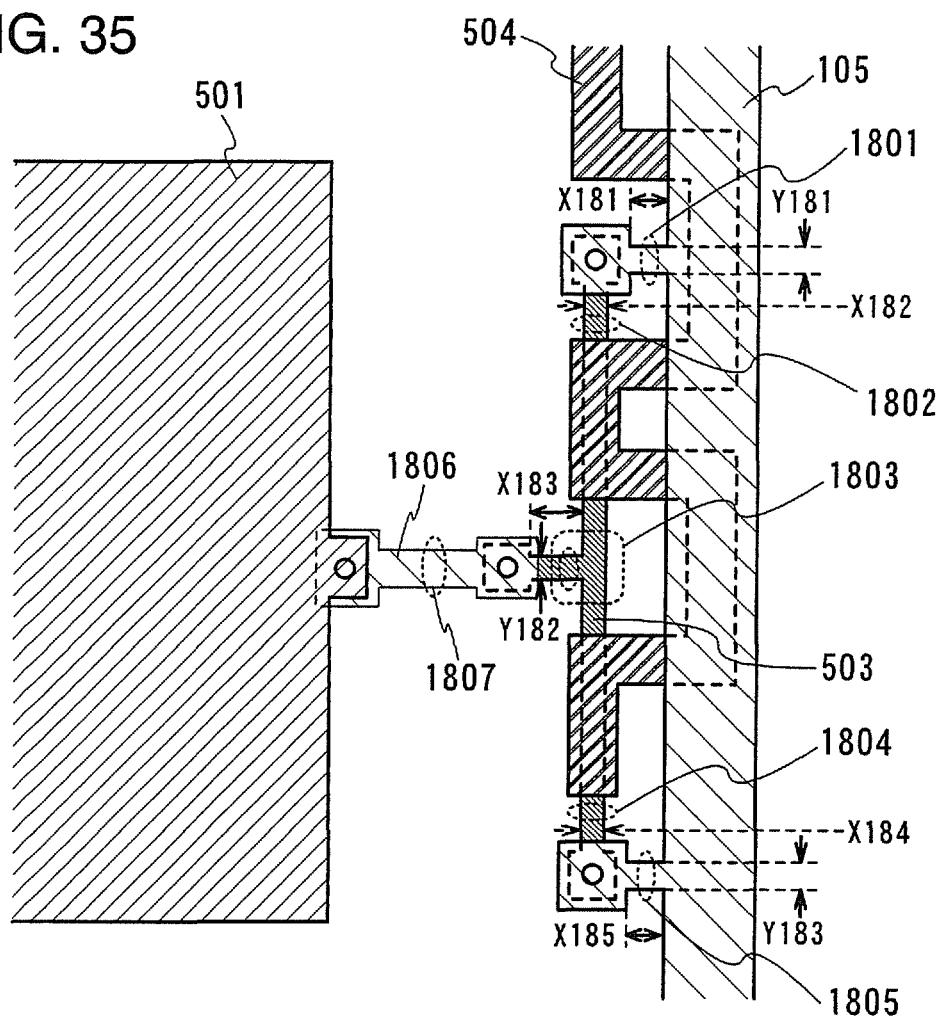
FIG. 35 is diagram showing Embodiment Mode 9 of the invention.

Although the one electrode 501 of the light emitting element is connected directly to the active layer 503 of the first and second transistors in FIG. 18, a wire 1806 may be provided between the one electrode 501 of the light emitting element and the active layer 503 of the first and second transistors as shown in FIG. 35. In that case, the wire 1806 can be formed simultaneously with the power supply line 105. In addition, the wire 1806 has a structure capable of easily correcting defective pixels. That is to say, the width of a part of the wire 1806 is reduced between a portion where the one electrode 501 of the light emitting element is connected to the wire 1806 and a portion where the wire 1806 is connected to the active layer 503 of the first and second transistors. The width of a portion 1807 where the width of the wire 1806 is reduced is preferably 3 μm or less.

Embodiment Mode 10

Described in this embodiment mode is another structure of a pixel portion of a display device where defective pixels can be easily corrected.

Figure 36A:
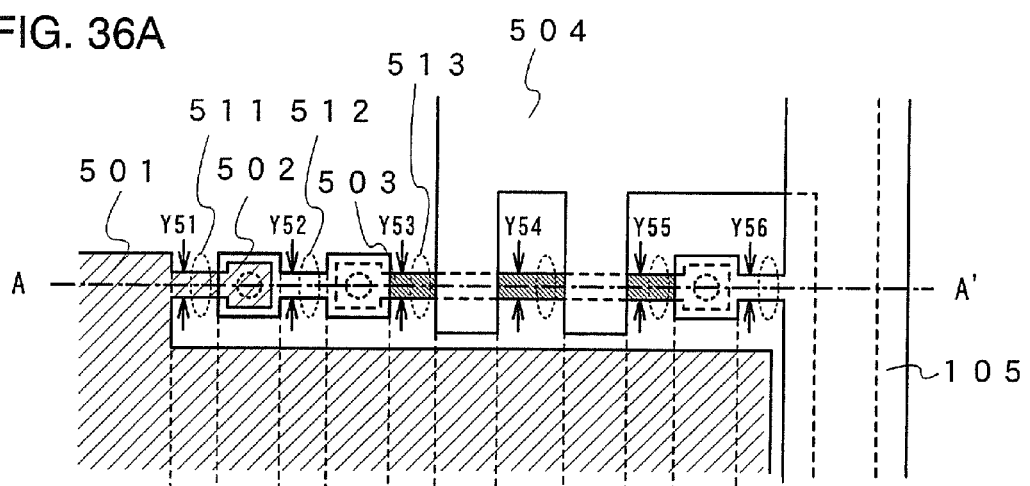
FIGS. 36A and 36B are diagrams each showing Embodiment Mode 10 of the invention.
Figure 36B:
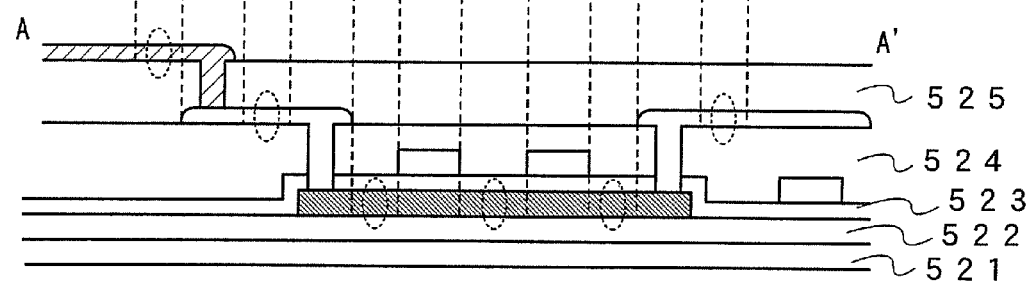

FIG. 36A shows a layout corresponding to a part of one pixel in a pixel portion of a display device. FIG. 36A is a top plan view showing the connection relation between a pixel electrode (one of a pair of electrodes of a light emitting element) and a power supply line, and FIG. 36B is a cross sectional view along a line A-A' of FIG. 36A. An equivalent circuit of the top plan view shown in FIG. 36A corresponds to FIG. 12. In other words, FIGS. 36A and 36B have a structure where two transistors connected in series are provided between the pixel electrode (one of a pair of electrodes of the light emitting element) and the power supply line.

FIG. 36A has almost the same structure as FIG. 5A described in Embodiment Mode 6, except in that there are two overlapping areas of the gate wire 504 and the active layer 503 of the driving transistor in FIG. 36A while there is one overlapping area in FIG. 5A. Therefore, in this embodiment mode, only the difference from FIG. 5 is described. In this embodiment mode, the width (Y54) of the active layer 503 that is sandwiched between two gate wires when seen from the top surface is reduced. The width of the active layer 503 in this portion is preferably 3 μm or less.

In the display device having the active layer 503 formed into such a shape, defects in any pixel can be easily corrected without adversely affecting other pixels.

Embodiment Mode 11

Described in this embodiment mode is another structure of a pixel portion of a display device where defective pixels can be easily corrected.

FIG. 37A shows a layout corresponding to a part of one pixel in a pixel portion of a display device. FIG. 37A is a top plan view showing the connection relation between a pixel electrode (one of a pair of electrodes of a light emitting element) and a power supply line, and FIG. 37B is a cross sectional view along a line A-A' of FIG. 37A. An equivalent circuit of the top plan view shown in FIG. 37A corresponds to FIG. 12, and similarly to FIG. 36A, FIG. 37A has a structure where two transistors connected in series are provided between a pixel electrode (one of a pair of electrodes of a light emitting element) and a power supply line.

FIG. 37A has almost the same structure as FIG. 36A, except in that the active layer 503 described in Embodiment Mode 10 with reference to FIG. 36A is divided into two layers that are connected through the wire 531. Therefore, in this embodiment mode, only the difference from FIG. 36A is described. In this embodiment mode, the widths (Y56 and Y58) of the active layer 503 that is sandwiched between two gate wires when seen from the top surface and that does not overlap the wire 531 are reduced. The width of the active layer 503 in this portion is preferably 3 μm or less. One or both of the width Y56 and the width Y58 of the active layer 503 may be reduced.

Instead of reducing the width of at least a part of the active layer 503, the width of the wire 531 in a portion where the wire 531 does not overlap two active layers when seen from the top surface may be reduced. The width Y57 of the wire 531 in this portion is preferably 3 μm or less.

In the display device having the active layer 503 or the wire 531 formed into such a shape, defects in any pixel can be easily corrected without adversely affecting other pixels.

Embodiment Mode 12

Described in this embodiment mode is another structure of a pixel portion of a display device where defective pixels can be easily corrected.

Figure 38:
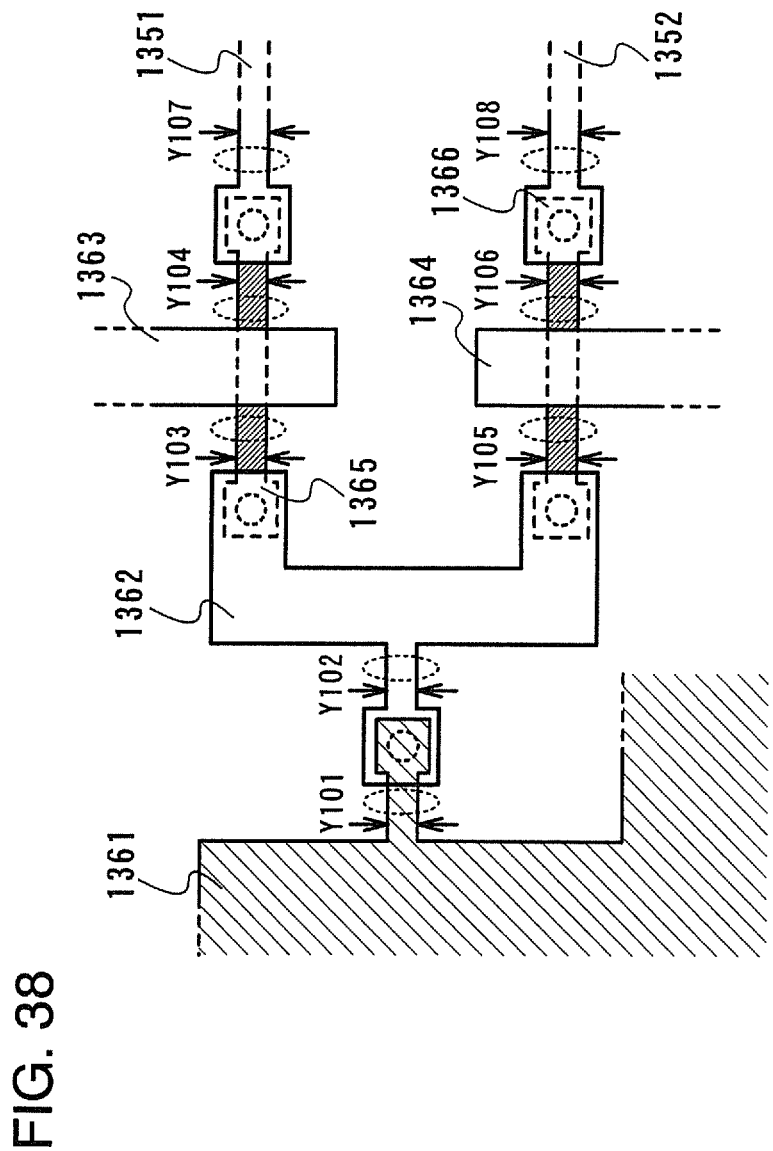
FIG. 38 is a diagram showing Embodiment Mode 12 of the invention.

FIG. 38 shows a layout corresponding to a part of one pixel in a pixel portion of a display device. FIG. 38 is a top plan view showing the connection relation between a pixel electrode and a power supply line. An equivalent circuit of the top plan view shown in FIG. 38 corresponds to FIG. 13, and has a structure where at least two transistors connected to one electrode of a light emitting element are provided between a pixel electrode (one of a pair of electrodes of the light emitting element) and a power supply line.

In FIG. 38, one of the source and the drain of the transistor 1304 having an active layer 1365 is connected through a wire 1362 to one of the source and the drain of the transistor 1305 having an active layer 1366. The wire 1362 is connected to one electrode 1361 (pixel electrode) of the light emitting element 101. The other of the source and the drain of the transistor 1304 is connected to a wire 1351, and the other of the source and the drain of the transistor 1305 is connected to a wire 1352.

In this embodiment mode, the widths Y103 and Y104 of the active layer 1365 that dose not overlap the wire 1362, a gate wire 1363 and the wire 1351, or the width Y107 of the wire 1351 that does not overlap the active layer 1365 is reduced. In that case, the widths Y103 and Y104 of the active layer 1365, or the width Y107 of the wire 1351 is preferably 3 μm or less. All of the widths Y103, Y104 and Y107 may be reduced, or at least one of them may be reduced.

In this embodiment mode, the widths Y105 and Y106 of the active layer 1366 that dose not overlap the wire 1362, a gate wire 1364 and the wire 1352, or the width Y108 of the wire 1352 that does not overlap the active layer 1366 is reduced. In that case, the widths Y105 and Y106 of the active layer 1366, or the width Y108 of the wire 1352 that does not overlap the active layer 1366 is preferably 3 μm or less. All of the widths Y105, Y106 and Y108 may be reduced, or at least one of them may be reduced.

Instead of reducing both of the widths Y103, Y104 and Y107 and the widths Y105, Y106 and Y108, the width Y101 of the wire 1362 in the vicinity of a portion where the one electrode 1361 of the light emitting element 101 does not overlap the wire 1362 when seen from the top surface, or the width Y102 of the one electrode 1361 of the light emitting element 101 may be reduced. The latter structure is preferably adopted instead of the former structure, since defective pixels can be corrected by cutting off only one portion of a wire and the like. The width Y101 of the wire 1362 or the width Y102 of the one electrode 1361 of the light emitting element 101 is preferably 3 μm or less.

In the display device having the one electrode 1361 of the light emitting element 101, the wire 1362, the active layer 1365, the active layer 1366, the wire 1351, and the wire 1352 that are formed into such a shape, defects in any pixel can be easily corrected without adversely affecting other pixels.

Embodiment Mode 13

Described in this embodiment mode is another structure of a pixel portion of a display device where defective pixels can be easily corrected.

Figure 39:
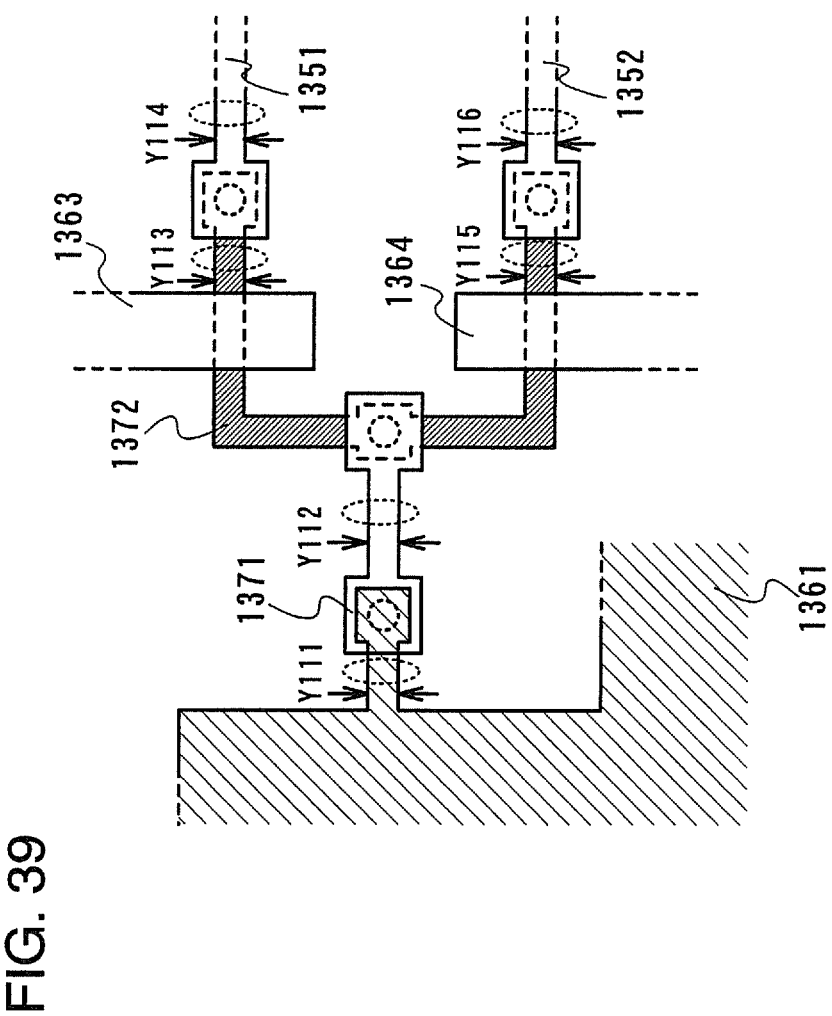
FIG. 39 is a diagram showing Embodiment Mode 13 of the invention.

FIG. 39 shows a layout corresponding to a part of one pixel in a pixel portion of a display device. FIG. 39 is a top plan view showing the connection relation between a pixel electrode (one of a pair of electrodes of a light emitting element) and a power supply line. An equivalent circuit of the top plan view shown in FIG. 39 corresponds to FIG. 13, and similarly to FIG. 38, FIG. 39 has a structure where two transistors are connected to one electrode of a light emitting element.

FIG. 39 has almost the same structure as that described in Embodiment Mode 10 with reference to FIG. 38, except in that the two active layers 1365 and 1366 are substituted by one active layer 1372. Therefore, in this embodiment mode, only the difference from FIG. 38 is described. In this embodiment mode, both of the widths Y113 and Y114 and the widths Y115 and Y116 may be reduced. Alternatively, the width Y111 or Y112 may be reduced. The latter structure is preferably adopted instead of the former structure, since defective pixels can be corrected by cutting off only one portion of a wire and the like. Each of the widths Y103, Y104, Y107, Y105, Y106, and Y108 is preferably 3 μm or less.

In the display device having the one electrode 1361 of the light emitting element 101, the wire 1371, the active layer 1372, the wire 1351, and the wire 1352 that are formed into such a shape, defects in any pixel can be easily corrected without adversely affecting other pixels.

Embodiment Mode 14

Described in this embodiment mode is another structure of a pixel portion of a display device where defective pixels can be easily corrected.

Figure 40:
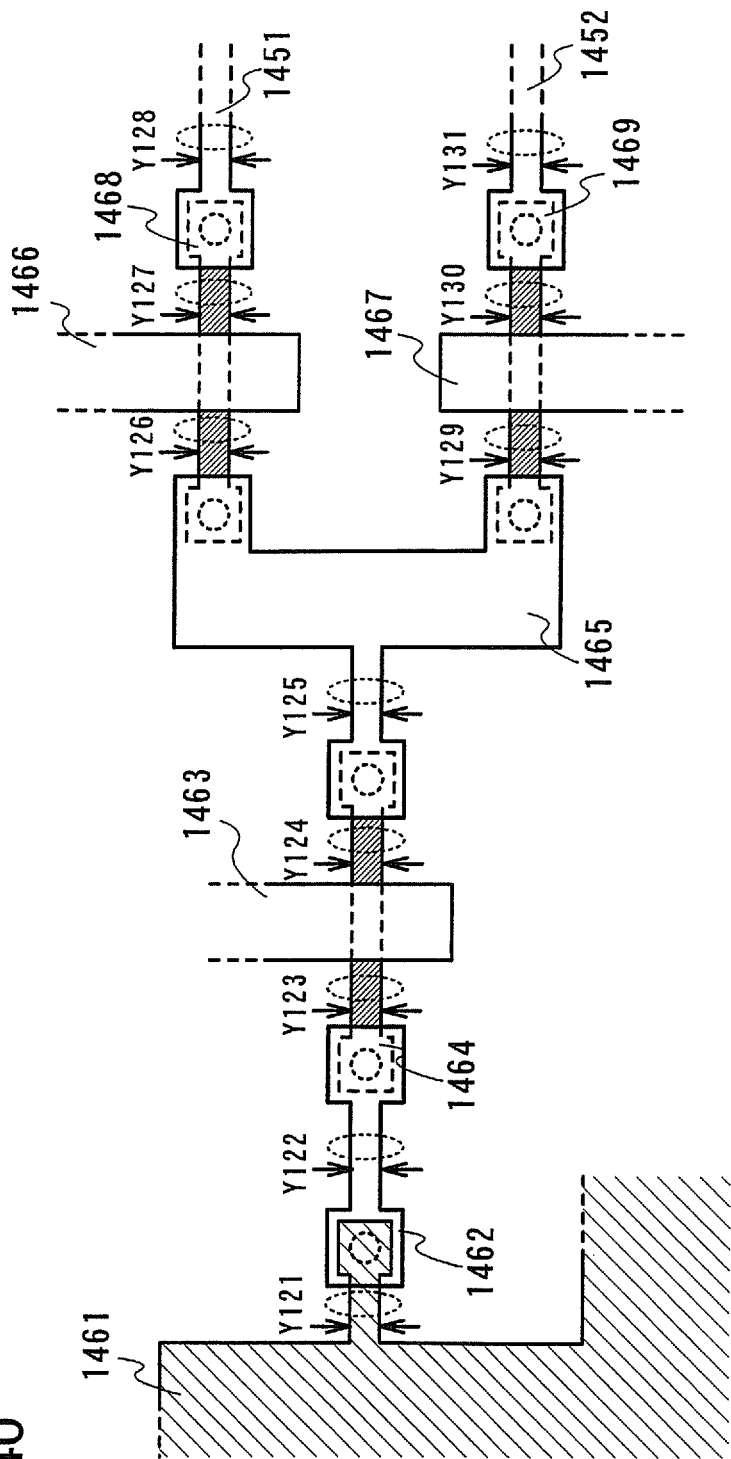
FIG. 40 is a diagram showing Embodiment Mode 14 of the invention.

FIG. 40 shows a layout corresponding to a part of one pixel in a pixel portion of a display device. FIG. 40 is a top plan view showing the connection relation between a pixel electrode and a power supply line. An equivalent circuit of the top plan view shown in FIG. 40 corresponds to FIG. 14, and has a structure including at least the transistor 1405 connected to one electrode of a light emitting element and the two transistors 1406 and 1407 connected to the transistor 1405.

In FIG. 40, one of the source and the drain of the transistor 1406 having an active layer 1468 is connected to one of the source and the drain of the transistor 1407 having an active layer 1469 through a wire 1465. The wire 1465 is connected to one of the source and the drain of the transistor 1405 having an active layer 1464. The other of the source and the drain of the transistor 1405 is connected to one electrode 1461 (pixel electrode) of the light emitting element 101 through a wire 1462. The other of the source and the drain of the transistor 1406 is connected to a wire 1451, and the other of the source and the drain of the transistor 1407 is connected to a wire 1452.

In this embodiment mode, as described in Embodiment Mode 13 with reference to FIG. 39, at least one of the widths Y126, Y127 and Y128, and at least one of the widths Y129, Y130 and Y131 are reduced. In that case, at least one of the widths Y126, Y127 and Y128, and at least one of the widths Y129, Y130 and Y131 are preferably 3 μm or less.

Instead of reducing at least one of the widths Y126, Y127 and Y128, and at least one of the widths Y129, Y130 and Y131, at least one of the widths Y121, Y122, Y123, Y124, and Y125 may be reduced. The latter structure is preferably adopted instead of the former structure, since defective pixels can be corrected by cutting off only one portion of a wire and the like. In that case, each of the widths Y121, Y122, Y123, Y124, and Y125 is preferably 3 μm or less.

In the display device having the one electrode 1461 of the light emitting element 101, the wire 1462, the active layer 1464, the wire 1465, the active layer 1468, the active layer 1469, the wire 1451, and the wire 1452 that are formed into such a shape, defects in any pixel can be easily corrected without adversely affecting other pixels.

Embodiment Mode 15

Described in this embodiment mode is another structure of a pixel portion of a display device where defective pixels can be easily corrected.

Figure 41:
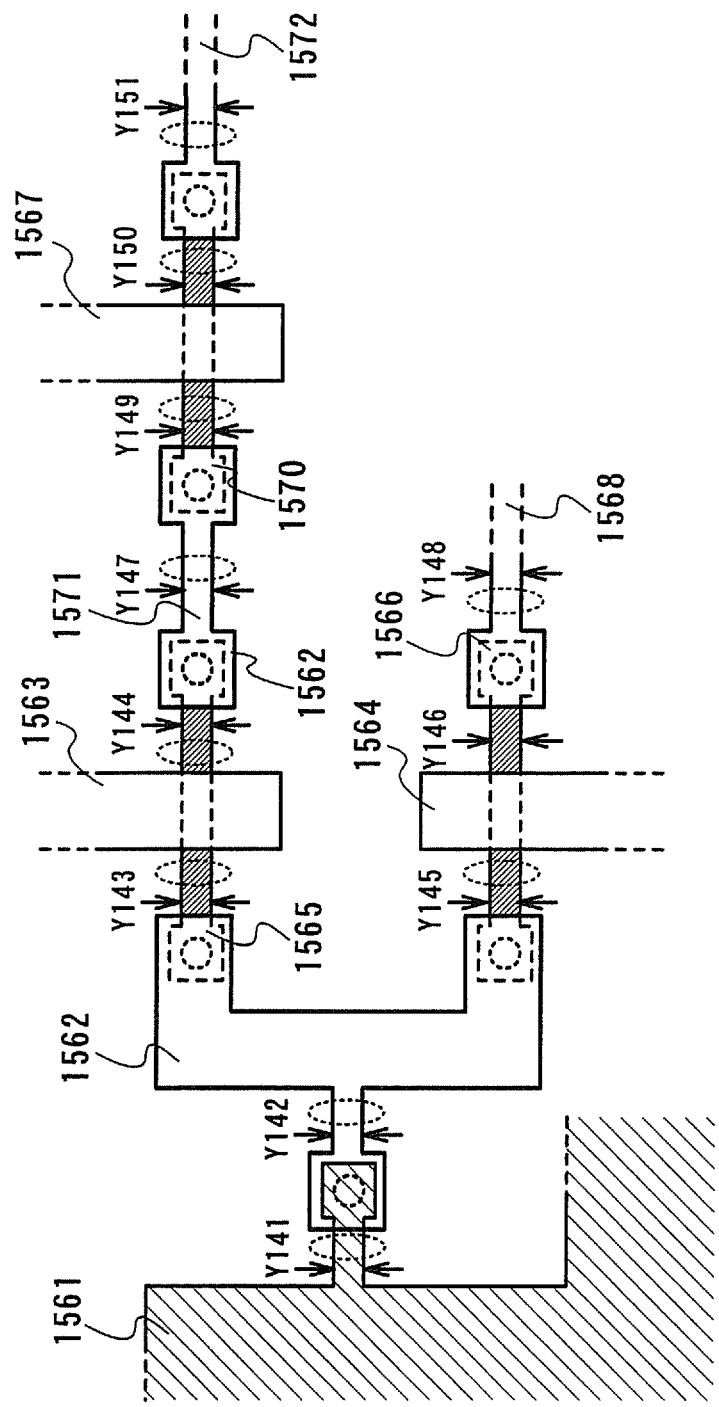
FIG. 41 is a diagram showing Embodiment Mode 15 of the invention.

FIG. 41 shows a layout corresponding to a part of one pixel in a pixel portion of a display device. FIG. 41 is a top plan view showing the connection relation between a pixel electrode and a power supply line. An equivalent circuit of the top plan view shown in FIG. 41 corresponds to FIG. 15, and has a structure where the transistors 1506 and 1507 that are connected in series and the transistor 1508 are connected to one electrode of a light emitting element between a pixel electrode and a power supply line.

One electrode 1561 of the light emitting element is connected to an active layer 1565 (one of the source and the drain) of the transistor 1506 and an active layer 1566 (one of the source and the drain) of the transistor 1508 through a wire 1562. The other of the source and the drain of the transistor 1506 is connected to an active layer 1570 (one of the source and the drain) of the transistor 1507 through the wire 1571. The other of the source and the drain of the transistor 1507 is connected to a wire 1572, and the other of the source and the drain of the transistor 1508 is connected to a wire 1568.

In this embodiment mode, at least one of the widths Y143, Y144, Y147, Y149, Y150, and Y151, and at least one of the widths Y145, Y146 and Y148 are reduced. In that case, at least one of the widths Y143, Y144, Y147, Y149, Y150, and Y151, and at least one of the widths Y145, Y146 and Y148 are preferably 3 μm or less.

Instead of reducing at least one of the widths Y143, Y144, Y147, Y149, Y150, and Y151, and at least one of the widths Y145, Y146 and Y148, at least one of the widths Y141 and Y142 may be reduced. The latter structure is preferably adopted instead of the former structure, since defective pixels can be corrected by cutting off only one portion of a wire and the like. In that case, each of the widths Y141 and Y142 is preferably 3 μm or less.

In the display device having the one electrode 1561 of the light emitting element 101, the wire 1562, the active layer 1565, the active layer 1566, the wire 1567, the wire 1568, the active layer 1570, and the wire 1571 that are formed into such a shape, defects in any pixel can be easily corrected without adversely affecting other pixels.

Embodiment Mode 16

Described in this embodiment mode is another structure of a pixel portion of a display device where defective pixels can be easily corrected.

FIG. 42A shows a layout corresponding to a part of one pixel in a pixel portion of a display device. FIG. 42A is a top plan view showing the connection relation between a pixel electrode (one of a pair of electrodes of a light emitting element) and a power supply line, and FIG. 42B is a cross sectional view along a line A-A' of FIG. 42A. An equivalent circuit of the top plan view shown in FIG. 42A corresponds to FIG. 12, and has a structure where at least two transistors that are connected in series are provided between the pixel electrode (one of a pair of electrodes of the light emitting element) and the power supply line similarly to FIG. 36A and FIG. 37A.

A pixel electrode 4201 is connected to one of the source and the drain of the transistor 1204 having an active layer 4204 through a wire 4202. The other of the source and the drain of the transistor 1204 is connected to one of the source and the drain of the transistor 1205 having an active layer 4206 through a wire 4205. The other of the source and the drain of the transistor 1205 is connected to a wire 4207. In FIG. 42B, reference numeral 4208 denotes a semiconductor film containing an element belonging to group 13 (or 15) of the periodic table, which is not shown in FIG. 42A since it is provided under the wire 4202, the wire 4205 and the wire 4207. Note that a substrate is provided under a gate wire 4203, which is not shown in FIGS. 42A and 42B.

In this embodiment mode, the width Y161 of the wire 4202 in a portion where the wire 4202 does not overlap the pixel electrode 4201 and the active layer 4204 when seen from the top surface is reduced. The width Y161 is preferably 3 μm or less.

Instead of reducing the width Y161, the width Y162 of the wire 4205 in a portion where the wire 4205 does not overlap the active layer 4204 and the active layer 4206 may be reduced. The width Y162 is preferably 3 μm or less. Instead of reducing the width Y161 or Y162, the width Y163 of the wire 4207 in a portion where the wire 4207 does not overlap the active layer 4206 may be reduced. The width Y163 is preferably 3 μm or less. All of the widths Y161, Y162 and Y163 may be reduced, or at least one of them may be reduced.

In the display device having the wire 4202, the wire 4205, and the wire 4207 that are formed into such a shape, defects in any pixel can be easily corrected without adversely affecting other pixels.

Embodiment Mode 17

Described in this embodiment mode is another structure of a pixel portion of a display device where defective pixels can be easily corrected.

FIG. 43A shows a layout corresponding to a part of one pixel in a pixel portion of a display device. FIG. 43A is a top plan view showing the connection relation between a pixel electrode (one of a pair of electrodes of a light emitting element) and a power supply line, and FIG. 43B is a cross sectional view along a line A-A' of FIG. 43A. An equivalent circuit of the top plan view shown in FIG. 43A corresponds to FIG. 12, and has a structure where at least two transistors that are connected in series are provided between the pixel electrode (one of a pair of electrodes of the light emitting element) and the power supply line similarly to FIG. 42A.

In FIG. 42A described in Embodiment Mode 16, a part of the active layer (corresponding to a channel forming region) in a portion where the active layer does not overlap the semiconductor film 4208 containing an element belonging to group 13 (or 15) of the periodic table is etched, and the pixel electrode 4201 is provided so as to overlap the wire 4202. FIG. 43A has almost the same structure as FIG. 42A, except in that a protective film 4209 is provided so as to cover the active layer in a portion where the active layer does not overlap the channel forming region, and the wire 4202 is provided so as to overlap the pixel electrode 4201. That is to say, in this embodiment mode, at least one of the width Y161 of the wire 4202, the width Y162 of the wire 4205, and the width Y163 of the wire 4207 may be reduced when seen from the top surface. Each of the widths Y161, Y162 and Y163 is preferably 3 μm or less. Note that all of the widths Y161, Y162 and Y163 may be reduced.

In the display device having the wire 4202, the wire 4205, and the wire 4207 that are formed into such a shape, defects in any pixel can be easily corrected without adversely affecting other pixels.

Embodiment 1

Described in this embodiment is a structure of a display device where defective pixels can be easily corrected. Since a structure example of a pixel is described in Embodiment Mode 2 with reference to FIG. 1, another structure example that is different from FIG. 1 is described in this embodiment.

Figure 21:
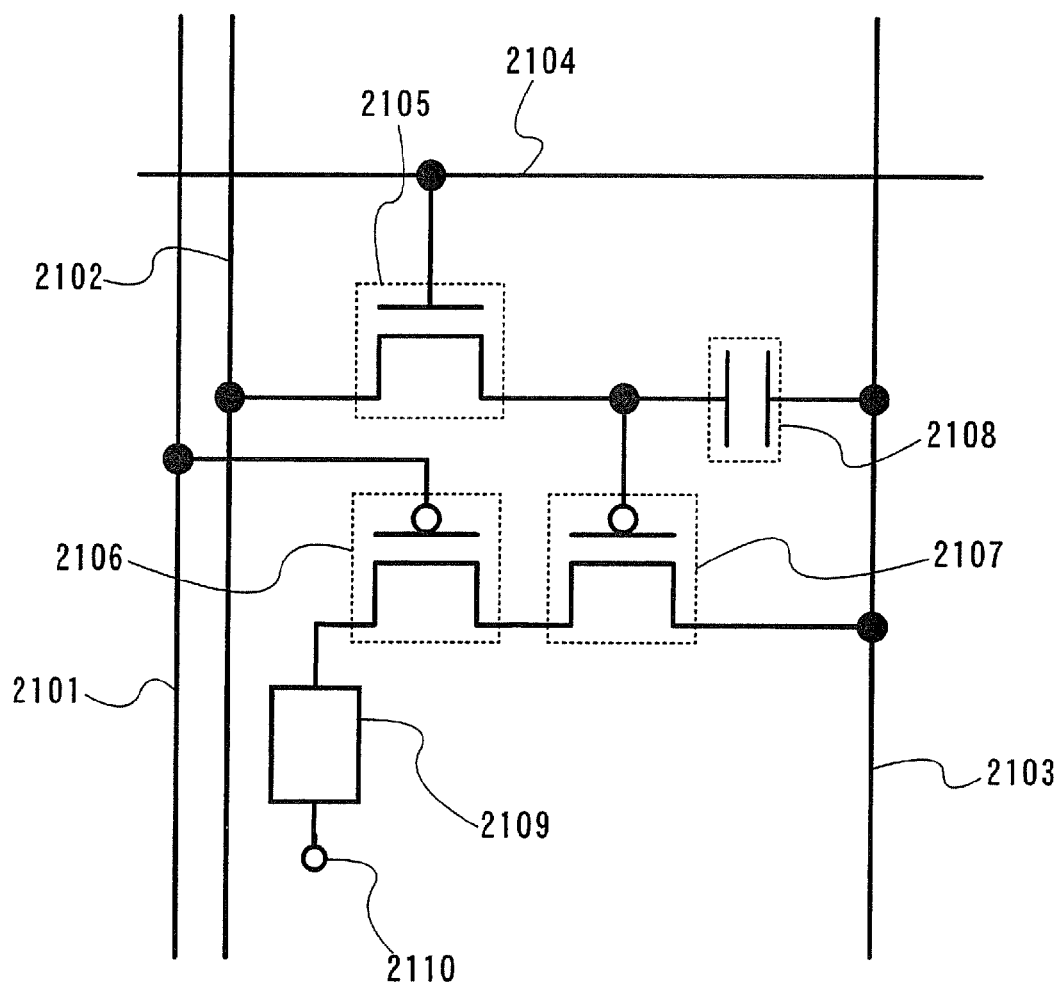
FIG. 21 is a diagram showing Embodiment 1 of the invention.

FIG. 21 shows an example of an equivalent circuit diagram corresponding to one pixel in a pixel portion of a display device. Each pixel has a first transistor 2105, a second transistor 2106, a third transistor 2107, a capacitor 2108, a light emitting element 2109, and one electrode 2110 of the light emitting element 2109. The one electrode 2110 of the light emitting element 2109 may be an anode or a cathode.

A gate electrode of the first transistor 2105 is connected to a gate signal line 2104 (scan line), and one of a source and a drain thereof is connected to a first source signal line 2102 (data line) while the other is connected to a gate electrode of the third transistor 2107 and one electrode of the capacitor 2108. A gate electrode of the second transistor 2106 is connected to a second source signal line 2101, and one of a source and a drain thereof is connected to the other electrode of the light emitting element 2109 while the other is connected to one of a source and a drain of the third transistor 2107. The other of the source and the drain of the third transistor 2107 is connected to a power supply line 2103. The other electrode of the capacitor 2108 is connected to the power supply line 2103.

The capacitor 2108 has a function of holding a gate potential of the third transistor 2107. Therefore, the capacitor 2108 is provided between a gate electrode of the third transistor 2107 and the power supply line 2103 in FIG. 21, though the invention is not limited to this structure. In other words, the capacitor 2108 is only required to be provided to hold the gate potential of the third transistor 2107. If the gate potential of the third transistor 2107 can be held using the gate capacitance of the third transistor 2107 or the like, the capacitor 2108 is not necessarily provided.

As described in Embodiment Mode 2, the first to third transistors 2105 to 2107 are not limited to the structure shown in FIG. 21. That is to say, each of the first to third transistors 2105 to 2107 may be an N-channel transistor or a P-channel transistor. The active layer of each transistor may be formed of an amorphous semiconductor or a crystalline semiconductor, and may have an LDD structure of a GOLD structure. Each transistor may have a forward staggered structure or an inversely staggered structure, and a top gate structure or a bottom gate structure. The gate electrode of each transistor may be formed both over and under the channel forming region, or either over or under the channel forming region.

In order to implement the invention in FIG. 21, at least a part of the current path between the power supply line 2103 and the other electrode of the light emitting element 2109 (electrode connected to one of the source and the drain of the second transistor 2106) may be interrupted. The current path between the other electrode of the light emitting element 2109 and the power supply line 2103 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 22:
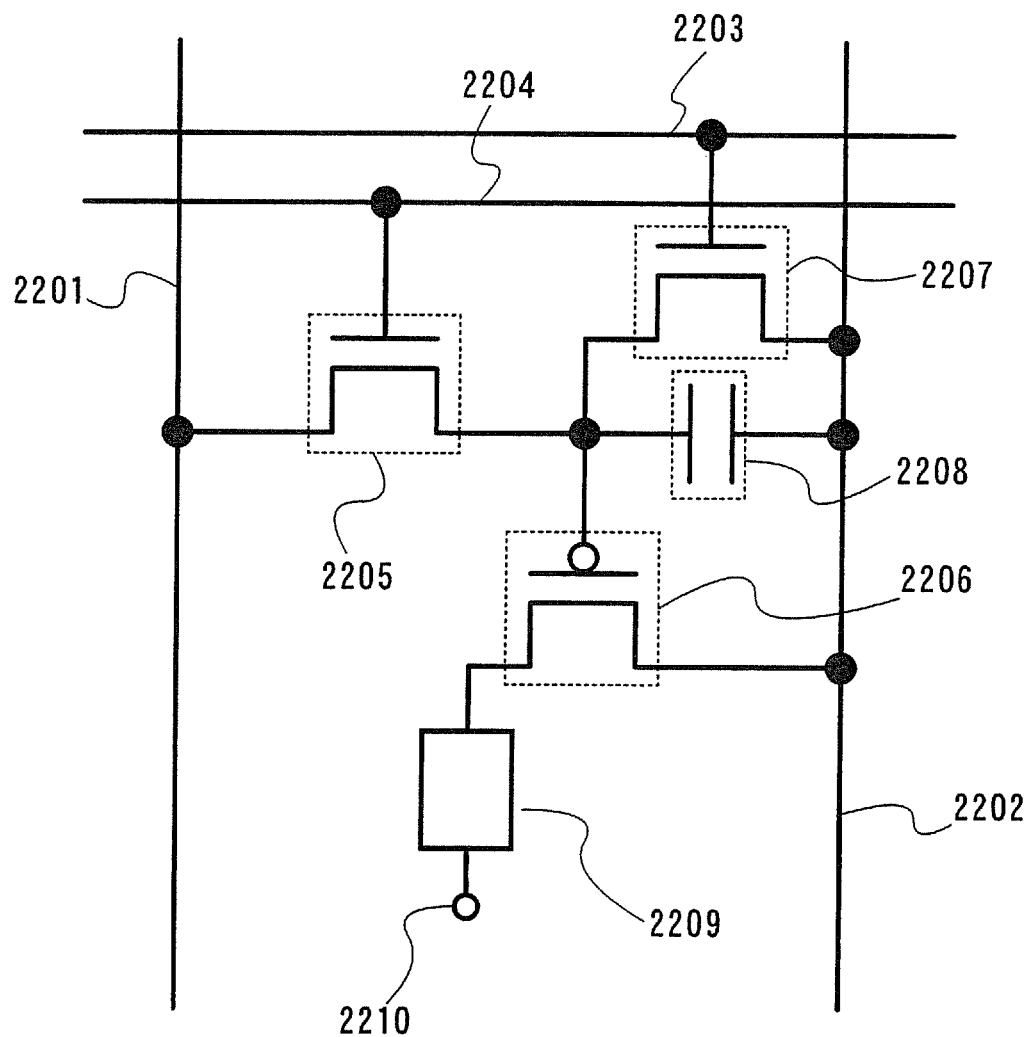
FIG. 22 is a diagram showing Embodiment 1 of the invention.

FIG. 22 shows another example of an equivalent circuit diagram corresponding to one pixel in a pixel portion of a display device. Each pixel has a first transistor 2205, a second transistor 2206, a third transistor 2207, a capacitor 2208, a light emitting element 2209, and one electrode 2210 of the light emitting element 2209. The one electrode 2210 of the light emitting element 2209 may be an anode or a cathode.

A gate electrode of the first transistor 2205 is connected to a first gate signal line 2204, and one of a source and a drain thereof is connected to a first source signal line 2201 (data line) while the other is connected to a gate electrode of the second transistor 2206, one of a source and a drain of the third transistor 2207, and one electrode of the capacitor 2208. One of a source and a drain of the second transistor 2206 is connected to the other electrode of the light emitting element 2209, while the other is connected to a power supply line 2202. A gate electrode of the third transistor 2207 is connected to a second gate signal line 2203, and the other of the source and the drain thereof is connected to a power supply line 2202. The other electrode of the capacitor 2208 is connected to the power supply line 2202.

In order to implement the invention in FIG. 22, at least a part of the current path between the power supply line 2202 and the other electrode of the light emitting element 2209 (electrode connected to one of the source and the drain of the second transistor 2206) may be interrupted. The current path between the other electrode of the light emitting element 2209 and the power supply line 2202 is similar to the aforementioned structure of FIG. 11, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 23:
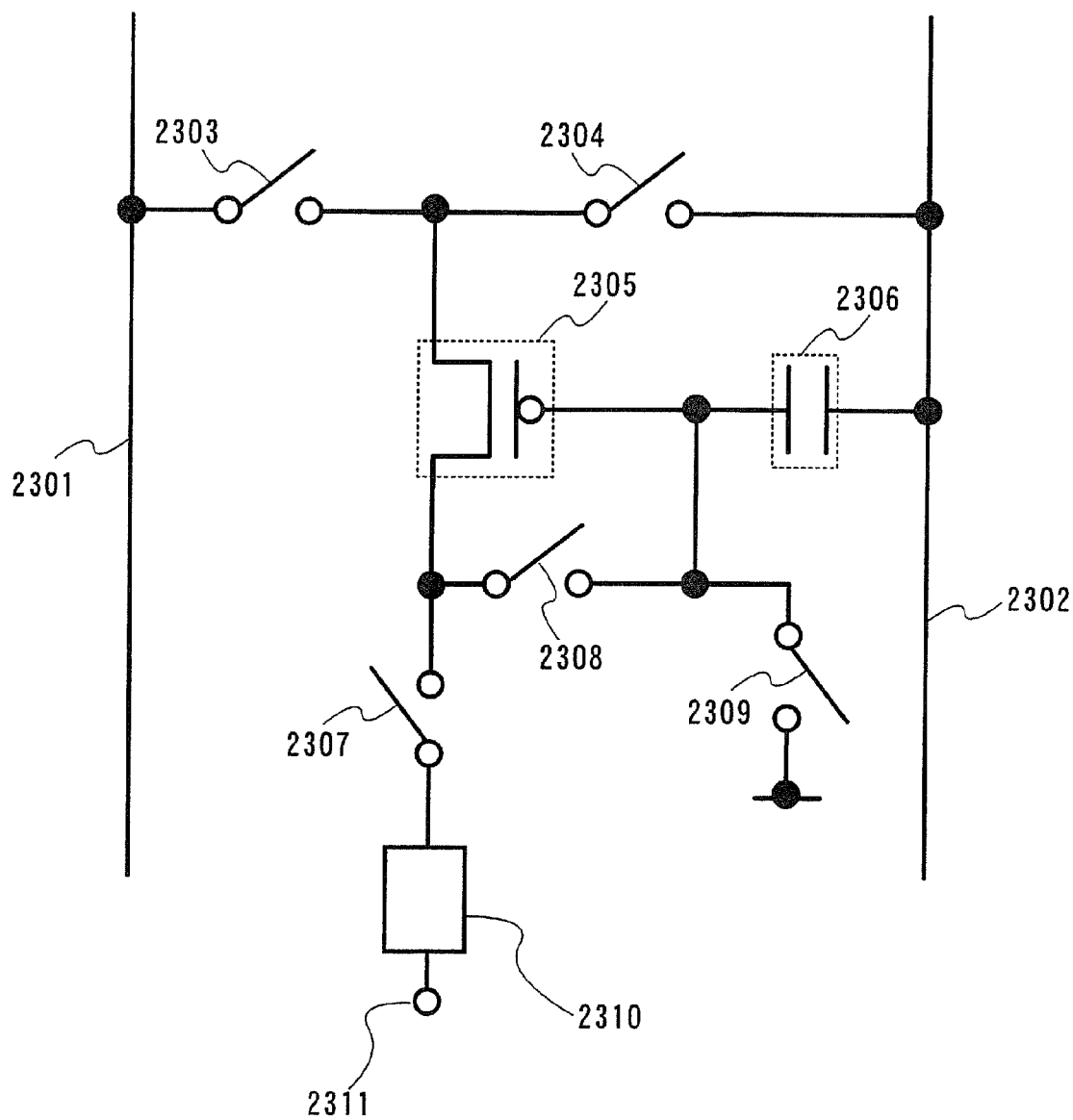
FIG. 23 is a diagram showing Embodiment 1 of the invention.

FIG. 23 shows another example of an equivalent circuit diagram corresponding to one pixel in a pixel portion of a display device. Each pixel has a first switch 2303, a second switch 2304, a transistor 2305, a capacitor 2306, a third switch 2307, a fourth switch 2308, a fifth switch 2309, a light emitting element 2310, and one electrode 2311 of the light emitting element 2310. The one electrode 2311 of the light emitting element 2310 may be an anode or a cathode.

A gate electrode of the transistor 2305 is connected to one electrode of the capacitor 2306, one terminal of the fourth switch 2308, and one terminal of the fifth switch 2309. One of a source and a drain of the transistor 2305 is connected to one terminal of the first switch 2303 and one terminal of the second switch 2304, while the other is connected to one terminal of the third switch 2307 and the other terminal of the fourth switch 2308. The other terminal of the first switch 2303 is connected to a source signal line 2301, and the other terminal of the second switch 2304 is connected to a power supply line 2302. The other electrode of the capacitor 2306 is connected to the power supply line 2302. The other terminal of the third switch 2307 is connected to the other electrode of the light emitting element 2310.

In order to implement the invention in FIG. 23, at least a part of the current path between the power supply line 2302 and the other electrode of the light emitting element 2310 (electrode connected to the other terminal of the third switch 2307) may be interrupted.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 24:
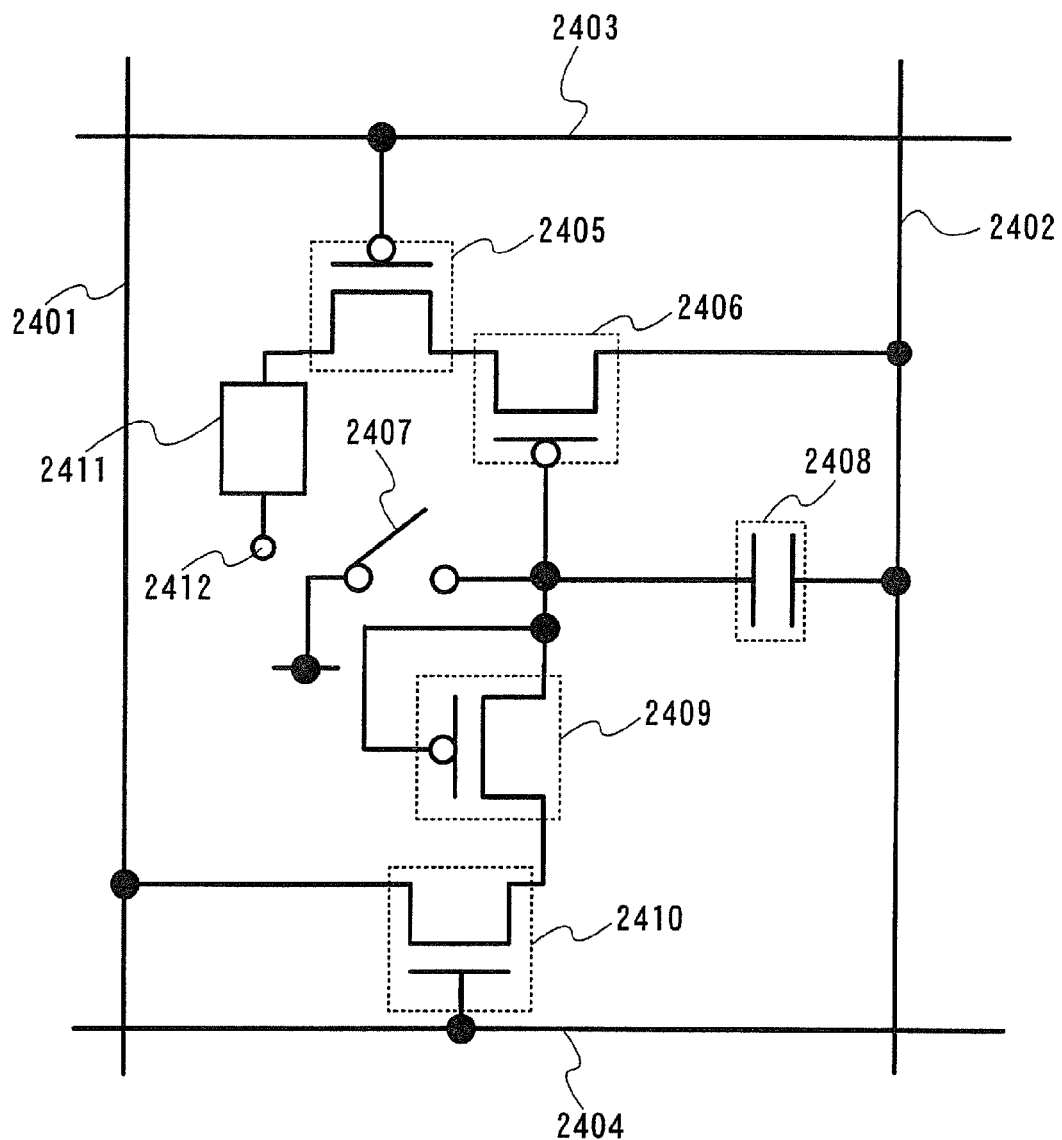
FIG. 24 is a diagram showing Embodiment 1 of the invention.

FIG. 24 shows another example of an equivalent circuit diagram corresponding to one pixel in a pixel portion of a display device. Each pixel has a first transistor 2405, a second transistor 2406, a switch 2407, a capacitor 2408, a third transistor 2409, a fourth transistor 2410, a light emitting element 2411, and one electrode 2412 of the light emitting element 2411. The one electrode 2412 of the light emitting element 2411 may be an anode or a cathode.

A gate electrode of the first transistor 2405 is connected to a first gate signal line 2403, and one of a source and a drain thereof is connected to the other electrode of the light emitting element 2411 while the other is connected to one of a source and a drain of the second transistor 2406. A gate electrode of the second transistor 2406 is connected to one terminal of the switch 2407, one electrode of the capacitor 2408, and one of a source and a drain of the third transistor 2409. The other of the source and the drain of the second transistor 2406 is connected to a power supply line 2402. The other electrode of the capacitor 2408 is connected to the power supply line 2402. The other of the source and the drain of the third transistor 2409 is connected to one of a source and a drain of the fourth transistor 2410. A gate electrode of the fourth transistor 2410 is connected to a second gate signal line 2404, and the other of the source and the drain thereof is connected to a source signal line 2401.

In order to implement the invention in FIG. 24, at least a part of the current path between the power supply line 2402 and the other electrode of the light emitting element 2411 may be interrupted. The current path between the other electrode of the light emitting element 2411 and the power supply line 2402 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 25:
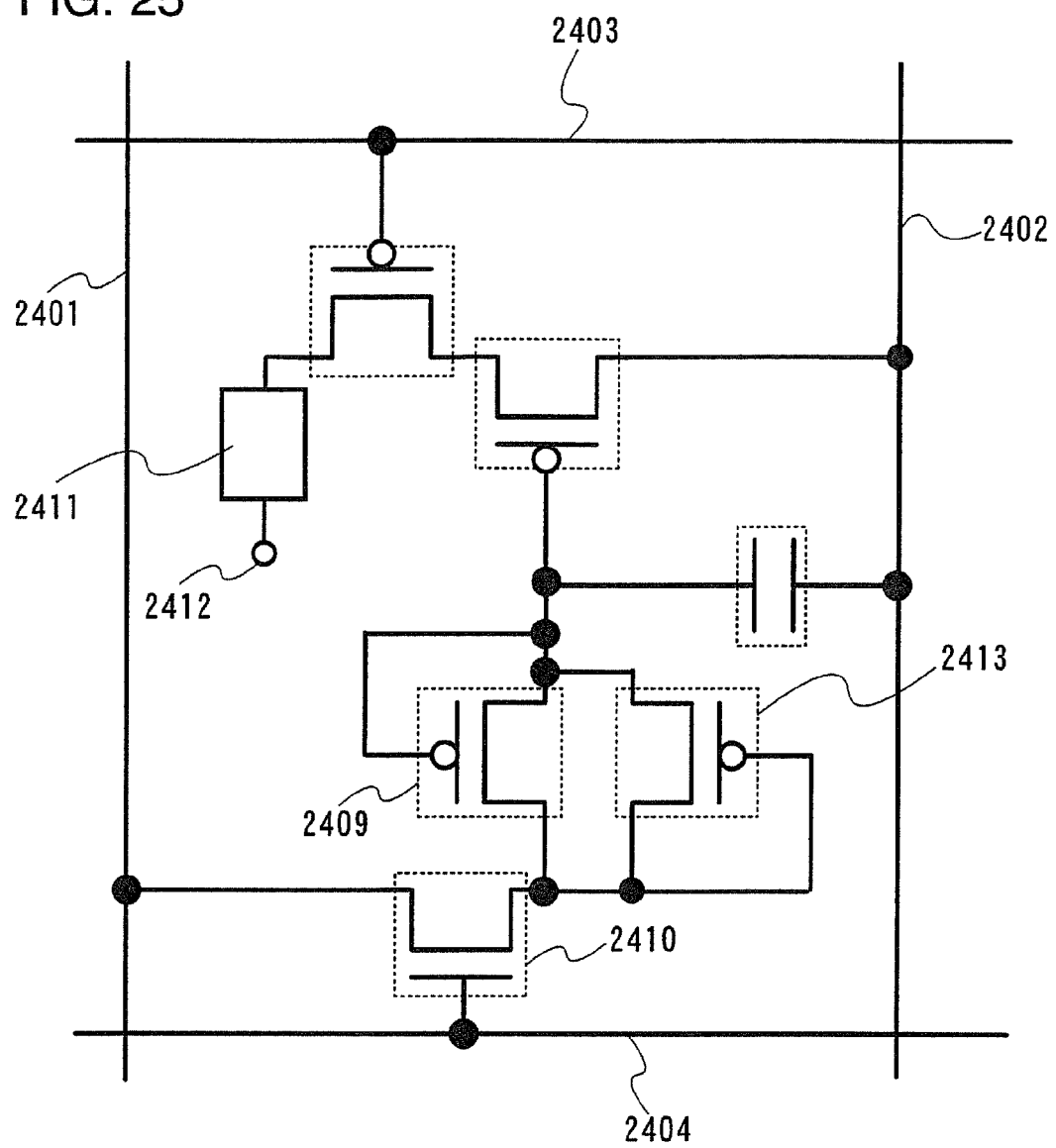
FIG. 25 is a diagram showing Embodiment 1 of the invention.

FIG. 25 shows another example of an equivalent circuit diagram corresponding to one pixel in a pixel portion of a display device. FIG. 25 has almost the same structure as FIG. 24, except in that a fifth transistor 2413 is provided instead of the switch 2407 that is provided in FIG. 24.

A gate electrode of the fifth transistor 2413 is connected to one of a source and a drain thereof and one of the source and the drain of the fourth transistor 2410. The other of the source and the drain of the fifth transistor 2413 is connected to one of the source and the drain of the third transistor 2409.

In order to implement the invention in FIG. 25, at least a part of the current path between the power supply line 2402 and the other electrode of the light emitting element 2411 may be interrupted. The current path between the other electrode of the light emitting element 2411 and the power supply line 2402 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 26:
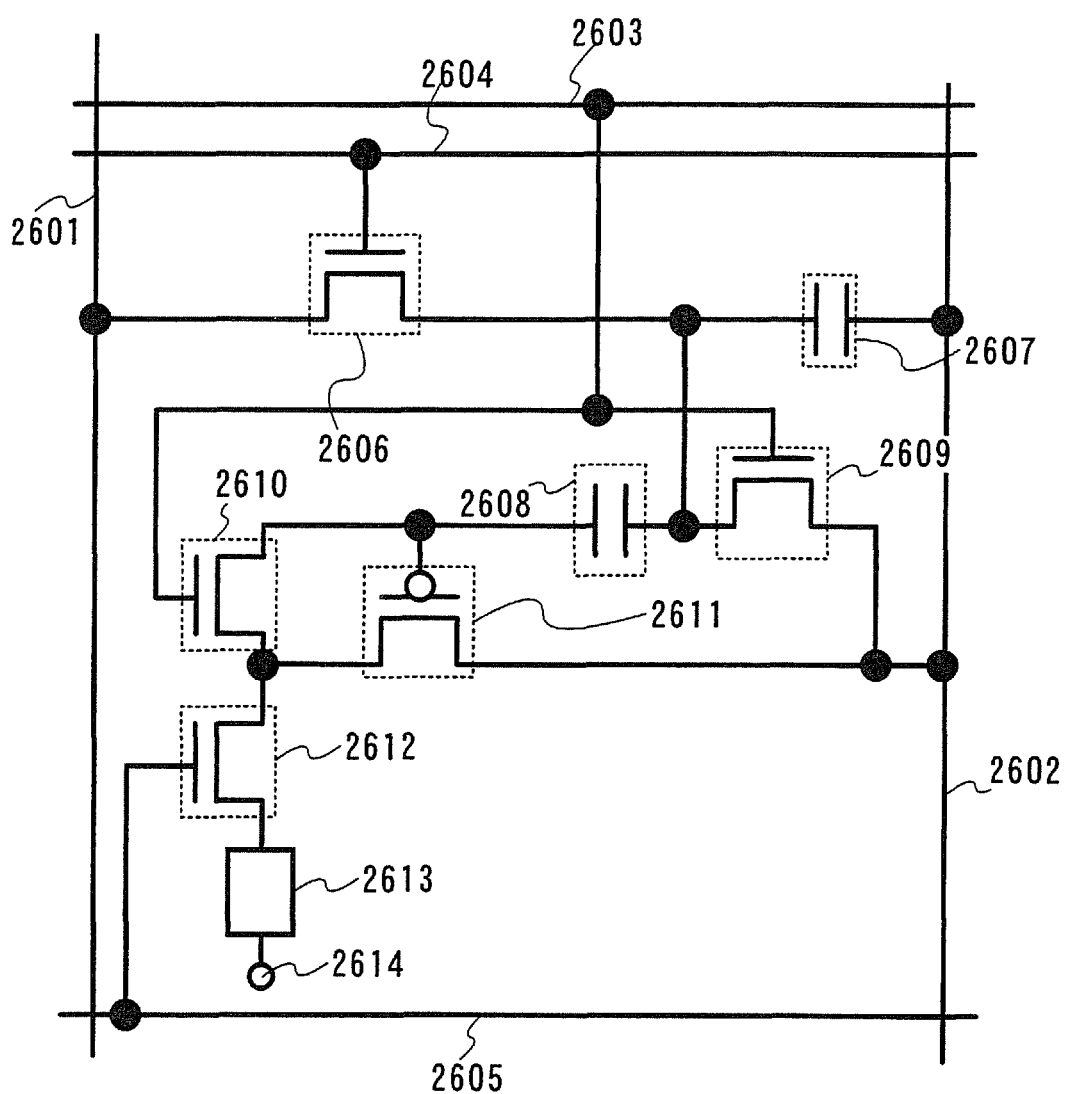
FIG. 26 is a diagram showing Embodiment 1 of the invention.

FIG. 26 shows another example of an equivalent circuit diagram corresponding to one pixel in a pixel portion of a display device. Each pixel has a first transistor 2606, a first capacitor 2607, a second capacitor 2608, a second transistor 2606, a third transistor 2610, a fourth transistor 2611, a fifth transistor 2612, a light emitting element 2613, and one electrode 2614 of the light emitting element 2613. The one electrode 2614 of the light emitting element 2613 may be an anode or a cathode.

A gate electrode of the first transistor 2606 is connected to a second gate signal line 2604, and one of a source and a drain thereof is connected to a source signal line 2601 while the other is connected to one electrode of the first capacitor 2607, one electrode of the second capacitor 2608, and one of a source and a drain of the second transistor 2609. The other electrode of the first capacitor 2607 is connected to a power supply line 2602. The other electrode of the second capacitor 2608 is connected to one of a source and a drain of the third transistor 2610 and a gate electrode of the fourth transistor 2611. A gate electrode of the second transistor 2609 is connected to a first gate signal line 2603 and a gate electrode of the third transistor 2610. The other of the source and the drain of the second transistor 2609 is connected to the power supply line 2602 and one of a source and a drain of the fourth transistor 2611. The other of the source and the drain of the third transistor 2610 is connected to the power supply line 2602, the other of the source and the drain of the fourth transistor 2611, and one of a source and a drain of the fifth transistor 2612. A gate electrode of the fifth transistor 2612 is connected to a third gate signal line 2605, and the other of the source and the drain thereof is connected to the other electrode of the light emitting element 2613.

In order to implement the invention in FIG. 26, at least a part of the current path between the power supply line 2602 and the other electrode of the light emitting element 2613 may be interrupted. The current path between the other electrode of the light emitting element 2613 and the power supply line 2602 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 27A:
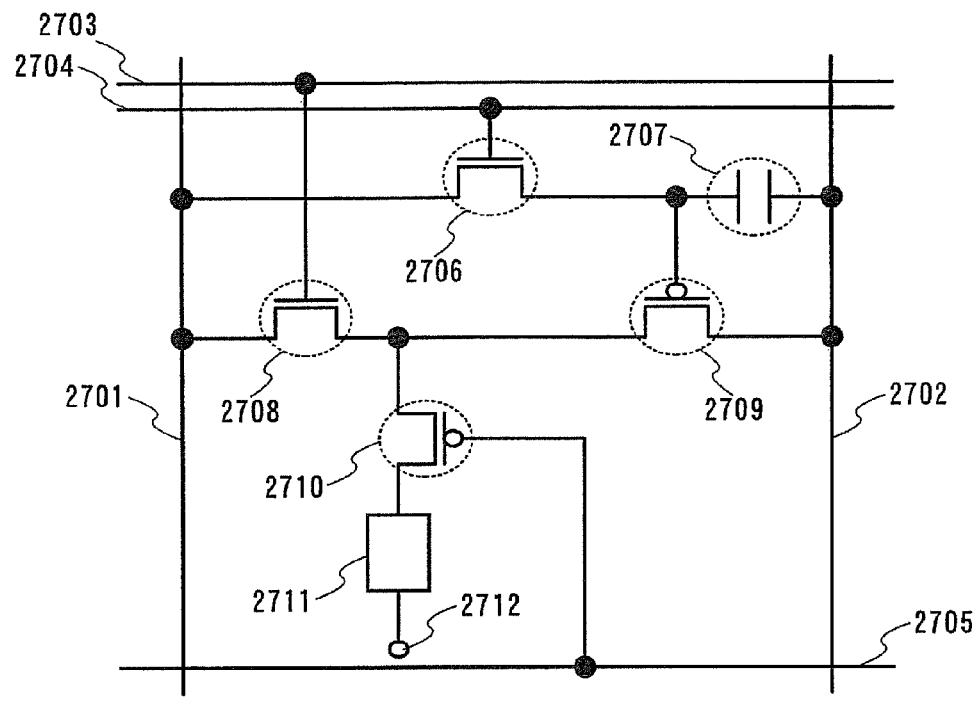
FIGS. 27A and 27B are diagrams each showing Embodiment 1 of the invention.

FIG. 27A shows another example of an equivalent circuit diagram corresponding to one pixel in a pixel portion of a display device. Each pixel has a first transistor 2706, a first capacitor 2707, a second transistor 2708, a third transistor 2709, a fourth transistor 2710, a light emitting element 2711, and one electrode 2712 of the light emitting element 2711. The one electrode 2712 of the light emitting element 2711 may be an anode or a cathode.

A gate electrode of the first transistor 2706 is connected to a second gate signal line 2704, and one of a source and a drain thereof is connected to a source signal line 2701 while the other is connected to one electrode of the first capacitor 2707 and a gate electrode of the third transistor 2709. The other electrode of the first capacitor 2707 is connected to a power supply line 2702. A gate electrode of the second transistor 2708 is connected to a first gate signal line 2703, and one of a source and a drain thereof is connected to the source signal line 2701 while the other is connected to one of a source and a drain of the third transistor 2709 and one of a source and a drain of the fourth transistor 2710. The other of the source and the drain of the third transistor 2709 is connected to the power supply line 2702. A gate electrode of the fourth transistor 2710 is connected to a third gate signal line 2705, and the other of the source and the drain thereof is connected to the other electrode of the light emitting element 2711.

Figure 27B:
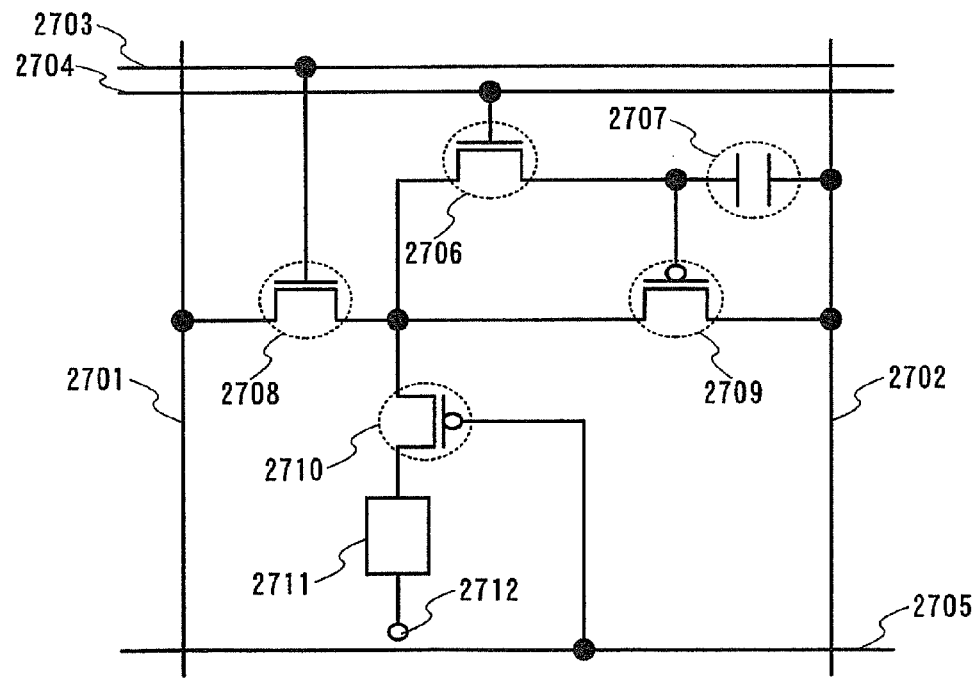

Description is made on FIG. 27B. In FIG. 27A, one of the source and the drain of the first transistor 2706 is connected to the source signal line 2701. FIG. 27B has almost the same structure as FIG. 27A, except in that one of the source and the drain of the first transistor 2706 is connected to the other of the source and the drain of the second transistor 2708, one of the source and the drain of the third transistor 2709, and one of the source and the drain of the fourth transistor 2710.

In order to implement the invention in FIGS. 27A and 27B, at least a part of the current path between the power supply line 2702 and the other electrode of the light emitting element 2711 may be interrupted. The current path between the other electrode of the light emitting element 2711 and the power supply line 2702 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 28:
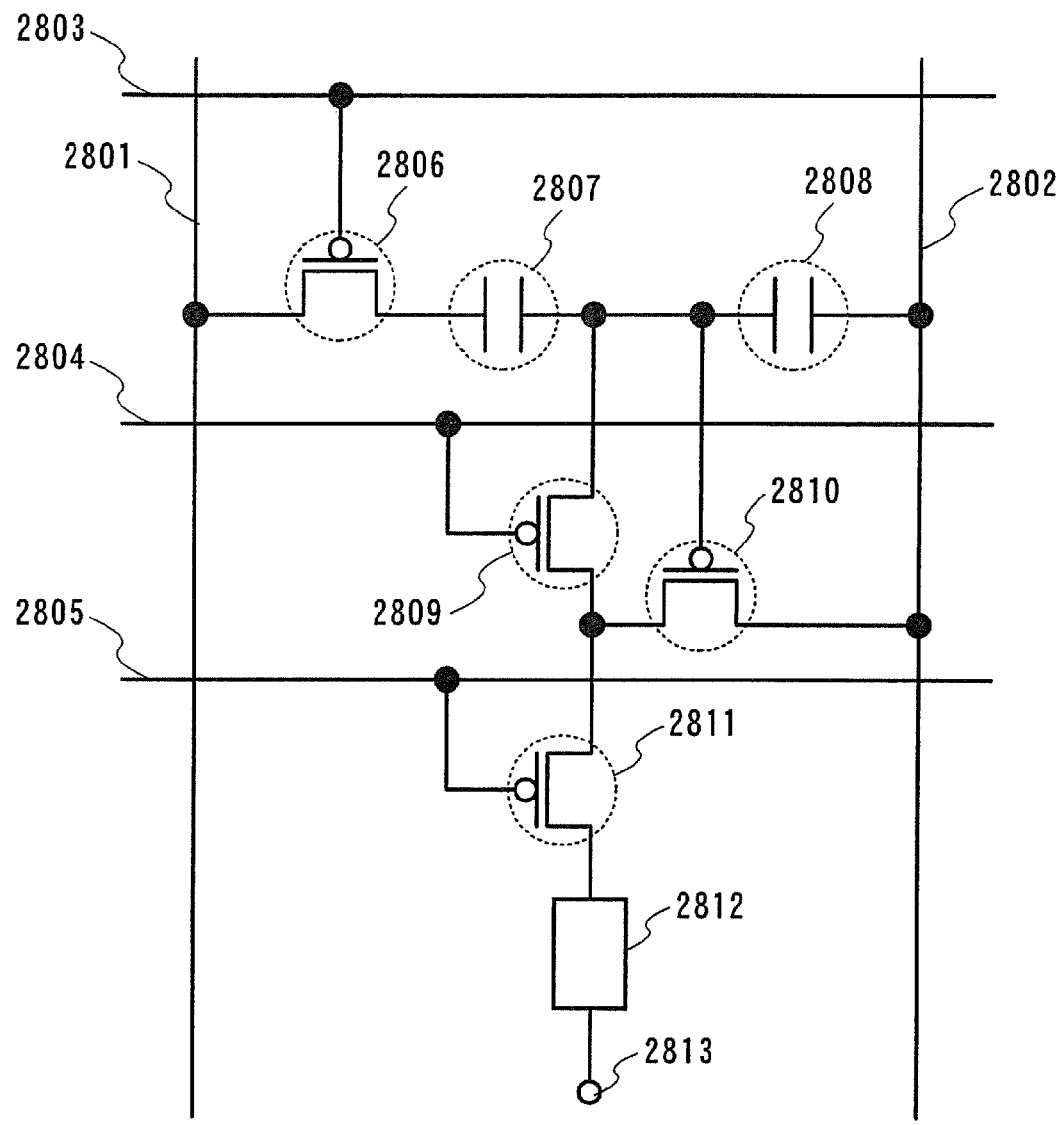
FIG. 28 is a diagram showing Embodiment 1 of the invention.

FIG. 28 shows another example of an equivalent circuit diagram corresponding to one pixel in a pixel portion of a display device. Each pixel has a first transistor 2806, a first capacitor 2807, a second capacitor 2808, a second transistor 2809, a third transistor 2810, a fourth transistor 2811, a light emitting element 2812, and one electrode 2813 of the light emitting element 2812. The one electrode 2813 of the light emitting element 2812 may be an anode or a cathode.

A gate electrode of the first transistor 2806 is connected to a first gate signal line 2803, and one of a source and a drain thereof is connected to a source signal line 2801 while the other is connected to one electrode of the first capacitor 2807. The other electrode of the first capacitor 2807 is connected to one electrode of the second capacitor 2808, one of a source and a drain of the second transistor 2809, and a gate electrode of the third transistor 2810. The other electrode of the second capacitor 2808 is connected to a power supply line 2802. A gate electrode of the second transistor 2809 is connected to a second gate signal line 2804, and the other of the source and the drain thereof is connected to one of a source and a drain of the third transistor 2810 and one of a source and a drain of the fourth transistor 2811. The other of the source and the drain of the third transistor 2810 is connected to the power supply line 2802. A gate electrode of the fourth transistor 2811 is connected to a third gate signal line 2805, and the other of the source and the drain is connected to the other electrode of the light emitting element 2812.

In order to implement the invention in FIG. 28, at least a part of the current path between the power supply line 2802 and the other electrode of the light emitting element 2812 may be interrupted. The current path between the other electrode of the light emitting element 2812 and the power supply line 2802 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 29:
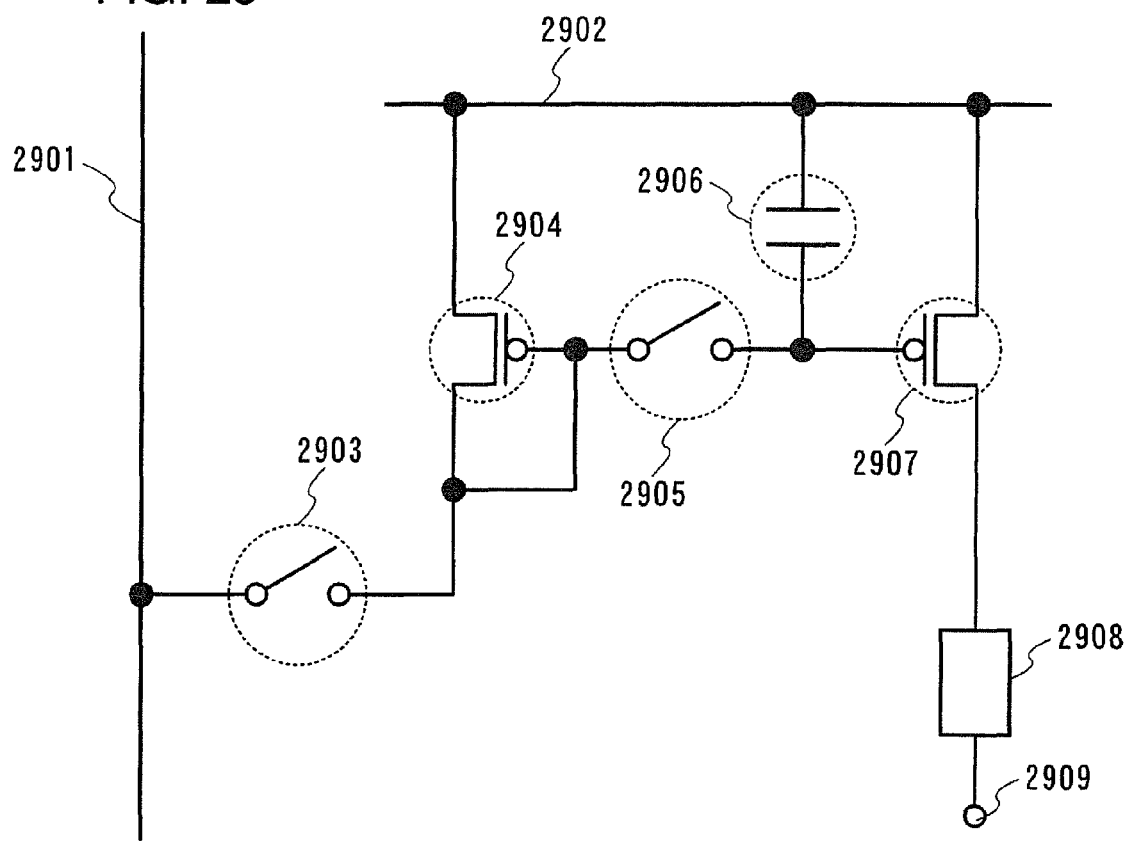
FIG. 29 is a diagram showing Embodiment 1 of the invention.

FIG. 29 shows another example of an equivalent circuit diagram corresponding to one pixel in a pixel portion of a display device. Each pixel has a first switch 2903, a first transistor 2904, a second switch 2905, a capacitor 2906, a second transistor 2907, a light emitting element 2908, and one electrode 2909 of the light emitting element 2908. The one electrode 2909 of the light emitting element 2908 may be an anode or a cathode.

One terminal of the first switch 2903 is connected to a source signal line 2901, while the other terminal thereof is connected to one of a source and a drain of the first transistor 2904, a gate electrode of the first transistor 2904, and one terminal of the second switch 2905. The other of the source and the drain of the first transistor 2904 is connected to a power supply line 2902. The other terminal of the second switch 2905 is connected to one electrode of the capacitor 2906 and a gate electrode of the second transistor 2907. The other electrode of the capacitor 2906 is connected to the power supply line 2902. One of a source and a drain of the second transistor 2907 is connected to the power supply line 2902, while the other is connected to the other electrode of the light emitting element 2908.

In order to implement the invention in FIG. 29, at least a part of the current path between the power supply line 2902 and the other electrode of the light emitting element 2908 may be interrupted. The current path between the other electrode of the light emitting element 2908 and the power supply line 2902 is similar to the aforementioned structure of FIG. 11, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 30:
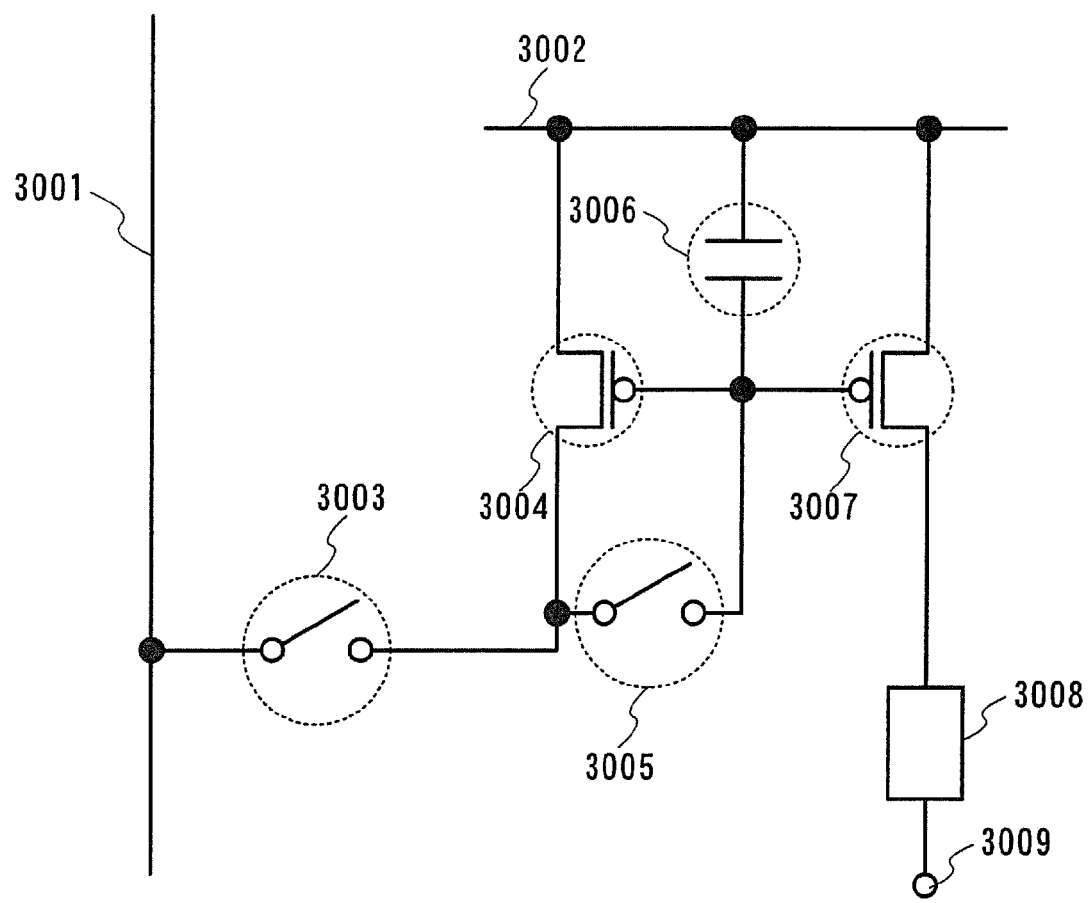
FIG. 30 is a diagram showing Embodiment 1 of the invention.

FIG. 30 shows another example of an equivalent circuit diagram corresponding to one pixel in a pixel portion of a display device. Each pixel has a first switch 3003, a first transistor 3004, a second switch 3005, a capacitor 3006, a second transistor 3007, a light emitting element 3008, and one electrode 3009 of the light emitting element 3008. The one electrode 3009 of the light emitting element 3008 may be an anode or a cathode.

One terminal of the first switch 3003 is connected to a source signal line 3001, while the other terminal is connected to one of a source and a drain of the first transistor 3004 and one terminal of the second switch 3005. A gate electrode of the first transistor 3004 is connected to the other terminal of the second switch 3005, one electrode of the capacitor 3006, and a gate electrode of the second transistor 3007. The other of the source and the drain of the first transistor 3004 is connected to a power supply line 3002. The other electrode of the capacitor 3006 is connected to the power supply line 3002. One of a source and a drain of the second transistor 3007 is connected to the power supply line 3002, while the other is connected to the other electrode of the light emitting element 3008.

In order to implement the invention in FIG. 30, at least a part of the current path between the power supply line 3002 and the other electrode of the light emitting element 3008 may be interrupted. The current path between the other electrode of the light emitting element 3008 and the power supply line 3002 is similar to the aforementioned structure of FIG. 11, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 31:
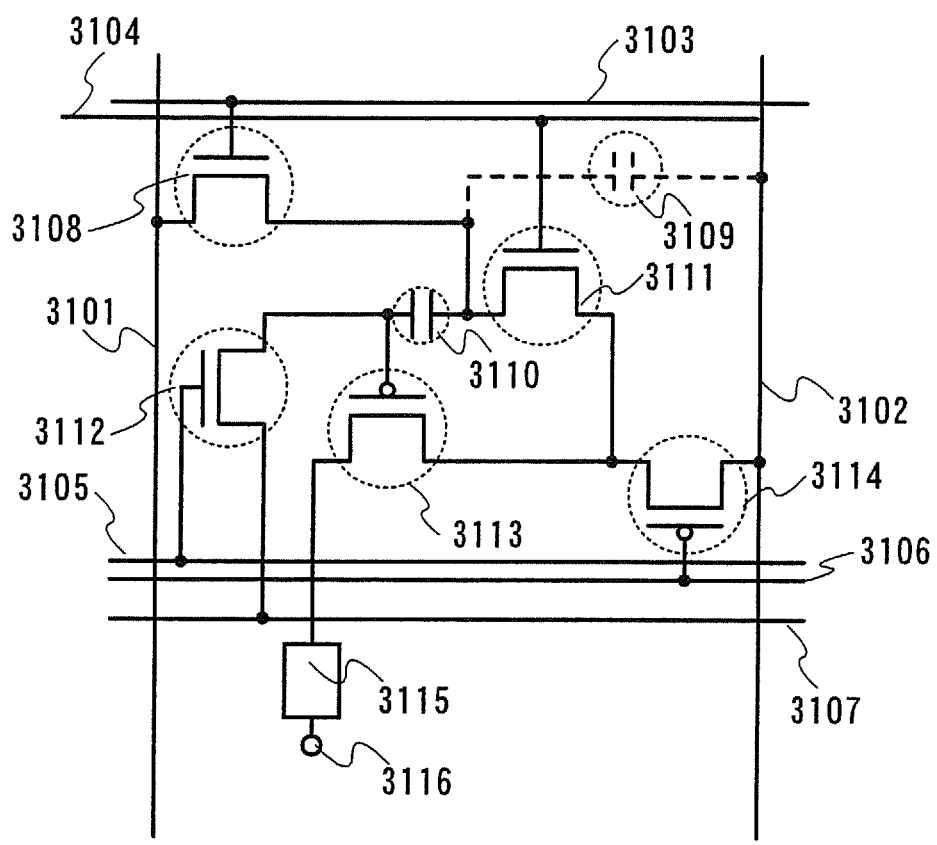
FIG. 31 is a diagram showing Embodiment 1 of the invention.

FIG. 31 shows another example of an equivalent circuit diagram corresponding to one pixel in a pixel portion of a display device. Each pixel has a first transistor 3108, a first capacitor 3109, a second capacitor 3110, a second transistor 3111, a third transistor 3112, a fourth transistor 3113, a fifth transistor 3114, a light emitting element 3115, and one electrode 3116 of the light emitting element 3115. The one electrode 3116 of the light emitting element 3115 may be an anode or a cathode.

A gate electrode of the first transistor 3108 is connected to a first gate signal line 3103, and one of a source and a drain thereof is connected to a source signal line 3101 while the other is connected to one electrode of the first capacitor 3109, one electrode of the second capacitor 3110, and one of a source and a drain of the second transistor 3111. The other electrode of the first capacitor 3109 is connected to a power supply line 3102. The other electrode of the second capacitor 3110 is connected to one of a source and a drain of the third transistor 3112 and a gate electrode of the fourth transistor 3113. A gate electrode of the second transistor 3111 is connected to a second gate signal line 3104, and the other of the source and the drain thereof is connected to one of a source and a drain of the fourth transistor 3113 and one of a source and a drain of the fifth transistor 3114. A gate electrode of the third transistor 3112 is connected to a third gate signal line 3105, and the other of the source and the drain thereof is connected to a wire 3107 for initialization. The other of the source and the drain of the fourth transistor 3113 is connected to the other electrode of the light emitting element 3115. A gate electrode of the fifth transistor 3114 is connected to a fourth gate signal line 3106, and the other of the source and the drain thereof is connected to the power supply line 3102.

In order to implement the invention in FIG. 31, at least a part of the current path between the power supply line 3102 and the other electrode of the light emitting element 3115 may be interrupted. The current path between the other electrode of the light emitting element 3115 and the power supply line 3102 is similar to the aforementioned structure of FIG. 12, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 32:
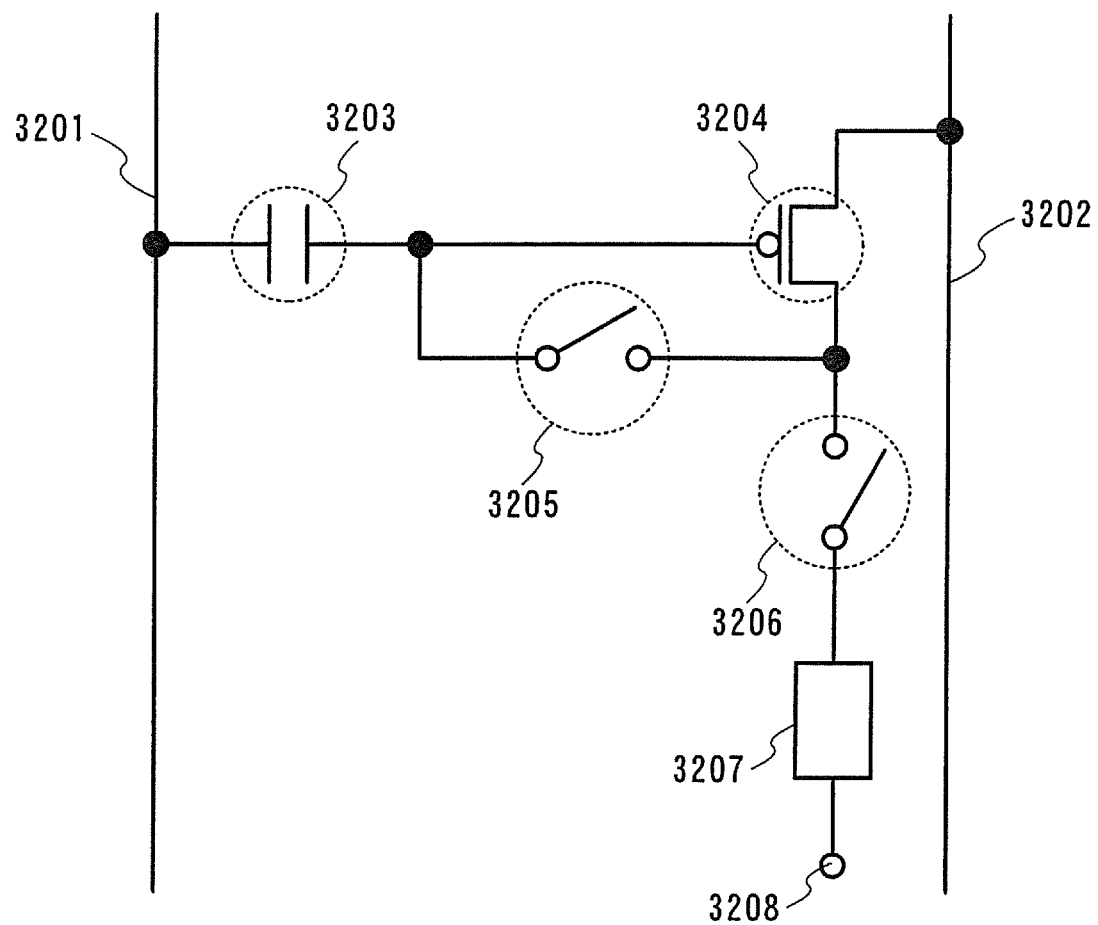
FIG. 32 is a diagram showing Embodiment 1 of the invention.

FIG. 32 shows another example of an equivalent circuit diagram corresponding to one pixel in a pixel portion of a display device. Each pixel has a first capacitor 3203, a transistor 3204, a first switch 3205, a second switch 3206, a light emitting element 3207, and one electrode 3208 of the light emitting element 3207. The one electrode 3208 of the light emitting element 3207 may be an anode or a cathode.

One electrode of the first capacitor 3203 is connected to a source signal line 3201, while the other electrode is connected to a gate electrode of the transistor 3204 and one terminal of the first switch 3205. One of a source and a drain of the transistor 3204 is connected to a power supply line 3202, while the other is connected to the other terminal of the first switch 3205 and one terminal of the second switch 3206. The other terminal of the second switch 3206 is connected to the other electrode of the light emitting element 3207.

In order to implement the invention in FIG. 32, at least a part of the current path between the power supply line 3202 and the other electrode of the light emitting element 3207 may be interrupted.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 33:
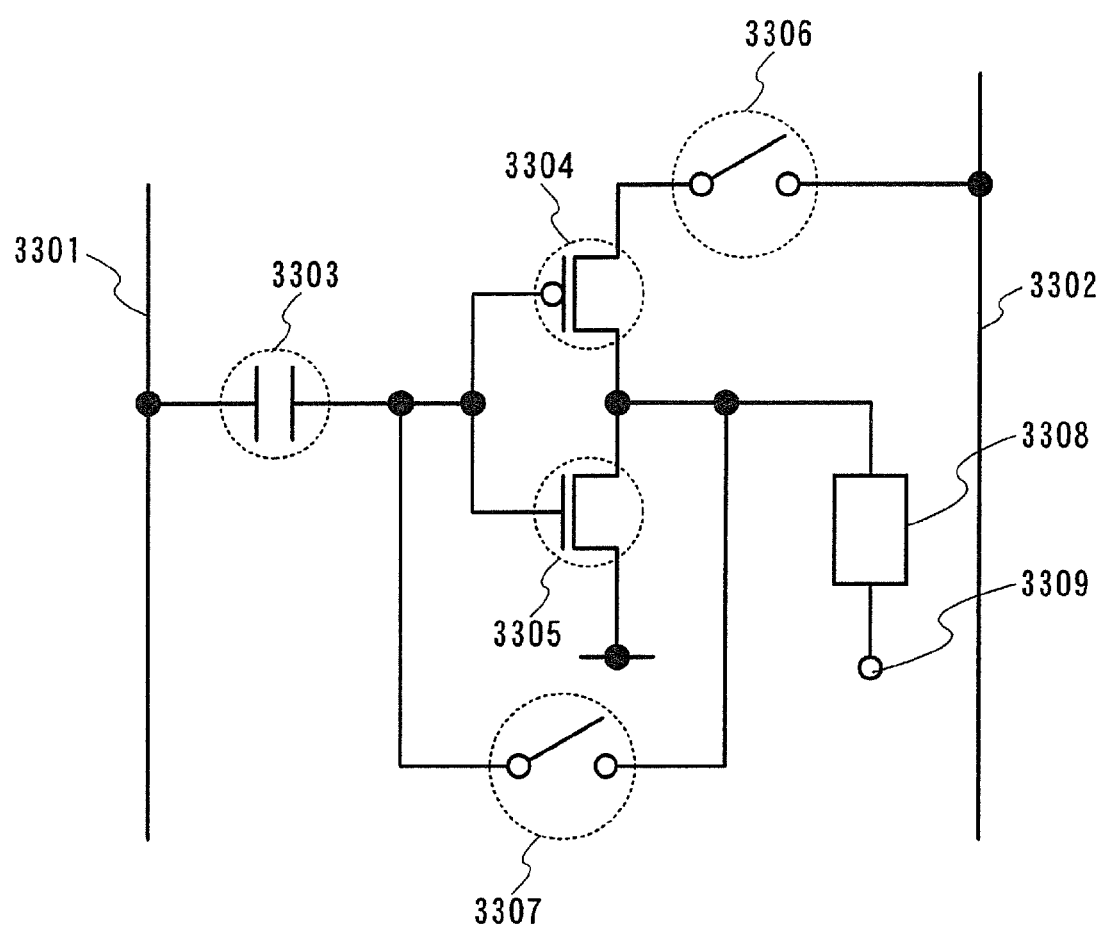
FIG. 33 is a diagram showing Embodiment 1 of the invention.

FIG. 33 shows another example of an equivalent circuit diagram corresponding to one pixel in a pixel portion of a display device. Each pixel has a first capacitor 3303, a first transistor 3304, a second transistor 3305, a first switch 3306, a second switch 3307, a light emitting element 3308, and one electrode 3309 of the light emitting element 3308. The one electrode 3309 of the light emitting element 3308 may be an anode or a cathode.

One electrode of the first capacitor 3303 is connected to a source signal line 3301, while the other electrode is connected to a gate electrode of the first transistor 3304, a gate electrode of the second transistor 3305, and one terminal of the second switch 3307. One of a source and a drain of the first transistor 3304 is connected to one terminal of the first switch 3306, while the other is connected to one of a source and a drain of the second transistor 3305, the other terminal of the second switch 3307, and the other electrode of the light emitting element 3308. The other of the source and the drain of the second transistor 3305 is connected to a low potential power supply. Thus, the first transistor 3304 and the second transistor 3305 constitute a CMOS inverter circuit. The other terminal of the first switch 3306 is connected to a power supply line 3302.

In order to implement the invention in FIG. 33, at least a part of the current path between the power supply line 3302 and the other electrode of the light emitting element 3308 may be interrupted.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

Figure 34:
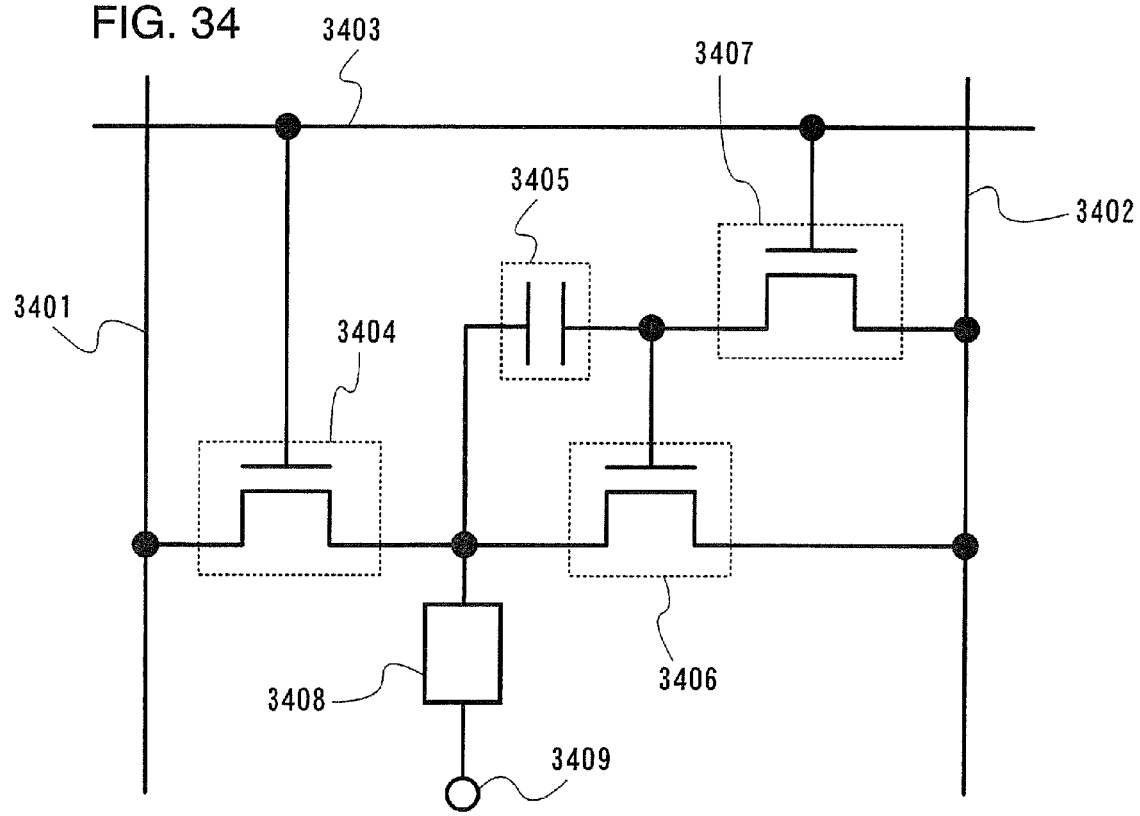
FIG. 34 is a diagram showing Embodiment 1 of the invention.

FIG. 34 shows another example of an equivalent circuit diagram corresponding to one pixel in a pixel portion of a display device. Each pixel has a first transistor 3404, a capacitor 3405, a second transistor 3406, a third transistor 3407, a light emitting element 3408, and one electrode 3409 of the light emitting element 3408. The one electrode 3409 of the light emitting element 3408 may be an anode or a cathode.

A gate electrode of the first transistor 3404 is connected to a gate signal line 3403, and one of a source and a drain thereof is connected to a source signal line 3401 while the other is connected to one electrode of the capacitor 3405, one of a source and a drain of the second transistor 3406, and the other electrode of the light emitting element 3408. The other electrode of the capacitor 3405 is connected to a gate electrode of the second transistor 3406 and one of a source and a drain of the third transistor 3407. The other of the source and the drain of the second transistor 3406 is connected to a power supply line 3402. A gate electrode of the third transistor 3407 is connected to a gate signal line 3403, and the other of the source and the drain thereof is connected to the power supply line 3402.

In order to implement the invention in FIG. 34, at least a part of the current path between the power supply line 3402 and the other electrode of the light emitting element 3408 may be interrupted. The current path between the other electrode of the light emitting element 3408 and the power supply line 3402 is similar to the aforementioned structure of FIG. 11, and thus description thereof is omitted here.

The invention adopts a structure where the width of a wire corresponding to a portion to be cut off is reduced to correct a defective pixel easily. As specific examples of the structure where the width of a wire corresponding to a portion to be cut off is reduced, the structures described in Embodiment Modes 6 to 9 may be employed, and thus description thereof is omitted here.

The drawings shown in this embodiment are just examples. That is to say, the invention is not limited to the conductivity of transistors and the structures shown in the drawings, and either an N-channel transistor or a P-channel transistor may be adopted.

Embodiment 2

The display device of the invention can be applied to a display area of various electronic apparatuses. In particular, the display device of the invention is desirably used for mobile devices that are required to be reduced in thickness and weight.

The display device shown in the aforementioned embodiment modes and embodiment may be incorporated in a housing of electronic apparatuses such as a television set (also simply referred to as a TV, a television, or a television receiver), a camera (such as a video camera and a digital camera), a goggle type display, a navigation system, an audio reproducing device (such as a car audio system and an audio component system), a computer, a game machine, a portable information terminal (such as a mobile computer, a mobile phone set, a portable game machine and an electronic book), an image reproducing device provided with a recording medium (specifically, a device that reproduces a recording medium such as a DVD (Digital Versatile Disc), a HD DVD (High Definition DVD), and a Blu-ray disc, and that has a display for displaying the reproduced image), and other electronic devices each having a display area. Specific examples of the electronic apparatuses are shown in FIGS. 8A to 8F and FIG. 10.

Figure 8A:
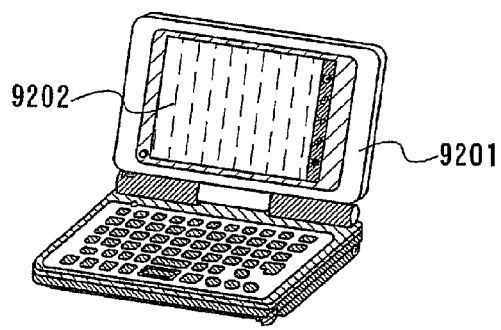
FIGS. 8A to 8F are diagrams each showing Embodiment 2 of the invention.

A portable information terminal shown in FIG. 8A includes a main body 9201, a display area 9202 and the like. The display devices shown in Embodiment Modes 1 to 9 may be applied to the display area 9202. The display device that is one mode of the invention allows a portable information terminal with high display quality, where no bright spots are included (even though point defects are included) and degradation in image quality of the entire screen is reduced, to be provided with high yield and at low cost.

Figure 8B:
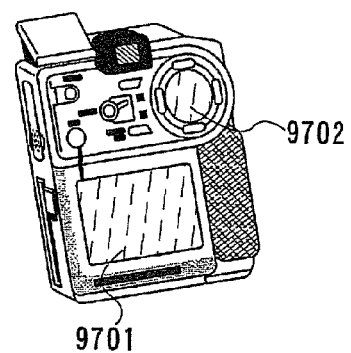

A digital video camera shown in FIG. 8B includes a display area 9701, a display area 9702 and the like. The display device shown in Embodiment Modes 1 to 9 may be applied to the display area 9701. The display device that is one mode of the invention allows a digital video camera with high display quality, where no bright spots are included (even though point defects are included) and degradation in image quality of the entire screen is reduced, to be provided with high yield and at low cost.

Figure 8C:
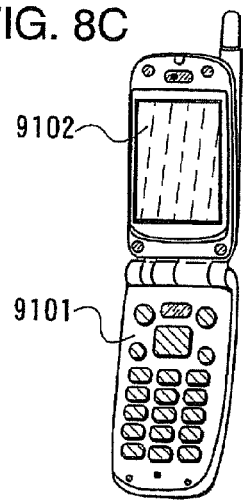

A portable terminal shown in FIG. 8C includes a main body 9101, a display area 9102 and the like. The display devices shown in Embodiment Modes 1 to 9 may be applied to the display area 9102. The display device that is one mode of the invention allows a portable terminal with high display quality, where no bright spots are included (even though point defects are included) and degradation in image quality of the entire screen is reduced, to be provided with high yield and at low cost.

Figure 8D:
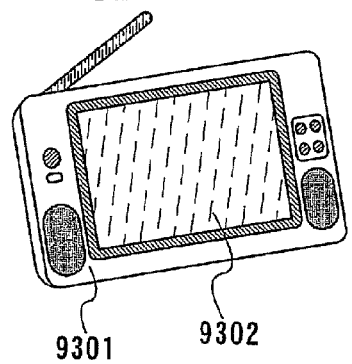

A portable television set shown in FIG. 8D includes a main body 9301, a display area 9302 and the like. The display devices shown in Embodiment Modes 1 to 9 may be applied to the display area 9302. The display device that is one mode of the invention allows a portable television set with high display quality, where no bright spots are included (even though point defects are included) and degradation in image quality of the entire screen is reduced, to be provided with high yield and at low cost. The display device of the invention can be widely applied to a small size television set incorporated in a portable terminal such as a mobile phone, a medium size one that is portable, and a large size one (e.g., 40 inches in size or more).

Figure 8E:
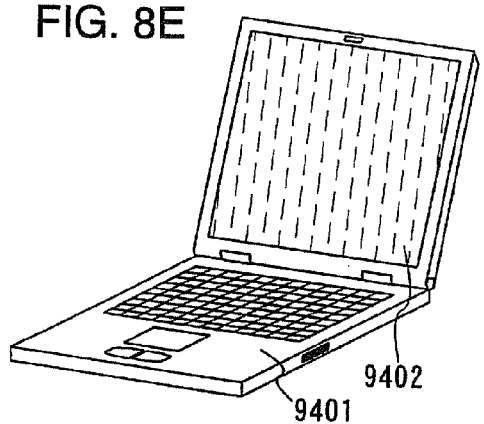

A portable computer shown in FIG. 8E includes a main body 9401, a display area 9402 and the like. The display devices shown in Embodiment Modes 1 to 9 may be applied to the display area 9402. The display device that is one mode of the invention allows a portable computer with high display quality, where no bright spots are included (even though point defects are included) and degradation in image quality of the entire screen is reduced, to be provided with high yield and at low cost.

Figure 8F:
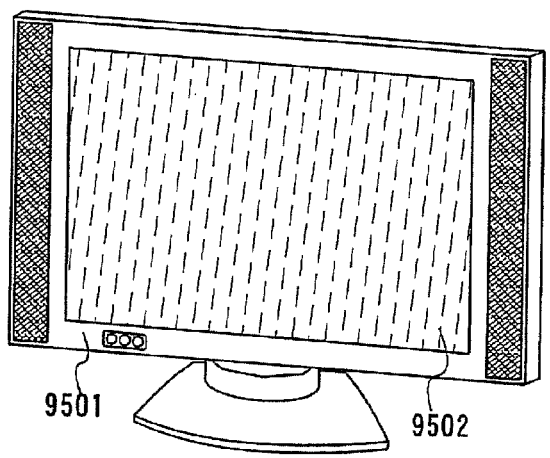

A television set shown in FIG. 8F includes a main body 9501, a display area 9502 and the like. The display devices shown in Embodiment Modes 1 to 9 may be applied to the display area 9502. The display device that is one mode of the invention allows a television set with high display quality, where no bright spots are included (even though point defects are included) and degradation in image quality of the entire screen is reduced, to be provided with high yield and at low cost.

Figure 10:
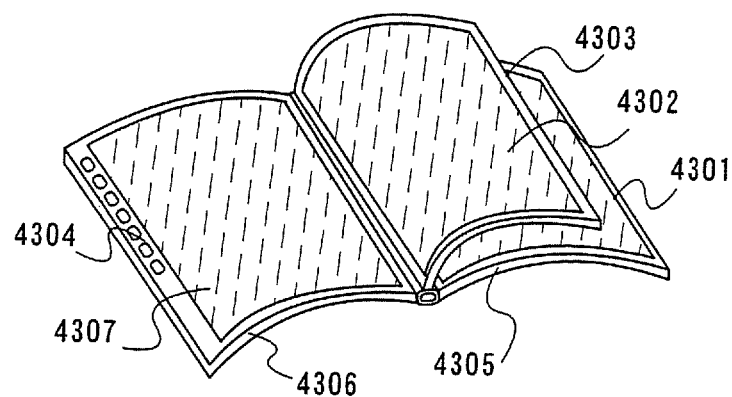
FIG. 10 is a diagram showing Embodiment 2 of the invention.

FIG. 10 shows an example of an electronic book that incorporates a double-sided display panel 4303. A first housing 4305 has a first display area 4301, and a second housing 4306 has an operating button 4304 and a second display area 4307. The double-sided display panel 4303 has a first display surface, and a second display surface 4302 that is the opposite surface of the first display surface. The double-sided display panel 4303 is interposed between the first housing 4305 and the second housing 4306. The display devices shown in Embodiment Modes 1 to 9 may be applied to each display area.

As an example of usage of the electronic book where the double-sided display panel 4303 is interposed, it is convenient to read text on the first display area 4301 and the second display surface 4302, and to see a drawing on the second display area 4307 and the first display surface. Since the double-sided display panel 4303 cannot display the first display surface and the second display surface 4302 at the same time, display of the first display surface is switched to the display of the second display surface when moving the first display surface and the second display surface 4302.

Further, after the first display area 4301 and the first display surface are read, the second display surface and the second display area 4307 display the next page when the next page, namely the double-sided display panel is turned at a certain angle. In addition, after the second display surface 4302 and the second display area 4307 are read, the first display surface and the first display area 4301 display the next page when the double-sided display panel is turned at a certain angle. Thus, the switching of display surfaces is made invisible, and visual incongruity can be reduced. In order to further reduce the incongruity, a dual emission panel is desirably provided over a flexible substrate. The display device that is one mode of the invention allows an electronic book with high display quality, where no bright spots are included (even though point defects are included) and degradation in image quality of the entire screen is reduced, to be provided with high yield and at low cost.

If the aforementioned electronic apparatuses use a rechargeable battery, the life of them increases with reduction in the power consumption of the display device, thereby the time for charging the rechargeable battery can be reduced.

In addition to the aforementioned electronic apparatuses, the invention may be applied to a front type or a rear type projector.

As set forth above, the application range of the invention is so wide that the invention can be applied to electronic apparatuses of all fields.

This application is based on Japanese Patent Application serial No. 2005-024631 filed in Japan Patent Office on Jan. 31, 2005, the entire contents of which are hereby incorporated by reference.

What is claimed is:

1. A display device comprising:
   a first line and a second line;
   a first transistor, a second transistor, a third transistor, a fourth transistor, a fifth transistor and a sixth transistor;
   a light-emitting element,
   wherein one of source region and drain region of the first transistor is electrically connected to the first line,
   wherein the other of source region and drain region of the first transistor is electrically connected to one of source region and drain region of the second transistor, and to one of source region and drain region of the sixth transistor,
   wherein the other of source region and drain region of the second transistor is electrically connected to the second line, and includes a first narrower portion than a region of the other of source region and drain region of the second transistor overlapped with the second line,
   wherein the other of source region and drain region of the sixth transistor is electrically connected to one of source region and drain region of the third transistor, and to one of source region and drain region of the fourth transistor,
   wherein a gate of the sixth transistor is electrically connected to the other of source region and drain region of the fourth transistor, and to one of source region and drain region of the fifth transistor,
   wherein the other of source region and drain region of the third transistor is electrically connected to the light-emitting element, and
   wherein the second line includes a second narrower portion than a portion overlapped with the other of source region and drain region of the second transistor.

2. The display device according to claim 1, wherein the first line is a source signal line and the second line is a power supply line.

3. The display device according to claim 1, wherein a capacitor is formed between the second line and the gate of the sixth transistor.

4. The display device according to claim 1, wherein the first or second narrower portion has a width of 3 μm or less.

5. The display device according to claim 1, wherein the display device is incorporated in one selected from the group consisting of a television set, a video camera, a digital camera, a navigation system, an audio reproducing device, a computer, a game machine, a portable information terminal, a mobile phone, an electronic book, and an image reproducing device.

6. A display device comprising:
   a first line and a second line;
   a first transistor, a second transistor, a third transistor, a fourth transistor, a fifth transistor and a sixth transistor;
   a light-emitting element,
   wherein one of source region and drain region of the first transistor is electrically connected to the first line,
   wherein the other of source region and drain region of the first transistor is electrically connected to one of source region and drain region of the second transistor, and to one of source region and drain region of the sixth transistor,
   wherein the other of source region and drain region of the second transistor is electrically connected to the second line, and includes a first narrower portion than a region of the other of source region and drain region of the second transistor overlapped with the second line,
   wherein the other of source region and drain region of the sixth transistor is electrically connected to one of source region and drain region of the third transistor, and to one of source region and drain region of the fourth transistor,
   wherein a gate of the sixth transistor is electrically connected to the other of source region and drain region of the fourth transistor, and to one of source region and drain region of the fifth transistor,
   wherein the other of source region and drain region of the third transistor is electrically connected to the light-emitting element,
   wherein the sixth transistor is a p-channel transistor, and
   wherein the second line includes a second narrower portion than a portion overlapped with the other of source region and drain region of the second transistor.

7. The display device according to claim 6, wherein the first line is a source signal line and the second line is a power supply line.

8. The display device according to claim 6, wherein a capacitor is formed between the second line and the gate of the sixth transistor.

9. The display device according to claim 6, wherein the first or second narrower portion has a width of 3 μm or less.

10. The display device according to claim 6, wherein the display device is incorporated in one selected from the group consisting of a television set, a video camera, a digital camera, a navigation system, an audio reproducing device, a computer, a game machine, a portable information terminal, a mobile phone, an electronic book, and an image reproducing device.

* * * * *